United States Patent
Yuri et al.

(10) Patent No.: US 6,168,659 B1
(45) Date of Patent: Jan. 2, 2001

(54) METHOD OF FORMING GALLIUM NITRIDE CRYSTAL

(75) Inventors: Masaaki Yuri, Ibaraki (JP); Tetsuzo Ueda, Menlo Park; Takaaki Baba, Los Altos, both of CA (US)

(73) Assignee: Matsushita Electronics Corporation, Osaka (JP)

( * ) Notice: Under 35 U.S.C. 154(b), the term of this patent shall be extended for 0 days.

(21) Appl. No.: 09/057,476

(22) Filed: Apr. 9, 1998

(30) Foreign Application Priority Data

Apr. 9, 1997 (JP) .................................................. 9-090674

(51) Int. Cl.⁷ .................................................. C30B 25/18
(52) U.S. Cl. ................ 117/89; 117/90; 117/96; 117/97; 117/952
(58) Field of Search .................. 117/96, 97, 89, 117/90, 92

(56) References Cited

U.S. PATENT DOCUMENTS

| 5,389,571 | * | 2/1995 | Takeuchi et al. | 117/952 |
| 5,679,152 | * | 10/1997 | Tischler et al. | 117/97 |
| 5,786,606 | * | 7/1998 | Nishio et al. | 257/103 |
| 5,880,491 | * | 3/1999 | Soref et al. | 257/190 |
| 5,886,376 | * | 3/1999 | Acovic et al. | 257/316 |
| 5,891,769 | * | 4/1999 | Liaw et al. | 438/167 |

* cited by examiner

*Primary Examiner*—Robert Kunemund
(74) *Attorney, Agent, or Firm*—McDermott, Will & Emery

(57) ABSTRACT

With an object of providing gallium nitride thick film crystals excelling in crystallization, the structure thereof is formed of an amorphous silicon dioxide thin film 2 formed on a silicon substrate 1 and then a single crystal silicon thin film 3 is formed on the foregoing amorphous silicon dioxide thin film 2 and further gallium nitride 4 is formed on this silicon thin film 3.

29 Claims, 33 Drawing Sheets

OXYGEN IONS

OXYGEN IONS

OXYGEN IONS

OXYGEN IONS

OXYGEN IONS

OXYGEN IONS

OXYGEN IONS

OXYGEN IONS

OXYGEN IONS

OXYGEN IONS

OXYGEN IONS

OXYGEN IONS

OXYGEN IONS

OXYGEN IONS

OXYGEN IONS

OXYGEN IONS

METHOD OF FORMING GALLIUM NITRIDE CRYSTAL

BACKGROUND OF THE INVENTION

The present invention relates to a method for producing gallium nitride crystals that can be used in short wavelength semiconductor lasers, high temperature and high speed transistors and the like, for example.

Semiconductor lasers are widely used in reading and writing information from and into optical discs, respectively. Since the amount of information that can be stored in an optical disc per unit area is inversely Proportional to the square of wavelength of a semiconductor laser used, it is imperative to make the wavelength of laser as short as possible in order to realize a high density recording. Gallium nitride has a large forbidden band gap of 3.4 eV and also belongs to a direct transition semiconductor, thereby enabling the fabrication of a mixed crystal of aluminum nitride and indium nitride. Therefore, gallium nitride makes it possible to produce readily a semiconductor junction double heterostructure involving different forbidden band gaps, which is needed to realize semiconductor lasers and is expected to be useful as a material for short wavelength lasers having the wavelength of around 400 nm.

In addition, the gallium nitride has the features of a large forbidden band gap, an insulation break down electric field of as large as $5 \times 10^6$ V/cm and a saturation drift velocity of as high as $1.5 \times 10^7$ cm/s, showing great promise for a high temperature and high speed transistor material.

For the crystal growth of gallium nitride base materials, a heteroepitaxial growth method using sapphire as a substrate has been generally employed since an excellent gallium nitride substrate is not available. In addition to the organometallic vapor deposition and molecular beam epitaxy that are used in general, thick film growth according to a fast film forming method of halide VPE with a growth speed of 100 microns/hr or higher, wherein ammonia is used as a raw material of nitrogen and hydrogen chloride supplied via a heated gallium surface is used as a raw material of gallium, has been receiving an attention for a further improvement in crystallization and R&D in this area have been carried out actively.

The method for producing gallium nitride crystals according to the prior art halide VPE method with sapphire used as the substrate has been utilized to form gallium nitride crystals to a thickness of 100 micron or larger.

Next, an explanation will be made on the prior art method for producing gallium nitride crystals. The prior art method for producing gallium nitride crystals is shown in FIGS. 33(a)–33(b), wherein the reference numeral 11 shows a sapphire substrate and the reference numeral 12 shows gallium nitride crystals.

The sapphire substrate 11 with a film thickness of 600 microns is heated to 1000° C., for example, and gallium nitride is formed thereon to 100 micron thick by having an ammonia gas, for example, and gallium chloride formed by supplying a hydrogen chloride gas via the surface of metal gallium that is heated at 850° C. reacted with each other. However, with the foregoing method for producing gallium nitride crystals, crystal strain energy due to a difference in lattice constant between sapphire and gallium nitride is stored in the sides of sapphire and gallium nitride when the gallium nitride is formed on the sappier substrate. Since the film thickness of gallium nitride is smaller than that of sapphire, the crystal strain energy per one lattice of gallium nitride is larger than that of sapphire, resulting in causing crystal defects such as crystal dislocation and the like at the side of gallium nitride and the difficulty in obtaining thick film gallium nitride crystals that are excellent in crystallization. Further, since the substrate is formed of sapphire that has no electric conductivity, a selective etching process has to be applied to nitride base semiconductors in order to form electrodes in such applications as semiconductor laser, light emitting diode and the like with a resulting complexity of production process. Furthermore, when compared with the case wherein electrodes are formed on both upper and lower surfaces of a substrate, series resistance becomes large with two electrodes formed only on the upper surface of the foregoing substrate, thereby causing a problem of increasing the operating voltage for the foregoing semiconductor laser and light emitting diode. Also, when the prior art method for producing gallium nitride is used in applying to transistors, a limit has been imposed on the handling output power of these transistors due to the limit in sapphire's thermal conductivity that is as small as 0.11 W/cm K.

SUMMARY OF THE INVENTION

The present invention deals with the problems involved with the prior art method for producing gallium nitride crystals and aims at supplying gallium nitride crystals that are excellent in crystallization, gallium nitride base semiconductor lasers and light emitting diodes that require a simple production process and have a low operating voltage, and gallium nitride base transistors that are capable of handling high output power.

A method for producing gallium nitride crystals of the present invention is characterized by forming gallium nitride thick film crystals after having a single crystal silicon thin film formed on an amorphous silicon dioxide thin film that was formed on a silicon substrate, whereby crystal defects such as crystal dislocation and the like caused at the time of heteroepitaxial growth made to be Produced in t side of single crystal silicon thin film formed on the foregoing amorphous silicon dioxide, not in the side of gallium nitride, thus resulting in gaining a knowledge of enabling the large reduction in the crystal defects of gallium nitride and the production of gallium nitride thick film crystals with excellent crystallization and so implemented according to the foregoing knowledge. Further, a knowledge has been gained to the effect that after having formed the foregoing gallium nitride thick film crystals the foregoing silicon substrate, silicon dioxide and silicon thin film are eliminated, thereby enabling the production of gallium nitride crystals that are electro-conductive and excellent in heat dissipation, and so implemented according to the foregoing knowledge.

A first type of embodiments of the invention have a structure, wherein after having an amorphous, silicon dioxide thin film formed on a silicon substrate and a single crystal silicon thin film formed on the foregoing silicon dioxide thin film, gallium nitride is formed on the foregoing silicon thin film. Accordingly, by forming the gallium nitride thick film on the single crystal silicon thin film that has been formed on the amorphous silicon dioxide thin film, such crystal defects as crystal dislocation and the like caused at the time of heteroepitaxial growth are produced not in the side of gallium nitride but in the side of the single crystal silicon thin film formed on the foregoing amorphous silicon dioxide, thereby enabling the large reduction of crystal defects in gallium nitride and the forming of gallium nitride thick film crystals that are excellent in crystallization.

A second type of embodiments of the invention have a structure, wherein after having an amorphous silicon dioxide formed on a silicon substrate and a single crystal thin film formed on the foregoing silicon dioxide thin film, gallium nitride is formed on the foregoing silicon thin film and then, in succession, the foregoing silicon substrate and silicon dioxide and silicon films are eliminated. Accordingly, in the same way as in the invention of the first type of embodiments, the crystal defect are allowed to decline substantially, thereby enabling the forming of gallium nitride thick film crystals that are excellent in crystallization. In having a pn junction structure of gallium nitride base semiconductor laser and light emitting diode formed on this gallium nitride film, each respective electrode can be formed on both surfaces of the gallium nitride-since the foregoing silicon icon substrate and silicon dioxide and silicon thin films have been eliminated, thereby enabling the simplification in production process of devices when compared with the case, wherein sapphire was used as the substrate, and also the reduction in operating voltage due to a decrease in series resistance. By having a gallium nitride base transistor structure formed on the foregoing gallium nitride thick film, it becomes possible to improve heat dissipation when compared-with the case, wherein sapphire was used as the substrate, thereby outputting much higher power being made possible.

A third type of embodiments of the invention have structure, wherein amorphous silicon dioxide is formed inside of a silicon substrate with the surface thereof made always in contact with the interior of the foregoing silicon substrate and gallium nitride is formed on the foregoing silicon substrate. Accordingly, amorphous silicon dioxide is formed in part of a silicon substrate as if the former is embedded in the latter, and, in the same way as in the invention of the first type of embodiments, such crystal defects as crystal dislocation and the like caused at the time of heteroepitaxial growth are produced not in the side of gallium nitride but in the side of the silicon thin film formed on the foregoing amorphous silicon dioxide, thereby enabling the large reduction of crystal defects in gallium nitride and the forming of gallium nitride thick film crystals that are excellent in crystallization. Further, since a structure of embedding amorphous silicon dioxide in only Part of a silicon substrate is employed, the excellent crystallization of a section of the silicon substrate, where no amorphous silicon is embedded, has remained on the surf ace of the silicon substrate as is with a resulting improvement of the crystallization of silicon located beneath a gallium nitride thick film when compared with the case, wherein a structure of having amorphous silicon dioxide formed under a silicon thin film and having a silicon substrate situated thereunder is employed all over the silicon substrate as was in the invention of the first type of embodiments. As a result, it becomes possible to improve the crystallization of the gallium nitride thick film formed on the foregoing silicon.

A fourth type of embodiments of the invention have a structure, wherein amorphous silicon dioxide is formed inside of a silicon substrate with the surface thereof made always in contact with the interior of the foregoing silicon substrate, gallium nitride is formed on the foregoing silicon substrate and then the foregoing silicon substrate and silicon dioxide are eliminated. Accordingly, in the same way as in the invention of the third type of embodiments, the crystal defects in gallium nitride can be reduced by a large amount and the production of gallium nitride thick film crystals having excellent crystallization is made possible. In having a pn junction structure of gallium nitride base semiconductor laser and light emitting diode formed on this gallium nitride thick film, each respective electrode can be formed on both surfaces of the gallium nitride since the foregoing silicon substrate and silicon dioxide and silicon thin films have been eliminated, thereby enabling the simplification in production process of devices when compared with the case, wherein sapphire was used as the substrate, and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate, thereby outputting much higher Power be g made possible.

A fifth type of embodiments of the invention have a structure, where-in after having an amorphous silicon dioxide thin film formed on a silicon substrate and a single crystal silicon thin film formed on the foregoing silicon dioxide thin film, the foregoing silicon thin film is eliminated selectively in a shape provided with one or more openings and then, in succession, gallium nitride is formed on the foregoing silicon thin film and silicon dioxide thin film. Accordingly, a single crystal silicon thin film is formed partially on the amorphous silicon dioxide that has been formed on the silicon substrate covering the entire first type of embodiments, such crystal defects as crystal dislocation and the like caused at the time of heteroepitaxial growth are produced not in the side of gallium nitride but in the side of the single crystal silicon thin film formed on the foregoing amorphous silicon dioxide, thereby enabling the large reduction of crystal defects in gallium nitride and the forming of gallium nitride thick film crystals that are excellent in crystallization. Further, by having gallium nitride thick film crystals formed on the steps created by a partially formed single crystal silicon thin film, a stress caused by the difference in lattice constant between silicon and gallium nitride is relieved at the place where the foregoing steps are located, thereby enabling the improvement in crystallization of the gallium nitride thick film formed thereon.

A sixth type of embodiments of the invention have a structure, wherein after having an amorphous silicon dioxide thin film formed on a silicon substrate and a single crystal silicon thin film formed on the foregoing silicon dioxide thin film, the foregoing silicon thin film is eliminated selectively in a shape having one or more openings and further gallium nitride is formed on the foregoing silicon thin film and silicon dioxide thin film and then, in succession, the foregoing silicon substrate and silicon dioxide and silicon thin films are eliminated. Accordingly, in the same way as in the invention of the fifth type of embodiments, it becomes possible to produce gallium nitride thick film crystals with excellent crystallization. In having a pn junction structure of gallium nitride base semiconductor laser and light emitting diode formed on this gallium nitride film, each respective electrode can be formed on both surfaces of the gallium nitride since the foregoing silicon substrate and silicon dioxide and silicon thin films have been eliminated, thereby enabling the simplification in production process of devices when compared with the case, wherein sapphire was used as the substrate, and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate thereby outputting much higher power being made possible.

A seventh type of embodiments of the invention have a structure, wherein after having an amorphous silicon dioxide thin film formed on a silicon substrate and a single crystal silicon thin film formed on the foregoing silicon dioxide thin film, the foregoing silicon thin film and silicon dioxide thin film are eliminated selectively in a shape provided with one or more openings and further gallium nitride is formed on the silicon substrate within the foregoing openings and the foregoing silicon thin film. Accordingly, an amorphous silicon dioxide thin film is formed partially on a silicon substrate and a single crystal silicon thin film is formed on the amorphous silicon dioxide thin film, and, in the same way as in the invention of the first type of embodiments, such crystal defects as crystal dislocation and the like caused at the time of heteroepitaxial growth are produced not in the side of gallium nitride but in the side of a silicon thin film formed on the foregoing amorphous silicon dioxide, thereby enabling the large reduction of crystal defects in gallium nitride and the forming of gall m nitride thick film cry Is that are excellent in crystallization. Also, by having gallium nitride thick film crystals formed on the steps made of partially formed single crystal silicon thin film and silicon dioxide thin film, a stress caused by the difference in lattice constant between silicon and gallium nitride is relieved at the place where the foregoing steps are located, there by enabling the improvement in crystallization of the gallium nitride thick film formed thereon. When compared with the case, wherein the foregoing gallium nitride is formed on the foregoing silicon thin film or on the surface of the foregoing silicon substrate and, as in the invention of the fifth type of embodiments, the gallium nitride thick film is formed partially on the surface of the silicon dioxide thin film, single crystals can be readily formed since the gallium nitride thick film formed thereon carries without fail the lattice information of the silicon substrate situated, thereunder. As a result, it becomes possible to improve the crystallization of the gallium nitride thick film when compared with the invention of the fifth type of embodiments.

An eighth type of embodiments of the invention have a structure, wherein after having an amorphous silicon dioxide thin film formed on a silicon substrate and a single crystal silicon thin film formed on the foregoing silicon dioxide thin film, the foregoing silicon thin film and silicon dioxide thin film are eliminated selectively in a shape having one or more openings and further gallium nitride is formed on the foregoing silicon substrate within the foregoing openings and the foregoing silicon thin film and then, in succession, the foregoing silicon substrate and silicon dioxide and silicon thin films are eliminated. Accordingly, in the same way as in the invention of the seventh type of embodiments, gallium nitride thick film crystals of excellent crystallization can be formed. In having a pn junction structure of gallium nitride base semiconductor laser and light emitting diode formed on this gallium nitride film, each respective electrode can be formed on both surfaces of the gallium nitride since the foregoing silicon substrate and silicon dioxide and silicon thin films have been eliminated, thereby enabling the simplification in production process of devices when compared with the case, wherein sapphire is used as the substrate, and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate, thereby outputting much higher power being made possible.

A ninth type of embodiments of the invention have a structure, wherein after having an amorphous silicon dioxide thin film formed on a silicon substrate and a single crystal silicon thin film formed on the foregoing silicon dioxide thin film, a silicon carbide thin film and then, in succession, gallium nitride are formed on the foregoing silicon film. Accordingly, by having a gallium nitride thick film formed on the silicon carbide thin film disposed-on the single crystal silicon thin film and also having the foregoing single crystal silicon thin film formed on an amorphous silicon dioxide thin film, such crystal defects as crystal dislocation and the like caused at the time of heteroepitaxial growth are produced not in the side of gallium nitride but in the side of the silicon car bide thin film and single crystal silicon thin film formed on the foregoing amorphous silicon dioxide, thereby enabling the large reduction of crystal defects in gallium nitride and the forming of gallium nitride thick film crystals that are excellent in crystallization. Since the lattice constant of silicon carbide is 3.08 angstroms on the hexagonal a axis and the lattice constant of gallium nitride is 3.19 angstroms on the hexagonal a axis resulting in a lattice mismatch of as small as around 3.45%, it becomes possible to reduce the crystal defects in gallium nitride when compared with the case, wherein gallium nitride is formed on a silicon thin film directed by forming the foregoing silicon carbide so as to have it inserted between the silicon thin film and the gallium nitride thick film crystals.

A tenth type of embodiments of the invention have a structure, wherein, after having an amorphous silicon dioxide thin film formed on a silicon substrate and a single crystal silicon thin film formed on the foregoing silicon dioxide thin film, a silicon carbide thin film and then gallium nitride are formed on the foregoing silicon film, and then, in succession, the foregoing silicon substrate and silicon dioxide are eliminated. Accordingly, in the same way as in the invention of the ninth type of embodiments, it becomes possible to form gallium nitride thick film crystals having excellent crystallization on the foregoing silicon carbide thin film. In having a pn junction structure of gallium nitride base semiconductor laser and light emitting diode formed on this gallium nitride thick film, electrodes can be formed on each respective surface of the gallium nitride and silicon carbide thin film since the foregoing silicon substrate and silicon dioxide and silicon thin films have been eliminated, thereby enabling the simplification in production process of devices when compared with the case, wherein sapphire is used as the substrate, and also the reduction in operating voltage due to a decrease made possible in series resistance. By having a gallium nitride base transistor structure formed an the foregoing gallium nitride thick film, it becomes possible to improve heat dissipation when compared with the case, wherein sapphire was used as the substrate, thereby outputting much higher power being made possible.

An eleventh type of embodiments of the invention have a structure, wherein amorphous silicon dioxide is formed inside of a silicon substrate with the surface thereof made always in contact with the interior of the foregoing silicon substrate, a silicon carbide thin film and, in succession, gallium nitride are formed on the foregoing silicon substrate. Accordingly, amorphous silicon dioxide is formed in part of a silicon substrate as if the former is embedded in the latter and also a silicon carbide thin film is formed on the foregoing silicon substrate, and in the same way as in the invention of the ninth type of embodiments such crystal defects as crystal dislocation and the like caused at the time of heteroepitaxial growth are produced not in the side of gallium nitride but in the side of the silicon carbide thin film and single crystal silicon thin film formed on the foregoing amorphous silicon dioxide, thereby enabling the large reduction of crystal defects in gallium nitride and the forming of gallium nitride thick film crystals that are excellent in crystallization. Further, since a structure of embedding amorphous silicon dioxide in only part of a silicon substrate is employed, the excellent crystallization of a section of the silicon substrate, where no amorphous silicon dioxide is embedded, has remained on the surface of the silicon substrate as, is with a resulting improvement in the crystallization of silicon located beneath the silicon carbide thin film when compared with the case, wherein a structure of having amorphous silicon dioxide formed under a silicon thin film and having a silicon substrate situated thereunder is employed all over the silicon substrate as was in the invention of the ninth type of embodiments. As a result, it becomes possible to improve the crystallization of the silicon carbide thin film formed on the foregoing silicon and further the crystallization of the gallium nitride thick film formed thereon. In addition, since the lattice mismatch between silicon carbide and gallium nitride is as small as about 3.45%, it becomes possible to reduce the crystal defects of gallium nitride when compared with the case, wherein gallium nitride is formed on a silicon thin film directly, by forming the foregoing silicon carbide so as to have it inserted between the silicon thin film and the gallium nitride thick film crystals.

A twelfth type of embodiments of the invention have a structure, wherein after having amorphous silicon dioxide formed inside of a silicon substitute with the surface there made always in contact with the interior of the foregoing silicon substrate, a silicon carbide thin film and, in succession, gallium nitride formed on the foregoing silicon substrate, the foregoing silicon substrate and silicon dioxide are eliminated. Accordingly, in the same way as in the invention of the eleventh type of embodiments, it becomes Possible to make a large reduction of crystal defects in gallium nitride and to form gallium nitride thick film crystals having excellent crystallization. In having a pn junction structure of gallium nitride base semiconductor laser and light emitting diode formed on this gallium nitride film, electrodes can be formed on each respective surface of the gallium nitride and silicon carbide thin film since the foregoing silicon substrate and silicon dioxide and silicon thin films have been eliminated, thereby enabling the simplification in production process of devices when compared with the case, wherein sapphire is used as the substrate, and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate, thereby outputting much higher power being made possible.

A thirteenth type of embodiments of the invention have a structure, wherein after having an amorphous silicon dioxide thin film formed on a silicon substrate and a single crystal silicon thin film formed on the foregoing silicon dioxide thin film, the foregoing silicon thin film is eliminated selectively in a shape provided with one or more openings and then a silicon carbide thin film and, in succession, gallium nitride are formed on the foregoing silicon thin film and silicon dioxide thin film. Accordingly, a single crystal silicon thin film is formed partially on the amorphous silicon dioxide that has been formed on the silicon substrate covering the entire surface thereof and a silicon carbide thin film is formed on the single crystal silicon thin film, and, in the same way as in the invention of the ninth type of embodiments, such crystal defects as crystal dislocation and the like caused at the time of heteroepitaxial growth are produced not in the side of gallium nitride but in the side of the silicon carbide thin film and silicon thin film formed on the foregoing amorphous silicon dioxide, thereby enabling the large reduction of crystal defects in gallium nitride and the forming of gallium nitride thick film crystals that are excellent in crystallization. Further, by having a silicon carbide thick film formed on the steps created by a partially formed single crystal silicon thin film and then having gallium nitride thick film crystals formed on the silicon carbide thick film, a stress caused by the difference in lattice constant between silicon and gallium nitride is relieved at the place where the foregoing steps are located, thereby enabling the improvement in crystallization of the gallium nitride thick film formed thereon. In addition, since the lattice mismatch between silicon carbide and gallium nitride is as small as about 3.45%, it becomes possible to reduce crystal defects of the gallium nitride when compared with the case, wherein gallium nitride is formed on a silicon thin film directly, by forming the foregoing silicon carbide so as to have it inserted between the silicon thin film and the gallium nitride thick film crystals.

A fourteenth type of embodiments of the invention have a structure, wherein after having an amorphous silicon dioxide thin film formed on a silicon substrate and a single crystal silicon thin film formed on the foregoing silicon dioxide thin film, the foregoing silicon thin film is eliminated selectively in a shape provided with one or more openings and then a silicon carbide thin film and, in succession, gallium nitride are formed on the foregoing silicon thin film and silicon dioxide thin film, and further the foregoing silicon substrate and silicon dioxide and silicon thin films are eliminated. Accordingly, in the same way as in the invention of the thirteenth type of embodiments, it becomes possible to form gallium nitride thick film crystals that are excellent it in crystallization. In having a pn junction structure of gallium nitride base semiconductor laser and light emitting diode formed on this gallium nitride film, electrodes can be formed on each respective surface of the gallium nitride and silicon carbide thin film since the foregoing silicon substrate and silicon dioxide and silicon thin films have been eliminated, thereby enabling the simplification in production process of devices when compared with the case, wherein sapphire is used as the substrate, and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate, thereby outputting much higher Power being made possible.

A fifteenth type of embodiments of the invention have a structure, wherein after having an amorphous silicon dioxide thin film formed on a silicon substrate and a single crystal silicon thin film formed on the foregoing silicon dioxide thin film, the foregoing silicon thin film and silicon dioxide thin film are eliminated selectively in a shape provided with one or more openings and further a silicon carbide thin film and, in succession, gallium nitride are formed on the silicon substrate within the foregoing openings and the foregoing silicon thin film. Accordingly, an amorphous silicon dioxide thin film is formed partially on a silicon substrate and a single crystal silicon thin film is formed thereon and further a silicon carbide thin film is formed all over the surface, and in the same way as in the invention of the ninth type of embodiments such crystal defects as crystal dislocation and the like caused at the time of heteroepitaxial growth are produced not in the side of gallium nitride but in the side of the silicon carbide thin film and silicon thin film formed on the foregoing, amorphous silicon dioxide, thereby enabling the large reduction of crystal defects in gall m nitride and the forming of gallium nitride thick film crystals that are excellent in crystallization. Also, by having a silicon carbide thin film and further gallium nitride thick film crystals thereon formed on the steps made of the partially formed single crystal silicon thin film and silicon dioxide thin film, a stress caused by the difference in lattice constant between silicon and gallium nitride is relieved at the place where the foregoing steps are located, thereby enabling the improvement in crystallization of the gallium nitride thick film formed thereon. When compared with the case, wherein the foregoing silicon carbide thin film is formed on the foregoing silicon thin film or on the surface of the foregoing silicon substrate and as in the invention of the thirteenth type of embodiments the foregoing silicon carbide thin film is formed partially on the surface of the silicon dioxide thin film, single crystals can be readily formed since the silicon carbide thin film formed thereon carries without fail the lattice information of the silicon substrate situated thereunder. As a result, it becomes possible to improve the crystallization of the foregoing silicon carbide thin film and the gallium nitride thick film formed thereon when compared with the invention of the thirteenth type of embodiments. In addition, since the lattice mismatch between silicon carbide and gallium nitride is as small as about 3.45%, it becomes possible to reduce the crystal defects of gallium nitride when compared with the case, wherein gallium nitride is formed on a silicon thin film directly, by forming the foregoing silicon carbide so as to have it inserted between the silicon thin film and the gallium nitride thick film crystals.

A sixteenth type of embodiments of the invention have a structure, wherein after having an amorphous silicon dioxide thin film formed on a silicon substrate and a single crystal silicon thin film formed on the foregoing silicon dioxide thin film, the foregoing silicon, thin film and silicon dioxide thin film are eliminated selectively in a shape provided with one or more openings and further a silicon carbide thin film and then, in succession, gallium, nitride are formed on the silicon substrate within the foregoing openings and the foregoing silicon thin film and further the foregoing silicon substrate, silicon dioxide thin film and silicon thin film are eliminated. Accordingly, in the same way as in the invention of the fifteenth type of embodiments, it becomes possible to form gallium nitride thick film crystals that are excellent in crystallization. In having a pn junction structure of gallium nitride base semiconductor laser and light emitting diode formed on this gallium nitride film, electrodes can be formed on each respective surface of the gallium nitride and silicon carbide thin film since the foregoing silicon substrate and silicon dioxide and silicon thin films have been eliminated, thereby enabling the simplification in production process of devices when compared with the case, wherein sapphire is used as the substrate, and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate, thereby outputting much higher power being made possible.

A seventeenth type of embodiments of the invention have a structure, wherein, after having an amorphous silicon dioxide thin film formed on a silicon substrate and a single crystal silicon thin film formed on the foregoing silicon dioxide thin film, the foregoing silicon thin film is heated in an atmosphere of hydrocarbon and converted to a silicon carbide thin film and then silicon dioxide and silicon carbide are formed in this order on the silicon substrate and further, in succession, gallium nitride is formed on the foregoing silicon carbide. Accordingly, by having a gallium nitride thick film formed on the silicon carbide thin film formed on the amorphous silicon dioxide thin film such crystal defects as crystal dislocation and the like caused at the time of heteroepitaxial growth are produced not in the side of gallium nitride but in the side of the silicon carbide thin film formed on the foregoing amorphous silicon dioxide, thereby enabling the large reduction of the crystal defects in gallium nitride and the forming of gallium nitride thick film crystals that are excellent in crystallization. Since the lattice constant of silicon carbide is 3.08 angstroms on the hexagonal a axis and the lattice constant of gallium nitride is 3.19 angstroms on the hexagonal a axis resulting in a lattice mismatch of as small as around 3.45%, it becomes possible to reduce the crystal defects in gallium nitride when compared with the case, wherein gallium nitride is formed on a silicon thin film directly, by having gallium nitride thick film crystals formed on the foregoing silicon carbide. Since a silicon carbide thin film is formed by heating a silicon thin film in an atmosphere of hydrocarbon, it becomes possible to simplify the production process of silicon carbide thin film and to reduce the variations in film thickness, when compared with the case, wherein a silicon carbide thin film is formed on a silicon thin film as in the invention of the ninth type of embodiments.

An eighteenth type of embodiments of the invention have a structure, wherein after having an amorphous silicon dioxide thin film formed on a silicon substrate and a single crystal silicon thin film formed on the foregoing silicon dioxide thin film, the fore going silicon thin film is heated in an atmosphere of hydrocarbon and converted to a silicon carbide thin film and then silicon dioxide and silicon carbide are formed in this order on the silicon substrate and further, in succession, gallium nitride is formed on the foregoing silicon carbide, and then the foregoing silicon substrate and silicon dioxide are eliminated. Accordingly, in the same way as in the invention of the seventeenth type of embodiments, it becomes possible to form on the foregoing silicon carbide thin film, gallium nitride thick film crystals, that are excellent in crystallization. In having a pn junction structure of gallium nitride base semiconductor laser and light emitting dioxide formed on this gallium nitride film, electrodes can be formed on each respective surface of the gallium nitride and silicon carbide thin film since the foregoing silicon substrate and silicon dioxide and silicon thin films have been eliminated, thereby enabling the simplification in production process of devices when compared with the case, wherein sapphire is used as the substrate, and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate, thereby outputting much higher power being made possible.

A nineteenth type of embodiments of the invention have a structure, wherein amorphous silicon dioxide is formed inside of a silicon substrate with the surface thereof made always in contact with the interior of the foregoing silicon substrate, and the surface of the foregoing silicon substrate is converted to a silicon carbide thin film by heating the foregoing silicon substrate in an atmosphere of hydrocarbon and further, gallium nitride is formed on the foregoing silicon carbide thin film. Accordingly, amorphous silicon dioxide is formed in part of a silicon substrate as if the former is embedded in the latter and also the surface of the foregoing silicon substrate is a silicon carbide thin film, and further in the same way as in the invention of the seventeenth type of embodiments, such crystal defects as crystal dislocation and the like caused at the time of heteroepitaxial growth are produced not in the side of gallium nitride but in the silicon carbide thin film formed on the foregoing amorphous silicon dioxide, thereby enabling the large reduction of crystal defects in gallium nitride and the forming of gallium nitride thick film crystals that are excellent in crystallization. Furthermore, since a structure of embedding amorphous silicon dioxide in only part of a silicon substrate is employed, the excellent crystallization of a section of the silicon substrate, where no amorphous silicon is embedded, has remained on the surface of the silicon substrate as is with a resulting improvement-of the crystallization of silicon located beneath a silicon carbide thin film when compared with the case, wherein a structure of having amorphous silicon dioxide formed under a silicon thin film and having a silicon substrate situated thereunder is employed all over the silicon substrate as was in the invention of the ninth type of embodiments. As a result, it becomes possible to improve the crystallization of the silicon carbide thin film formed by converting the foregoing silicon and also the crystallization of the gallium nitride thick film formed thereon. In addition, since the lattice mismatch between silicon carbide and gallium nitride is as small as about 3.45%, it becomes possible to reduce the crystal defects of gallium nitride when compared with the case, wherein gallium nitride is formed on a silicon thin film directly, by forming the foregoing silicon carbide so as to have it inserted between the silicon thin film and the gallium nitride thick film crystals. Since the surface of the silicon substrate is converted to a silicon carbide thin film by heating the silicon substrate in atmosphere of hydrocarbon, it becomes possible to simplify the production process of silicon carbide thin film and to reduce the variations in film thickness when compared with the case, wherein a silicon carbide thin film is formed on a silicon thin film as in the invention of the eleventh type of embodiments.

A twentieth type of embodiments of the invention have a structure, wherein amorphous silicon dioxide is formed inside of a silicon substrate with the surface thereof made always in contact with the interior of the foregoing silicon substrate, and the surface of the foregoing silicon substrate is converted to a silicon carbide thin film by heating the foregoing silicon substrate in an atmosphere of hydrocarbon and further gallium nitride is formed on the foregoing silicon carbide thin film, and then the foregoing silicon substrate and silicon dioxide are eliminated. Accordingly, in the same way as in the invention of the nineteenth type of embodiments, it becomes possible to reduce crystal defects in gallium nitride extensively and to form gallium nitride thick film crystals with excellent crystallization. In having a pn junction structure of gallium nitride base semiconductor laser and light emitting diode formed on this gallium nitride thick film, electrodes can be formed on each respective surface of the gallium nitride and silicon carbide thin film since the foregoing silicon substrate and silicon dioxide and silicon thin films have been eliminated, thereby enabling the simplification in production process of devices when compared with the case, wherein sapphire is used as the substrate and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate, thereby outputting much higher power being made possible.

A twenty-first type of embodiments of the invention have a structure, wherein after having an amorphous silicon dioxide thin film formed on a silicon substrate and a single crystal silicon thin film formed on the foregoing silicon dioxide thin film, the foregoing silicon thin film is eliminated selectively in a shape provided with one or more openings, further the foregoing silicon thin film is converted to a silicon carbide thin film by heating the foregoing silicon substrate in an atmosphere of hydrocarbon and then gallium nitride is formed on the foregoing silicon carbide thin film and silicon dioxide thin film. Accordingly, a silicon carbide thin film is formed partially on an amorphous silicon dioxide thin film that is formed all over the surface of the substrate, and in the same way as in the invention of the seventeenth type of embodiments such crystal defects as crystal dislocation and the like paused at the time of heteroepitaxial growth are produced not in the side of gallium nitride but in the side of the silicon carbide thin film formed on the forgoing amorphous silicon dioxide, thereby enabling the large reduction of crystal defects in gallium nitride and the forming of gallium nitride thick film crystals that are excellent in crystallization. Also, by having gallium nitride thick film crystals formed on the steps made of the partially formed silicon carbide thin film, a stress caused by the difference in lattice constant between silicon and gallium nitride is relieved at the place where the foregoing steps are located, thereby enabling the improvement in crystallization of the gallium nitride thick film formed thereon. In addition, since the lattice mismatch between silicon carbide and gallium nitride is as small as about 3.45%, it becomes possible to reduce the crystal defects of gallium nitride when compared with the case, wherein gallium nitride is formed on a silicon thin film directly, by forming gallium nitride thick film crystals on the foregoing silicon carbide. Since a silicon thin film is converted to a silicon carbide thin film by heating the silicon thin film in an atmosphere of hydrocarbon, it becomes possible to simplify the production process of silicon carbide thin film and also to, reduce the variations in film thickness, when compared with the case, wherein a silicon carbide thin film is formed on a silicon thin film as in the invention of the thirteenth type of embodiments.

A twenty-second type of embodiments of the invention have a structure, wherein after having an amorphous silicon dioxide thin film formed on a silicon substrate and a single crystal silicon thin film formed on the foregoing silicon dioxide thin film, the foregoing silicon thin film is eliminated selectively in a shape provided with one or more openings and further the foregoing silicon thin film is converted to a silicon carbide thin film by heating the foregoing silicon substrate in an atmosphere of hydrocarbon, gallium nitride is formed on the foregoing silicon carbide thin film and silicon dioxide thin film and then, in succession, the foregoing silicon substrate and silicon dioxide thin film are eliminated. Accordingly, it becomes possible to form gallium nitride thick film crystals which excellent crystallization in the same way as in the invention of the twenty-first type of embodiments. In having a pn junction structure of gallium nitride base semiconductor laser and light emitting diode formed on this gallium nitride thick film, electrodes can be formed on each respective surface of the gallium nitride and silicon carbide thin film since the foregoing silicon substrate and silicon dioxide thin film have been eliminated, thereby enabling the simplification in production process of devices when compared with the case, wherein sapphire is used as the substrate and also the reduction in operating voltage due to a decrease made by having a gallium nitride base transistor structure formed on the foregoing gallium nitride thick film, it becomes possible to improve heat dissipation when compared with the case, wherein sapphire was used as the substrate, thereby outputting much higher power being made possible.

A twenty-third type of embodiments of the invention have has a structure, wherein after having an amorphous silicon dioxide thin film formed on a silicon substrate and a single crystal silicon thin film formed on the foregoing silicon dioxide thin film, the foregoing silicon thin film and silicon dioxide thin film are eliminated selectively in a shape provided with one or more openings, further the surface of silicon substrate inside of the foregoing openings and the foregoing silicon thin film are converted to a silicon carbide thin film by heating the foregoing silicon substrate in an atmosphere of hydrocarbon and then gallium nitride is formed on the foregoing silicon carbide thin film. Accordingly, an amorphous silicon dioxide thin film is formed partially on a silicon substrate and a single crystal silicon thin film is formed thereon, and further the single crystal silicon thin film on the foregoing openings of silicon substrate and amorphous silicon dioxide thin film is converted to a silicon carbide thin film, and in the same way as in the invention of the nineteenth type of embodiments such crystal defects as crystal dislocation and the like caused at the time of heteroepitaxial growth are produced not in the side of gallium nitride but in the side of the silicon carbide thin film formed on the foregoing amorphous silicon dioxide, thereby enabling the large reduction of crystal defects in gallium nitride and the forming of gallium nitride thick film crystals that are excellent in crystallization. Also, by having gallium nitride thick film crystals formed on the steps made of the partially formed silicon carbide thin film and silicon dioxide thin film, a stress caused by the difference in lattice constant between s silicon and gallium nitride is relieved at the place where the foregoing steps are located, thereby enabling the improvement in crystallization of the gallium nitride thick film formed thereon. The foregoing gallium nitride thick film crystals are formed always on a silicon carbide thin film and single crystals can be readily formed when compared with the case, wherein the foregoing gallium nitride thick film crystals formed partially on the surface of silicon dioxide thin film as in the invention of the twenty-first type of embodiments, since the foregoing gallium nitride thick film crystals carry without fail the lattice information of the substrate of the underneath silicon carbide thin film. As a result, it becomes possible to improve the crystallization of the foregoing gallium nitride thick film when compared with the case in the invention of the twenty-first type of embodiments. In addition, since the lattice mismatch between silicon carbide and gallium nitride is as small as about 3.45%, it becomes possible to reduce the crystal defects of gallium nitride when compared with the case, wherein gallium nitride is formed on a silicon thin film directly, by forming the foregoing silicon carbide so as to have it inserted between the silicon thin film and the gallium nitride thick film crystals. Since the silicon thin film formed on the surface and part of the openings of the silicon substrate is converted to a silicon carbide thin film by heating the silicon substrate in an atmosphere of hydrocarbon, it becomes possible to simplify the production process of silicon carbide thin film and also to reduce the variations in film thickness, when compare with the case, where-in a silicon carbide thin film is formed on a silicon thin film as in a the invention of the fifteenth type of embodiments.

A twenty-fourth type of embodiments of the invention have a structure, wherein after having an amorphous silicon dioxide thin film formed on a silicon substrate and a single crystal silicon thin film formed on the foregoing silicon dioxide thin film, the foregoing silicon thin film and silicon dioxide thin film are eliminated selectively in a shape provided with one or more openings, further the surface of silicon substrate inside of the foregoing openings and the foregoing silicon thin film are converted to a silicon carbide thin film by heating the foregoing silicon substrate in an atmosphere of hydrocarbon, further gallium nitride is formed on the foregoing silicon carbide thin film and then, in succession, the foregoing silicon substrate, silicon dioxide thin film and silicon thin film are eliminated. Accordingly, it becomes possible to form gallium nitride thick film crystals with excellent crystallization in the same way as in the invention of the twenty-third type of embodiments. In having a pn junction structure of gallium nitride base semiconductor laser and light emitting diode formed on this gallium nitride thick film, electrodes can be formed on each respective surface of the gallium nitride and silicon carbide thin film since the foregoing silicon substrate and silicon dioxide thin film have been eliminated, thereby enabling the simplification in production process of devices when compared with the case, wherein sapphire is used as the substrate and also the reduction in operating voltage due to a decrease made possible in series resistance By having a gallium nitride base transistor structure formed on the foregoing gallium nitride thick film, it becomes possible to improve heat dissipation when compared with the case, wherein sapphire was used as the substrate, thereby outputting much higher power being made possible.

A twenty-fifth type of embodiments of the invention have a structure, wherein after having an amorphous silicon dioxide thin film formed on a silicon substrate and a single crystal silicon thin film formed on the foregoing silicon dioxide thin film, a zinc oxide thin film and then, in succession, gallium nitride are formed on the foregoing silicon thin film. Accordingly, by having a gallium nitride thick film formed on a zinc oxide thin film that has been formed on a single crystal silicon thin film and also the foregoing single crystal silicon thin film formed on an amorphous silicon dioxide thin film, such crystal defects as crystal dislocation and the like caused at the time of heteroepitaxial growth are produced not in the side of gallium nitride but in the side of the zinc oxide thin film and single crystal silicon thin film formed on the foregoing amorphous silicon dioxide, thereby enabling the large reduction of crystal defects in gallium nitride and the forming of gallium nitride thick film crystals that are excellent in crystallization. Since the lattice constant of zinc oxide is 3.25 angstroms on the hexagonal a axis and the lattice constant of gallium nitride is 3.19 angstroms on the hexagonal a axis resulting in a lattice mismatch of as small as around 1.91%, it becomes possible to reduce the crystal defects in gallium nitride when compared with the case, wherein gallium nitride is formed on a silicon thin film directly, by forming the foregoing zinc oxide so as to have it inserted between the silicon thin film and the gallium nitride thick film crystals.

A twenty-sixth type of embodiments of the invention have a structure, wherein after having an amorphous silicon dioxide thin film formed on a silicon substrate and a single crystal silicon thin film formed on the foregoing silicon dioxide thin film, a zinc oxide thin film and also gallium nitride are formed on the foregoing silicon thin film, and then, in succession, the foregoing silicon substrate and silicon dioxide and zinc oxide thin films are eliminated. Accordingly, it becomes possible to have gallium nitride thick film crystals with excellent crystallization formed on the foregoing zinc oxide thin film in the same way as in the invention of the twenty-fifth type of embodiments. In having a pn junction structure of gallium nitride base semiconductor laser and light emitting diode formed on this gallium nitride thick film, electrodes can be formed on both surfaces of the gallium nitride since the foregoing silicon substrate, silicon dioxide and silicon thin films and also zinc oxide thin film have been eliminated, thereby enabling the simplification in production process of devices when compared with the case, wherein sapphire is used as the substrate and also the reduction in operating voltage due to a decrease made possible in series resistance. By having a gallium nitride basetransistor structure formed on the foregoing gallium nitride thick film, it becomes possible to improve heat dissipation when compared with the case, wherein sapphire was used as the substrate, thereby outputting much higher power being made possible.

A twenty-seventh type of embodiments of the invention have a structure, substrate with the surface thereof made always in contact with the interior of the foregoing silicon substrate, a zinc oxide thin film and, in succession, gallium nitride are formed on the foregoing silicon substrate. Accordingly, amorphous silicon dioxide is formed in part of a silicon substrate as if the former is embedded in the latter and also a zinc oxide thin film is formed on the foregoing twenty-fifth type of embodiments such crystal defects as crystal dislocation and the like caused at the time of heteroepitaxial growth are produced not in the side of gallium nitride but in the side of the zinc oxide thin film and single crystal silicon thin film formed on the foregoing amorphous silicon dioxide, thereby enabling the large reduction of crystal defects in gallium nitride and the forming of gallium nitride thick film crystals that are excellent in crystallization. Further, since a structure of embedding amorphous silicon dioxide in only part of a silicon substrate is employed, the excellent crystallization of a section of the silicon substrate, where no amorphous silicon is embedded, has remained on the surface of the silicon substrate as is with a resulting improvement of the crystallization of silicon located beneath the zinc oxide thin film when compared with the case, wherein a structure of having amorphous silicon dioxide formed under a silicon thin film and having a silicon substrate situated thereunder is employed all over the silicon substrate as was in the invention of the twenty-fifth type of embodiments. As a result, it becomes possible to improve the crystallization of the zinc oxide thick film formed on the foregoing silicon and further the crystallization of the gallium nitride thick film formed thereon. In addition, since the lattice mismatch between zinc oxide and gallium nitride is as small as about 1.91%, it becomes possible to reduce the crystal defects of gallium nitride when compared with the case, wherein gallium nitride is formed on a silicon thin film directly, by forming the foregoing zinc oxide so as to have it inserted between the silicon thin film and the gallium nitride thick film crystals.

A twenty-eighth type of embodiments of the invention have a structure, wherein amorphous silicon dioxide is formed inside of a silicon substrate with the surface thereof made always in contact with the interior of the foregoing silicon substrate, a zinc oxide thin film and, in succession, gallium nitride are formed on the foregoing silicon substrate and then the foregoing silicon substrate and silicon dioxide and zinc oxide films are eliminated. Accordingly, as in the invention of the twenty-seventh type of embodiments, it becomes possible to reduce crystal defects in gallium nitride extensively and form gallium nitride thick film crystals that are excellent in crystallization. In having a pn junction structure of gallium nitride base semiconductor laser and light emitting diode formed on this gallium nitride thick film, electrodes can be formed on both surfaces of the gallium nitride since the foregoing silicon substrate and silicon dioxide and silicon thin films and zinc oxide thin film have been eliminated, thereby enabling the simplification in production process of devices when compared with the case, wherein sapphire is used as the substrate, and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate thereby outputting much higher power being made possible.

A twenty-ninth type of embodiments of the invention have a structure, wherein after having an amorphous silicon dioxide thin film formed on a silicon substrate and a single crystal silicon thin film formed on the foregoing silicon dioxide thin film, the foregoing silicon thin film is eliminated selectively in a shape provided with one or more openings, and then a zinc oxide thin film and, in succession, gallium nitride are formed on the foregoing silicon thin film and silicon dioxide thin film. Accordingly, a single crystal silicon thin film is formed partially on the amorphous silicon dioxide that has been formed on the silicon substrate covering the entire surface thereof and a zinc oxide thin film is formed thereon and, in the same way as in the invention of the twenty-fifth type of embodiments, such crystal defects as crystal dislocation and the like caused at the time of heteroepitaxial growth are produced not in the side of gallium nitride but in the side of the zinc oxide thin film and silicon thin film formed on the foregoing amorphous silicon dioxide, thereby enabling the large reduction of crystal defects in gallium nitride and the forming of gallium nitride thick film crystals that are excellent in crystallization. In addition, by having a zinc oxide thick film and further gallium nitride thick film crystals thereon formed on the steps created by a partially formed single crystal silicon thin film, a stress caused by the difference in lattice constant between silicon and gallium nitride is relieved at the place where the foregoing steps are located, thereby enabling the improvement in crystallization of the gall m nitride thick film formed thereon. Since the lattice mismatch between zinc oxide and gallium nitride is as small as about 1.91%, it becomes possible to reduce the crystal defects of gallium nitride when compared with the case, wherein gallium nitride is formed on a silicon thin film directly, by forming the foregoing zinc oxide so as to have it inserted between the silicon thin film and the gallium nitride thick film crystals.

A thirtieth type of embodiments of the invention have a structure, wherein after having an amorphous silicon dioxide thin film formed on a silicon substrate and a single crystal silicon thin film formed on the foregoing silicon dioxide thin film, the foregoing silicon thin film is eliminated selectively in a shape provided with one or more openings and then a zinc oxide thin film and, in succession, gallium nitride are formed on the foregoing silicon thin film and silicon dioxide thin film and then the foregoing silicon substrate, silicon dioxide and silicon thin films and zinc oxide thin film are eliminated. Accordingly, in the same way as in the invention of the twenty-ninth type of embodiments, it becomes possible to form gallium nitride thick film crystals that are excellent in crystallization. In having a pn junction structure of gallium nitride base semiconductor laser and light emitting diode formed on this gallium nitride thick film, electrodes can be formed on both surfaces of the gallium nitride since the foregoing silicon substrate, silicon dioxide and silicon thin films and zinc oxide thin film have been eliminated, thereby enabling the simplification in production process of devices when compared with the case, wherein sapphire is used as the substrate, and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate, thereby outputting much higher power being made possible.

A thirty-first type of embodiments of the invention have a structure, wherein after having an amorphous silicon dioxide thin film formed on a silicon substrate and a single crystal silicon thin film formed on the foregoing silicon dioxide thin film, the foregoing silicon thin film and silicon dioxide thin film are eliminated selectively in a shape provided with one or more openings and further a zinc oxide thin film and, in succession, gallium nitride are formed on the silicon substrate within the foregoing openings and the foregoing silicon thin film. Accordingly, an amorphous silicon dioxide thin film is formed partially on a silicon substrate and a single crystal silicon thin film is formed thereon and further a zinc oxide thin film is formed all over the surface thereof, and in the same way as in the invention of the twenty-fifth type of embodiments such crystal defects as crystal dislocation and the like caused at the time of heteroepitaxial growth are produced not in the side of gallium nitride but in the side of the zinc oxide thin film and silicon thin film formed on the foregoing amorphous silicon dioxide, thereby enabling the large reduction of crystal defects in gallium nitride and the forming of gallium nitride thick film crystals that are excellent in crystallization. Also, by having a zinc oxide thin film and further gallium nitride thick film crystals thereon formed on the steps made of the partially formed single crystal silicon thin film and silicon dioxide thin film, a stress caused by the difference in lattice constant between silicon and gallium nitride is relieved at the place where the foregoing steps are located, thereby enabling the improvement in crystallization of the gallium nitride thick film formed thereon. The foregoing zinc oxide thin film is formed on the foregoing silicon thin film or on the surface of the foregoing silicon substrate and single crystals can be readily formed when compared with the case, wherein the foregoing zinc oxide thin film is formed partially on the surface of the silicon dioxide thin film as in the invention of the twenty-ninth type of embodiments, since the zinc oxide thin film formed thereon carries without fail the lattice information of the underneath silicon substrate. As a result, it becomes possible to improve the crystallization of the foregoing zinc oxide thin film and gallium nitride thick film formed thereon when compared with the invention of the twenty-ninth type of embodiments. In addition, since the lattice mismatch between zinc oxide and gallium nitride is as small as about 1.91%, it becomes possible to reduce the crystal defects of gallium nitride when compared with the case, wherein gallium nitride is formed on a silicon thin film directly, by forming the foregoing zinc oxide so as to have it inserted between the silicon thin film and the gallium nitride thick film crystals.

A thirty-second type of embodiments of the invention have a structure, wherein after having an amorphous silicon dioxide thin film formed on a silicon substrate and a single crystal silicon thin film formed on the foregoing silicon dioxide thin film, the foregoing silicon thin film and silicon dioxide thin film are eliminated selectively in a shape provided with one or more openings and further a zinc oxide thin film and then gallium nitride are formed on the silicon substrate within the foregoing openings and the foregoing silicon thin film and, in succession, the foregoing silicon substrate, silicon dioxide thin film, silicon thin film and zinc oxide thin film are eliminated. Accordingly, in the same way as in the invention of the thirty-first type of embodiments, it becomes possible to form gallium nitride thick film crystals that are excellent in crystallization. In having a pn junction structure of gallium nitride base semiconductor laser and light emitting diode formed on this gallium nitride film, electrodes can be formed on both surfaces of the gallium nitride since the foregoing silicon substrate and silicon dioxide and silicon thin films have been eliminated, thereby enabling the simplification in production process of devices when compared with the case, wherein sapphire is used as the substrate and also the reduction in operating voltage due to a decrease made possible in series resistance. By having a gallium nitride base transistor structure formed on the foregoing gallium nitride thick film, it becomes possible to improve heat dissipation when compared with the case, wherein sapphire was used as the substrate, thereby outputting much higher power being made possible.

A thirty-third type of embodiments of the invention have a structure, wherein an amorphous silicon dioxide thin film is formed on a silicon substrate and a single crystal silicon thin film is formed on the foregoing silicon dioxide thin film by implanting oxygen ions of a dose of $10^{17}$ cm$^{-2}$ or more into a silicon substrate and further heating the silicon substrate to 1000° C. or higher. Accordingly, oxygen ions of a high dose are implanted into a silicon substrate so as to make the concentration of oxygen ions become small near the surface of the silicon substrate and then the silicon substrate is further heated to 1000° C. or higher, thereby enabling the forming of a silicon thin film, a silicon dioxide thin film and silicon in this sequence starting from the surface of the silicon substrate. Since the silicon thin film formed on the surface of the silicon substrate carries the crystal lattice information of the silicon substrate surface before the ion implantation, it becomes possible to improve the crystallization of the foregoing silicon thin film and consequently improve the crystallization of the gallium nitride formed on the foregoing silicon thin film when compared with the case, wherein a silicon dioxide thin film and then a single crystal silicon thin film are continuously formed on a silicon substrate by such means as a vapor phase epitaxy and the like.

A thirty-fourth type of embodiments of the invention have a structure, wherein after having a thin film of a material different from a silicon substrate that is provided with one or more openings formed on the surface of the silicon substrate, oxygen ions of a dose of $10^{17}$ cm$^{-2}$ or more are implanted therein and the foregoing thin film of the material different from the silicon substrate and having the openings eliminated and then the substrate is heated to 1000° C. or higher, thereby amorphous silicon dioxide being formed inside of the silicon substrate with the surface thereof made always in contact with the interior of the foregoing silicon substrate. Accordingly, it becomes possible to have amorphous silicon dioxide formed and embedded in part of the substrate by having oxygen ions of a high dose implanted in part of the silicon substrate so that the concentration of oxygen ions may become small in the vicinity of the silicon substrate surface and heating the substrate to 1000° C. or higher after having made an arrangement whereby the oxygen ions are prevented from being implanted through the thin film of the foregoing material different from the substrate.

A thirty-fifth type of embodiments of the invention have a structure, wherein after having an amorphous silicon dioxide thin film formed on a silicon substrate, a silicon substrate is brought into intimate contact with the foregoing silicon dioxide thin film and heated to 600° C. or higher and then, in succession, the foregoing silicon substrate is eliminated progressively starting from the surface thereof where the silicon substrate and silicon dioxide are not in close contact with each other, thereby having an amorphous silicon thin film formed on a silicon substrate and a single crystal silicon thin film formed on the foregoing silicon dioxide thin film. Accordingly, by having an amorphous silicon dioxide thin film formed on a silicon substrate and then heated to 600° C. or higher, the foregoing silicon dioxide thin film and silicon substrate surface are bonded together and then the foregoing bonded silicon substrate is made into a thin layer, thereby making it possible to have a silicon thin film, an amorphous silicon dioxide thin film and silicon formed on the silicon substrate surface in this order. The silicon thin film thus formed makes part of the silicon substrate and has excellent crystallization. Therefore, it becomes possible to improve the crystallization of the foregoing silicon thin film when compiled with the case, wherein a silicon dioxide thin film and then a single crystal thin film are continuously formed on a silicon substrate by such means as a vapor phase epitaxy and the like, resulting in an improvement of crystallization of the gallium nitride formed on the foregoing silicon thin film.

A thirty-sixth type of embodiments of the invention have a structure, wherein a silicon substrate is heated in an atmosphere of a gas containing gallium prior to forming gallium nitride and then gallium nitride is formed. Accordingly, it becomes possible to form the initial growth seeds of gallium nitride uniformly and in high density by heating the underneath silicon substrate or silicon carbide thin film or zinc oxide thin film in an atmosphere of a gas containing gallium. When compare with the case, wherein no heat is applied to the foregoing atmosphere of a gas containing gallium, a three dimensional growth is suppressed, thereby enabling the flattening of the surface of gallium nitride thick film crystals.

A thirty-seventh type of embodiments of the invention have a structure, wherein first amorphous gallium nitride or polycrystal gallium nitride or single crystal gallium nitride is formed and second single crystal gallium nitride is formed at a higher temperature than the temperature, at which the foregoing first gallium nitride is formed, thereby forming gallium nitride. Accordingly, by forming first gallium nitride that is inferior in crystallization to second gallium nitride so as to have the first gallium nitride placed by insertion under the second gallium nitride, the lattice mismatch between the underneath silicon substrate or silicon carbide thin film or zinc oxide thin film and the second gallium nitride is reduced, thereby enabling the improvement in crystallization of the second gallium nitride.

A thirty-eighth type of embodiments of the invention have a structure, wherein after having a silicon substrate heated in an atmosphere of a gas containing gallium prior to forming gallium nitride, first amorphous gallium nitride or polycrystal gallium nitride or single crystal gallium nitride is formed and gallium nitride is formed by producing second single crystal gallium nitride at a higher temperature than the temperature, at which the foregoing first gallium nitride is formed. Accordingly, it becomes possible to form the initial growth seeds of gallium nitride uniformly and in high density by heating the underneath silicon substrate or silicon carbide thin film or zinc oxide thin film in an atmosphere of a gas containing gallium, thereby enabling the suppression of a three dimensional growth and the flattening of the surface of gallium nitride thick film crystals. Also, by forming first gallium nitride that is inferior in crystallization to second gallium nitride so as to have the first gallium nitride placed by insertion under the second gallium nitride, the lattice mismatch between the underneath silicon substrate or silicon carbide thin film or zinc oxide and the second gallium nitride is reduced, thereby enabling the improvement in crystallization of the second gallium nitride. As a result, it becomes possible to realize gallium nitride thick film crystals that are excellent in crystallization and flatness.

A thirty-ninth type of embodiments of the invention have a structure, wherein is after having the surface of a silicon thin film or silicon carbide thin film or zinc oxide thin film heated in an atmosphere of a gas supplied via the surface of gallium trichloride ($GaCl_3$) that is kept at a higher temperature than the melting point thereof, 78° C., gallium nitride is formed. Accordingly, metal gallium gained as a result of dissolving gallium trichloride is absorbed uniformly and in high density into the surface of the foregoing silicon thin film or silicon carbide thin film or zinc oxide thin film and serves as the growth seeds of gallium nitride, thereby enabling the improvement in flatness of the gallium nitride formed thereafter.

A fortieth type of embodiments of the invention have has a structure, wherein after having the surface of a silicon thin film or silicon carbide thin film or zinc oxide thin film heated in an atmosphere of hydrogen chloride gas supplied via the surface of metal gallium that is kept at 850° C. or higher, gallium nitride is formed. Accordingly, metal gallium is absorbed uniformly and in high density into the surface of the foregoing silicon thin film or silicon carbide thin film or zinc oxide thin film and serves as the growth seeds of gallium nitride, thereby enabling the improvement in flatness of the gallium nitride formed thereafter.

A forty-first type of embodiments of the invention have a structure, wherein after having the surface of a silicon thin film or silicon carbide thin film or zinc oxide thin film heated in an atmosphere of a gas supplied via the surface of organic metal containing gallium, gallium nitride is formed. Accordingly, metal gallium gained as a result of dissolving organic metal that contains gallium is absorbed uniformly and in high density into the surface of the foregoing silicon thin film or silicon carbide thin film or zinc oxide thin film and serves as the growth seeds of gallium nitride, thereby enabling the improvement in flatness of the gallium nitride formed thereafter.

A forty-second type of embodiments of the invention have structure, wherein at least one surface of a silicon substrate coincides with a plane situated within 10° from the (111) plane and gallium nitride is formed thereon. Accordingly, since the (111) plane is a plane where atoms are filled in the highest density, it is difficult for the foregoing substrate or a silicon carbide thin film formed thereon or gallium nitride formed on a zinc oxide thin film to carry the information on atomic position from the substrate, thereby enabling the determination of crystal form of gallium nitride according to growth temperatures. Since the hexagonal crystal is predominant at the growth temperatures of around 1000° C., it becomes possible to form gallium nitride that has a small mixed amount of cubic crystal, thereby enabling the reduction in the crystal dislocation density of the gallium nitride consequently gained.

DESCRIPTION OF THE PREFERRED EMBODIMENTS

Next, exemplary embodiments of the present invention will be explained with reference to drawings.

Figure 1A:
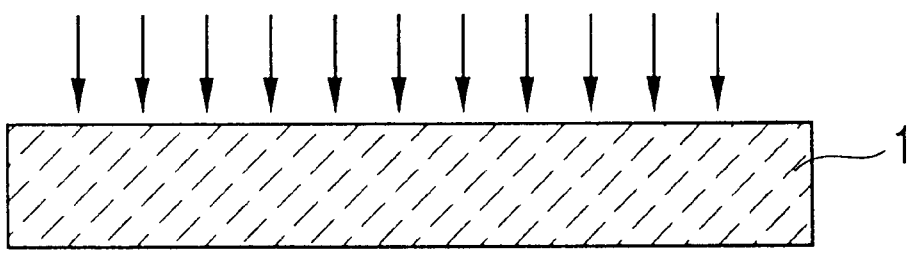
FIGS. 1(a)–1(d) show a method for producing gallium nitride crystals in a first exemplary embodiment of the present invention.
Figure 1B:
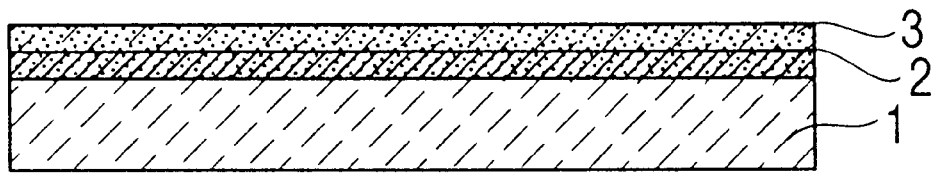
Figure 1C:
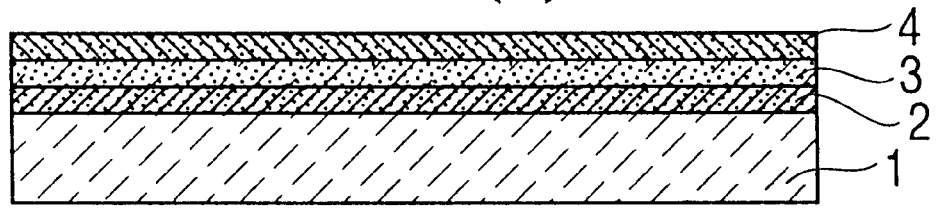
Figure 1D:
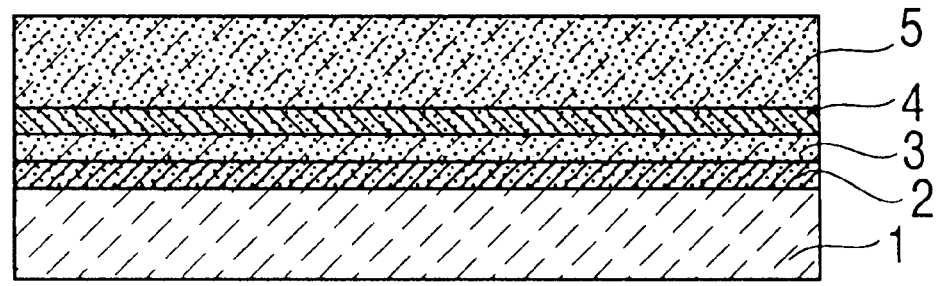

FIGS. 1(a)–1(d) show a method for producing gallium nitride crystals in a first exemplary embodiment of the present invention. In FIGS. 1(a)–1(d), the reference numeral 1 is a silicon (111) substrate (referred to as a silicon substrate 1 hereafter), the reference numeral 2 is amorphous silicon dioxide, the reference numeral 3 is a single crystal silicon thin film, the reference numeral 4 is first amorphous gallium nitride formed by means of a halide VPE method and the reference numeral 5 is second single crystal gallium nitride formed by means of a halide VPE method.

Oxygen ions are implanted on a silicon substrate 1 at an acceleration voltage of 190 keV with a dose of $1.8 \times 10^{18}$ cm$^{-2}$. By a heat treatment of the foregoing ion implanted silicon substrate performed at 1320° C., amorphous silicon dioxide 2 is formed on the silicon substrate 1 to a thickness of about 3800 angstroms and further a single crystal silicon thin film 3 is formed thereon to a thickness of about 2100 angstroms. On the single crystal silicon thin film 3 with the substrate temperature set to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature increased to 1000° C., single crystal gallium nitride 5 is formed on the amorphous gallium nitride 4 to a thickness of about 100 microns by means of the foregoing halide VPE method.

Accordingly, in the present exemplary embodiment, such crystal defects as crystal dislocation and the like caused by the difference in lattice constant between silicon and gallium can be produced not in the side of gallium nitride but in the side of the single crystal silicon thin film 3 by forming the gallium nitride 4 and 5 on the single crystal silicon thin film 3 that has been formed on the amorphous silicon dioxide 2. Due to the difference in lattice constant between silicon and gallium, the crystal strain energy created at the time of heteroepitaxial growth is stored in the side of silicon and gallium nitride. In the case, wherein the film thickness of silicon thin film is substantially smaller than that of gallium nitride as the gallium nitride 4 and 5 measuring about 100 microns in film thickness and the single crystal silicon thin film 3 measuring about 2100 angstroms in thickness in the present exemplary embodiment, the crystal strain energy per one lattice of silicon thin film is extensively larger than that of gallium nitride. As a result, it has become possible to have crystal defects such as crystal dislocation and the like produced in the side of the silicon thin film 3, thereby improving the crystallization of the gallium nitride 4 and 5. In addition, oxygen ions are implanted on the silicon substrate 1 at an acceleration voltage of 190 keV with a dose of $1.8 \times 10^{18}$ cm$^{-2}$ and then by a heat treatment of the foregoing ion implanted silicon substrate 1 performed at 1320° C. the amorphous silicon dioxide 2 is formed on the silicon substrate 1 to a thickness of about 3800 angstroms and further the single crystal silicon thin film 3 is formed thereon to a thickness of 2100 angstroms, thereby the silicon thin film formed on the surface of silicon substrate 1 carrying over the lattice information of the silicon substrate surface before the ion implantation. Therefore, it becomes possible to improve the crystallization of the foregoing silicon thin film with a resulting improvement in crystallization of gallium nitride formed on the foregoing silicon thin film when compared with the case, wherein the amorphous silicon dioxide 2 and, in succession, single crystal silicon thin film are formed continuously on the silicon substrate 1 by such means as a vapor deposition method and the like. Further, after the amorphous gallium nitride 4 has been formed, by having the single crystal gallium nitride 5 formed at a higher temperature than the temperature at which the amorphous gallium nitride 4 was formed and having the gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon thin film 3 and the gallium nitride 4 and 5 and improve the crystallization of the gallium nitride 5.

Figure 2A:
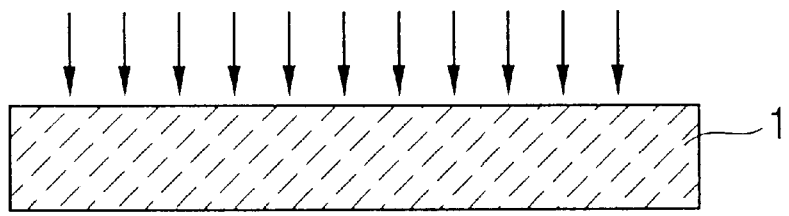
FIGS. 2(a)–2(e) show a method for producing gallium nitride crystals in a second exemplary embodiment of the present invention.
Figure 2B:
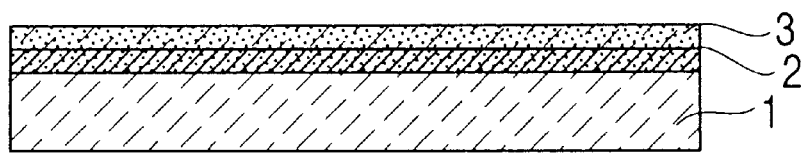
Figure 2C:
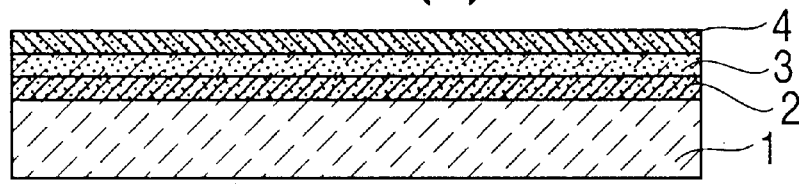
Figure 2D:
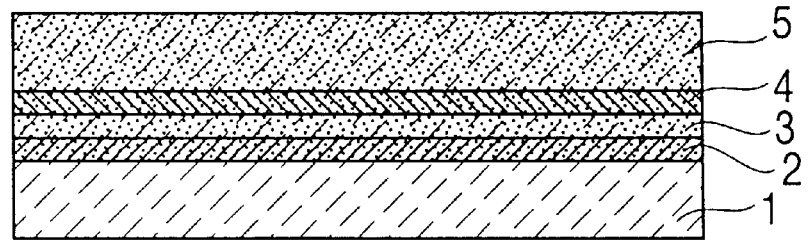
Figure 2E:
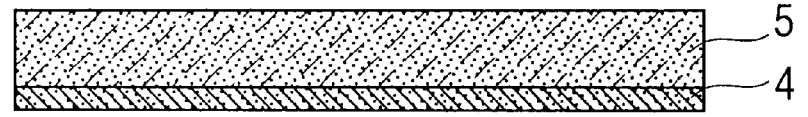

FIGS. 2(a)–2(e) show a method for producing gallium nitride crystals in a second exemplary embodiment of the present invention. FIGS. 2(a)–2(e), the reference numeral 1 is a silicon substrate, the reference numeral 2 is amorphous silicon dioxide, the reference numeral 3 is a single crystal silicon thin film, the reference numeral 4 is first amorphous gallium nitride formed by means of a halide VPE method and the reference numeral 5 is second single crystal gallium nitride formed by means of a halide VPE method.

Oxygen ions are implanted on a silicon substrate 1 at an acceleration voltage of 190 keV with a dose of $1.8 \times 10^{18}$ cm$^{-2}$. By a heat treatment of the foregoing ion implanted silicon substrate performed at 1320° C., amorphous silicon dioxide 2 is formed on the silicon substrate 1 to a thickness of about 3800 angstroms and further a single crystal silicon thin film 3 is formed thereon to a thickness of about 2100 angstroms. On the foregoing single crystal silicon thin film 3 with the substrate temperature set to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature increased to 1000° C., single crystal gallium nitride 5 is formed on the amorphous gallium nitride 4 to a thickness of about 100 microns by means of the foregoing halide VPE method and then, in succession, the gallium nitride crystals on the foregoing silicon substrate are immersed in nitrate fluoride (HF:NHO$_3$=1:5), for example, to eliminate the silicon substrate 1, amorphous silicon dioxide 2 and single crystal silicon thin film 3.

Accordingly, in the present exemplary embodiment, after having finished with the steps of the first exemplary embodiment, the foregoing silicon substrate 1, silicon dioxide 2 and silicon thin film 3 are eliminated, thereby making it possible to improve the crystallization of the gallium nitride 4 and 5 in the same way as in the first exemplary embodiment of the present invention. When a pn junction structure of gallium nitride base semiconductor laser and light emitting diode are formed on the gallium nitride 5, each respective electrode can be formed on both surfaces of the gallium nitride since the foregoing silicon substrate 1, silicon dioxide 2 and silicon thin film 3 are eliminated, thereby enabling the simplification in production process of devices when compared with the case, wherein sapphire is used as the substrate, and further because of a reduction made possible in series resistance it becomes possible to reduce operating voltage of a semiconductor laser, for example. The thermal conductivity of gallium nitride is 1.3 W/cm K and larger than that of sapphire being 0.11 W/cm K and, when a gallium nitride base transistor structure is formed on the gallium nitride 5, heat dissipation is improved when compared with the case, wherein a prior art sapphire substrate 11 was used, thereby making it possible to make higher power transistors operative.

Figure 3A:
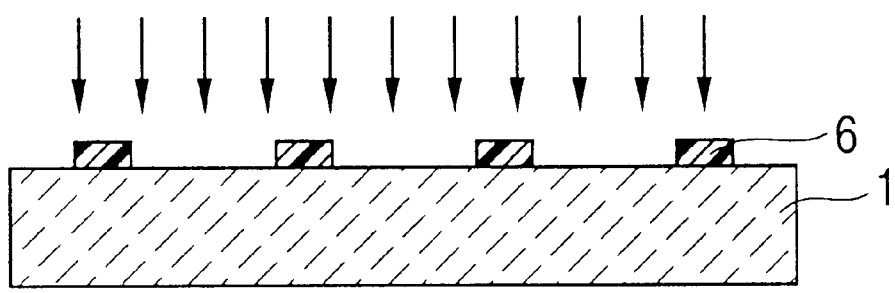
FIGS. 3(a)–3(d) show a method for producing gallium nitride crystals in a third exemplary embodiment of the present invention.
Figure 3B:
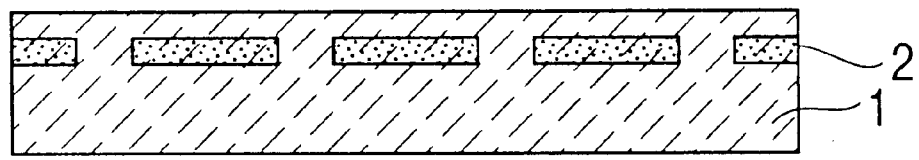
Figure 3C:
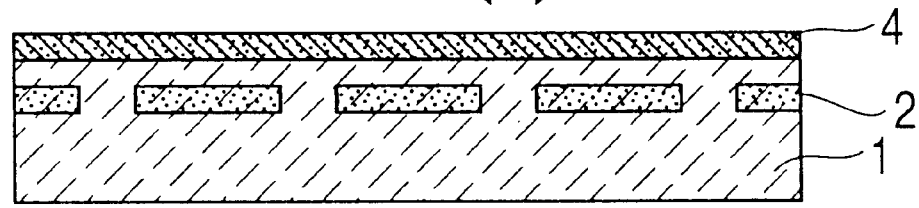
Figure 3D:
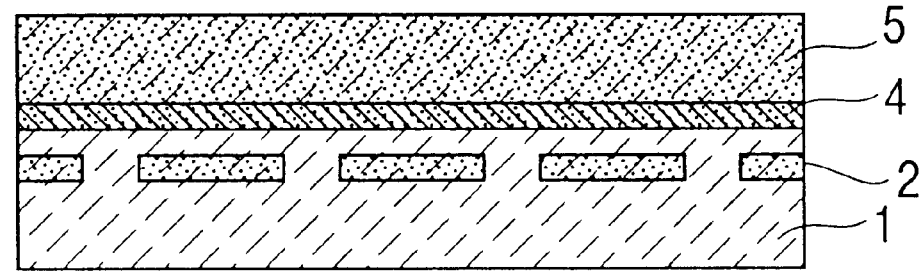

FIGS. 3(a)–3(d) show a method for producing gallium nitride crystals in a third exemplary embodiment of the present invention. FIGS. 3(a)–3(d), the reference numeral 1 is a silicon substrate, the reference numeral 2 is amorphous silicon dioxide, the reference numeral 4 is first amorphous gallium nitride formed by means of a halide VPE method, the reference numeral 5 is second single crystal gallium nitride formed by means of a halide VPE method and the reference numeral 6 is a photoresist.

After having a photoresist 6 with a plurality of openings formed on a silicon substrate 1, oxygen ions are implanted on the silicon substrate 1 at an acceleration voltage of 190 keV with a dose of $1.8 \times 10^{18}$ cm$^{-2}$. The thickness of the photoresist 6 is determined so as to prevent the oxygen ions from getting implanted in the silicon substrate 1 underneath the photoresist. After having the foregoing photoresist 6 eliminated, the foregoing ion implanted silicon substrate is subjected to a heat treatment at 1320° C., amorphous silicon dioxide 2 is formed in the silicon substrate 1 ranging from about 2100 angstroms to about 5900 angstroms deep from the surface thereof as if it is buried inside of the silicon substrate 1. On the foregoing silicon substrate 1 with the temperature thereof set to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature increased to 1000° C., single crystal gallium nitride 5 is formed on the amorphous gallium nitride 4 to a thickness of about 100 microns by means of the foregoing halide VPE method.

Accordingly, in the present exemplary embodiment, since the amorphous silicon oxide 2 is formed inside of part of the silicon substrate 1 as if it is buried therein and the silicon on the amorphous silicon dioxide 2 is as extremely thin as about 2100 angstroms in the same way as in the first exemplary embodiment of the present invention, the crystal strain energy per one lattice of silicon is extensively larger than that of gallium nitride when the gallium nitride 4 and 5 is formed on the silicon surface above the part where the amorphous silicon dioxide 2 is buried. As a result, it has become possible to have crystal defects such as crystal dislocation and the like produced on the surface of the silicon substrate 1, thereby improving the crystallization of the gallium nitride 4 and 5. Because of a structure wherein the amorphous silicon dioxide 2 is buried only in part of the silicon substrate 1, the crystallization of the surface of the silicon substrate 1 takes over the excellent crystallization of the part where no amorphous silicon dioxide 2 is buried, thereby improving the crystallization of the silicon underneath the gallium nitride 4 when compared with the case, wherein amorphous silicon dioxide 2 is formed under a silicon thin film and a silicon substrate 1 is formed thereunder for the entire surface of the silicon substrate 1 as in the first exemplary embodiment of the present invention. As a result, it becomes possible to improve the crystallization of the gallium nitride 4 and 5 formed on the silicon.

Figure 4A:
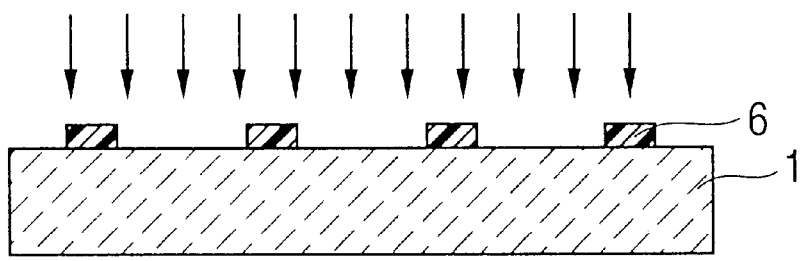
FIGS. 4(a)–4(e) show a method for producing gallium nitride crystals in a fourth exemplary embodiment of the present invention.
Figure 4B:
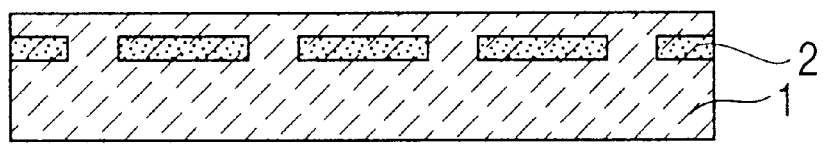
Figure 4C:
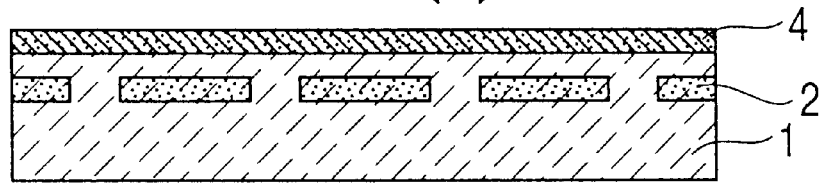
Figure 4D:
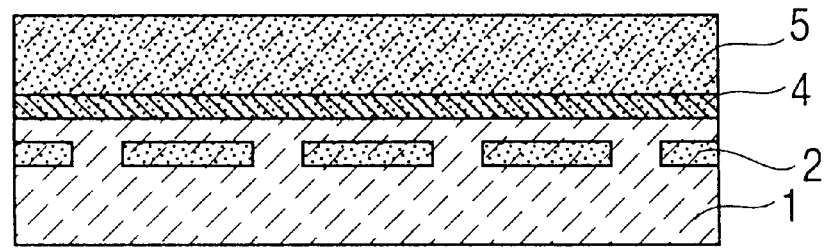
Figure 4E:
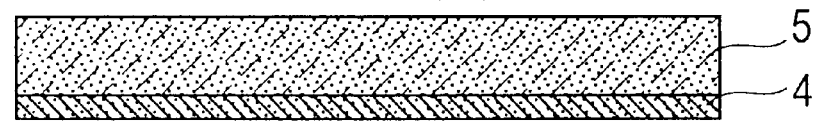

FIGS. 4(a)–4(e) show a method for producing gallium nitride crystals in a fourth exemplary embodiment of the present invention. In FIGS. 4(a)–4(e), the reference numeral 1 is a silicon substrate, the reference numeral 2 is amorphous silicon dioxide, the reference numeral 4 is first amorphous gallium nitride formed by means of a halide VPE method, the reference numeral 5 is second single crystal gallium nitride formed by means of a halide VPE method and the reference numeral 6 is a photoresist.

After having a photoresist 6 with a plurality of openings formed on a silicon substrate 1, oxygen ions are implanted on the silicon substrate 1 at acceleration voltage of 190 keV with a dose of $1.8 \times 10^{18}$ cm$^{-2}$. The thickness of the photoresist 6 is determined so as to prevent the oxygen ions from getting implanted in the silicon substrate 1 underneath the photoresist 6. After having the foregoing photoresist 6 eliminated, the foregoing ion implanted silicon substrate is subjected to a heat treatment at 1320° C., amorphous silicon dioxide 2 is formed in the silicon substrate 1 ranging from about 2100 angstroms to about 5900 angstroms deep from the surface thereof as if it is buried inside of the silicon substrate 1. On the foregoing silicon substrate 1 with the temperature thereof set to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature increased to 1000° C., single crystal gallium nitride 5 is formed on the amorphous gallium nitride 4 to a thickness of about 100 microns by means of the foregoing halide VPE method. Then, the gallium nitride crystals 4 on the foregoing silicon substrate 1 are immersed in nitrate fluoride (HF:NHO$_3$=1:5), for example, to eliminate the silicon substrate 1 and amorphous silicon dioxide 2.

Accordingly, in the present exemplary embodiment, after having finished with the steps of the third exemplary embodiment, the foregoing silicon substrate 1 and silicon dioxide 2 are eliminated, thereby making it possible to improve the crystallization of the gallium nitride 4 and 5 in the same way as in the third exemplary embodiment of the present invention. Since the silicon substrate 1 and silicon dioxide 2 are eliminated, when a pn junction structure of gallium nitride base semiconductor laser and light emitting diode are formed on the gallium nitride 5, each respective electrode can be formed on both surfaces of the gallium nitride, thereby enabling the simplification in production process of devices when compared with the case, wherein sapphire is used as the substrate, and further because of a reduction made possible in series resistance it becomes possible to reduce the operating of semiconductor laser, for example. The thermal conductivity of the gallium nitride is 1.3 W/cm K and larger than that of sapphire being 0.11 W/cm K and, when a gallium nitride base transistor structure is formed on the gallium nitride 5, heat dissipation is improved when compared with the case, wherein a prior art sapphire substrate 11 was used, thereby making it possible to make higher power transistors operative.

Figure 5A:
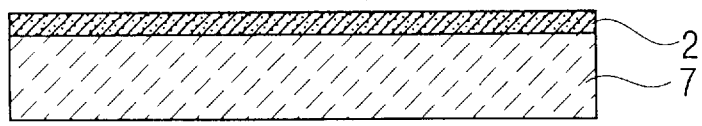
FIGS. 5(a)–5(g) show a method for producing gallium nitride crystals in a fifth exemplary embodiment of the present invention.
Figure 5B:
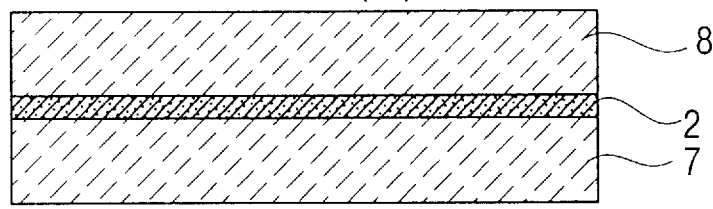
Figure 5C:
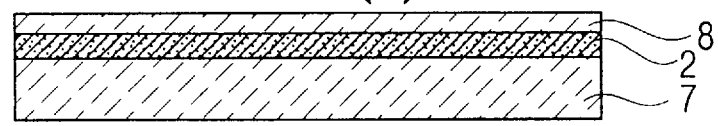
Figure 5D:
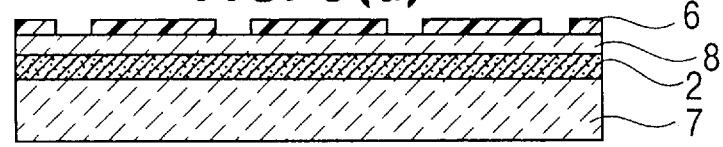
Figure 5E:
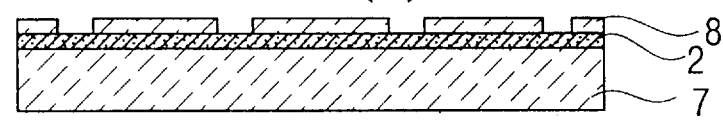
Figure 5F:
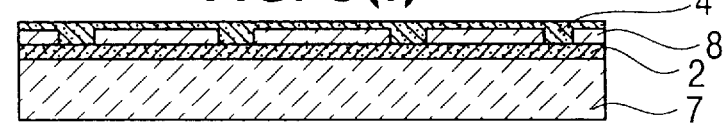
Figure 5G:
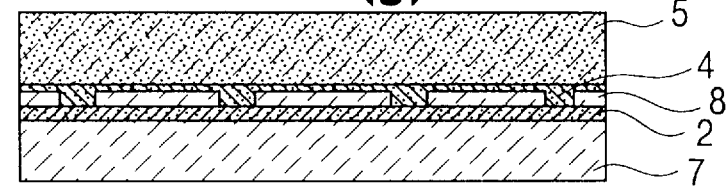

FIGS. 5(a)–5(g) show a method for producing gallium nitride crystals in a fifth exemplary embodiment of the present invention. In FIGS. 5(a)–5(g), the reference numeral 2 is amorphous silicon dioxide, the reference numeral 4 is first amorphous gallium nitride formed by means of a halide VPE method, the reference numeral 5 is second single crystal gallium nitride formed by means of a halide VPE method, the reference numeral 6 is a photoresist, the reference numeral 7 is a silicon (111) substrate (referred to as a silicon substrate 7 hereafter) and the reference numeral 8 is a silicon (111) substrate (referred to as a silicon substrate 8 hereafter).

Amorphous silicon dioxide 2 is formed on a silicon substrate 7 to a thickness of about 4000 angstroms by heating the silicon substrate 7 to 1000° C. in an atmosphere of oxygen. The amorphous silicon dioxide 2 with a silicon substrate 8 brought into intimate contact therewith is heated to 1000° C., thereby combining the foregoing amorphous silicon dioxide 2 with the bottom surface of the silicon substrate 8. Then, the silicon substrate 8 is eliminated progressively starting from the surface thereof that is not in contact with the amorphous silicon dioxide 2 until the silicon substrate 8 becomes a thin film of about 2000 angstroms thick. After having a photoresist 6 with a plurality of openings formed on the silicon surface, the silicon substrate 8 beneath the openings of the photoresist 6 is eliminated by exposing the silicon substrate 8 to Cl$_2$ gas plasma, for example, and then the photoresist 6 is eliminated. In succession, on the foregoing silicon substrate 8 with the substrate temperature set to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature increased to 1000° C., single crystal gallium nitride 5 is formed on the amorphous gallium nitride 4 to a thickness of about 100 microns by means of the foregoing halide VPE method.

Accordingly, in the present exemplary embodiment, since the amorphous silicon oxide 2 is formed all over the silicon substrate 7, the silicon substrate 8 is formed on the amorphous silicon dioxide 2 in a shape having a plurality of openings and the silicon substrate 8 is as extremely thin as about 2100 angstroms in the same way as in the first exemplary embodiment of the present invention, the crystal strain energy per one lattice of silicon is extensively larger than that of gallium nitride when the gallium nitride 4 and 5 is formed on the surface of the silicon substrate 8. As a result, it has become possible to have such crystal defects as crystal dislocation and the like produced on the silicon substrate 8, thereby improving the crystallization of the gallium nitride 4 and 5. Further, by having gallium nitride thick film crystals formed on the steps created by the partially formed silicon substrate 8, a stress caused by the difference in lattice constant between silicon and gallium nitride is relieved at the place where the foregoing steps are located, thereby enabling the improvement in crystallization of the gallium nitride thick film formed thereon.

Figure 6A:
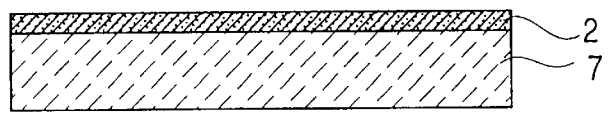
FIGS. 6(a)–6(h) show a method for producing gallium nitride crystals in a sixth exemplary embodiment of the present invention.
Figure 6B:
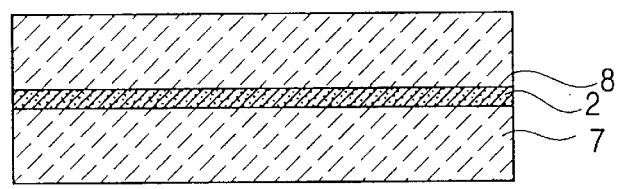
Figure 6C:
Figure 6D:
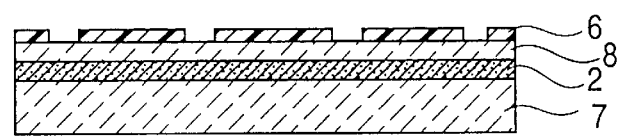
Figure 6E:
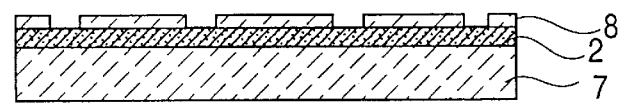
Figure 6F:
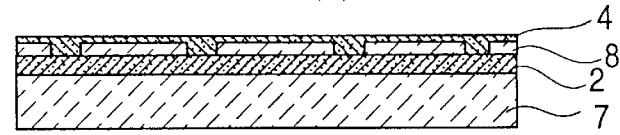
Figure 6G:
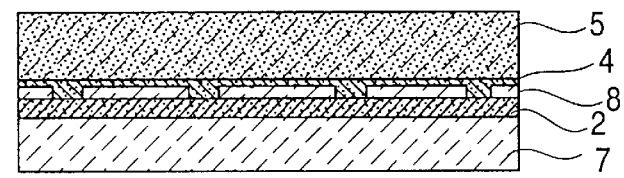
Figure 6H:
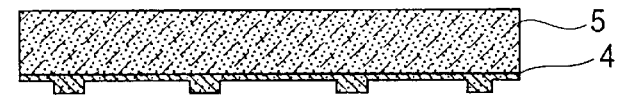

FIGS. 6(a)–6(h) show a method for producing gallium nitride crystals in a sixth exemplary embodiment of the present invention. In FIGS. 6(a)–6(h), the reference numeral 2 is amorphous silicon dioxide, the reference numeral 4 is first amorphous gallium nitride formed by means of a halide VPE method, the reference numeral 5 is second single crystal gallium nitride formed by means of a halide VPE method, the reference numeral 6 is a photoresist, the reference numeral 7 is a silicon substrate and the reference numeral 8 is a silicon substrate.

Amorphous silicon dioxide 2 is formed on a silicon substrate 7 to a thickness of about 4000 angstroms by heating the silicon substrate 7 to 1000° C. in an atmosphere of oxygen. The amorphous silicon dioxide 2 with a silicon substrate 8 brought into intimate contact therewith is heated to 1000° C., thereby combining the foregoing amorphous silicon dioxide 2 with the bottom surface of the silicon substrate 8. Then, the silicon substrate 8 is eliminated progressively starting from the surface thereof that is not in contact with the amorphous silicon dioxide 2 until the silicon substrate 8 becomes a thin film of about 2000 angstroms thick. After having a photoresist 6 with a plurality of openings formed on the surface of the silicon substrate 8, the silicon substrate 8 beneath the opening of the foregoing photoresist 6 is eliminated by exposing the foregoing silicon substrate 8 to $Cl_2$ gas plasma, for example, and then the photoresist 6 is eliminated. In succession, on the foregoing silicon substrate 8 with the substrate temperature set to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature increased to 1000° C., single crystal gallium nitride 5 is formed on the amorphous gallium nitride 4 to a thickness of about 100 microns by means of the foregoing halide VPE method and then, in succession, the gallium nitride crystals on the silicon substrate 8 are immersed in nitrate fluoride ($HF:NHO_3=1:5$), for example, to eliminate the silicon substrate 7, amorphous silicon dioxide 2 and silicon substrate 8.

Accordingly, in the present exemplary embodiment, after having finished with the steps of the fifth exemplary embodiment of the present invention, the silicon substrates 7 and 8 and silicon dioxide 2 are eliminated, thereby making it possible to improve the crystallization of the gallium nitride 4 and 5 in the same way as in the fifth exemplary embodiment of the present invention. When a pn junction structure of gallium nitride base semiconductor laser and light emitting diode are formed on the gallium nitride 5, each respective electrode can be formed on both surfaces of the gallium nitride since the silicon substrates 7 and 8 and silicon dioxide 2 are eliminated, thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the gallium nitride 5, heat dissipation is improved when compared with the case, wherein a prior art sapphire substrate 11 was used, thereby making it possible to make higher power transistors operative.

Figure 7A:
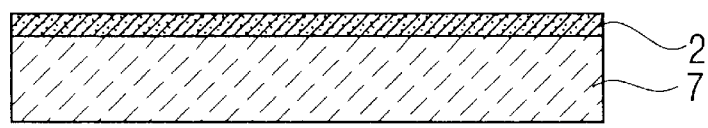
FIGS. 7(a)–7(g) show a method for producing gallium nitride crystals in a seventh exemplary embodiment of the present invention.
Figure 7B:
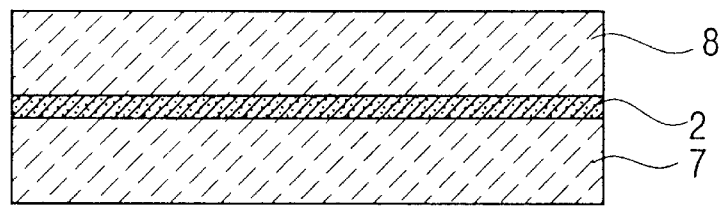
Figure 7C:
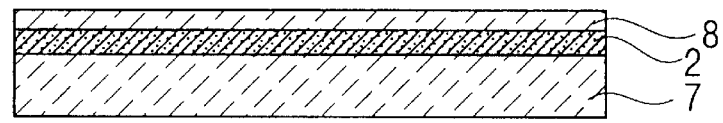
Figure 7D:
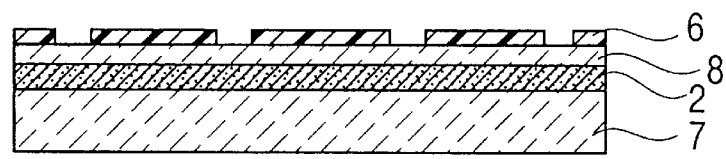
Figure 7E:
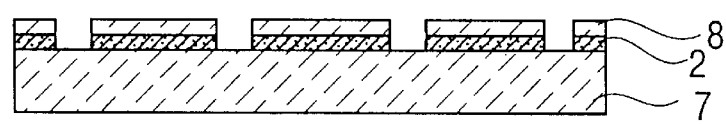
Figure 7F:
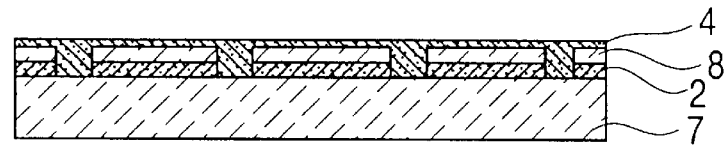
Figure 7G:
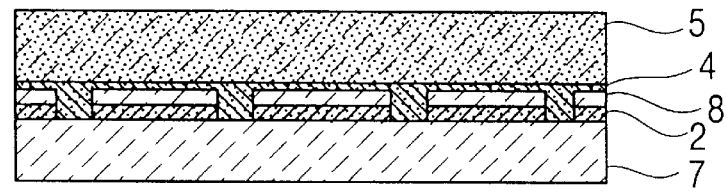

FIGS. 7(a)–7(g) show a method for producing gallium nitride crystals in a seventh exemplary embodiment of the present invention. In FIGS. 7(a)–7(g), the reference numeral 2 is amorphous silicon dioxide, the reference numeral 4 is first amorphous gallium nitride formed by means of a halide VPE method, the reference numeral 5 is second single crystal gallium nitride formed by means of a halide VPE method, the reference numeral 6 is a photoresist, the reference numeral 7 is a silicon substrate and the reference numeral 8 is a silicon substrate.

Amorphous silicon dioxide 2 is formed on a silicon substrate 7 to a thickness of about 4000 angstroms by heating the silicon substrate 7 to 1000° C. in an atmosphere of oxygen. The foregoing amorphous silicon dioxide 2 with a silicon substrate 8 brought into intimate contact therewith is heated to 1000° C., thereby combining the foregoing amorphous silicon dioxide 2 with the bottom surface of the silicon substrate 8. Then, the foregoing silicon substrate 8 is eliminated progressively starting from the surface thereof that is not in contact with the amorphous silicon dioxide 2 until the silicon substrate 8 becomes a thin film of about 2000 angstroms thick. After having a photoresist 6 with a plurality of openings formed on the surface of the silicon substrate 8, the silicon substrate 8 beneath the openings of the photoresist 6 is eliminated by exposing the silicon substrate 8 to $Cl_2$ gas plasma, for example, and further the amorphous silicon dioxide 2 beneath the openings of the photoresist 6 is eliminated by means of reactive ion etching in a gas of $CHF_3$ for example, and then the photoresist 6 is eliminated. On the foregoing silicon substrate with the substrate temperature set to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the amorphous gallium nitride 4 to a thickness of about 100 microns by means of the foregoing halide VPE method.

Accordingly, in the present exemplary embodiment, since the foregoing amorphous silicon oxide 2 and silicon substrate 8 are formed on the silicon substrate 7 in a shape having a plurality of openings and the silicon substrate 8 is as extremely thin as about 2000 angstroms in the same way as in the first exemplary embodiment of the present invention, the crystal strain energy per one lattice of silicon is extensively larger than that of gallium nitride when the gallium nitride 4 and 5 is formed on the surface of the silicon substrate 8. As a result, it has become possible to have such crystal defects as crystal dislocation and the like produced on the silicon substrate 8, thereby improving the crystallization of the gallium nitride 4 and 5. Further, by having gallium nitride thick film crystals formed on the steps created by the partially formed silicon substrate 8, a stress caused by the difference in lattice constant between silicon and gallium nitride is relieved at the place where the foregoing steps are located, thereby enabling the improvement in crystallization of the gallium nitride thick film formed thereon. Since the gallium nitride 4 and 5 is formed on the silicon substrate 8 or on the surface of silicon substrate 7 underneath the openings thereof and, carries without fail the lattice information of the underneath silicon substrate, it becomes easy for single crystals to be formed when compared with the case, wherein gallium nitride 4 and 5 is partially formed on the surface of silicon dioxide thin film 2 as in the fifth exemplary embodiment of the present invention. As a result, it becomes possible for the crystallization of gallium nitride 4 and 5 to be improved when compared with the fifth exemplary embodiment of the present invention.

Figure 8A:
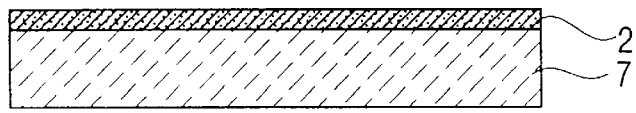
FIGS. 8(a)–8(h) show a method for producing gallium nitride crystals in an eighth exemplary embodiment of the present invention.
Figure 8B:
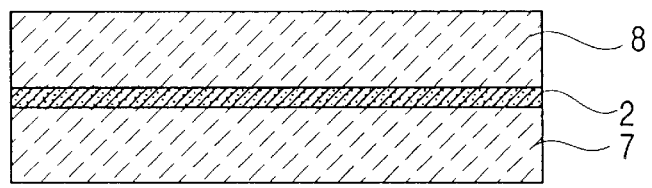
Figure 8C:
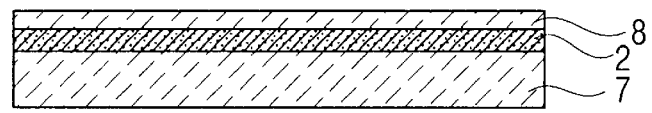
Figure 8D:
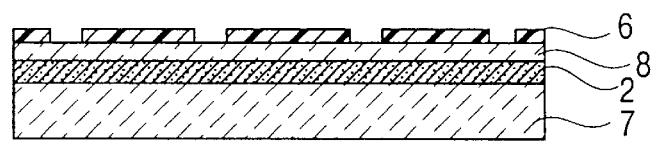
Figure 8E:
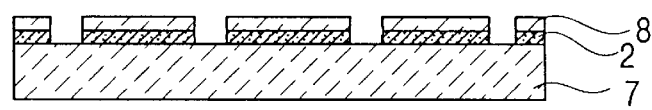
Figure 8F:
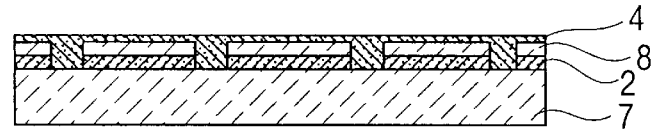
Figure 8G:
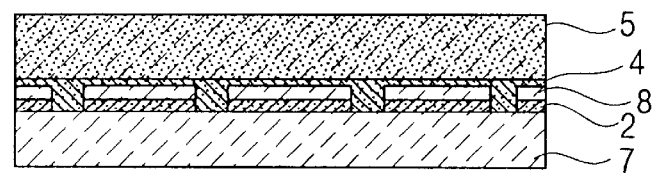
Figure 8H:
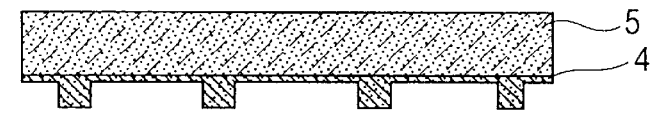

FIGS. 8(a)–8(h) show a method for producing gallium nitride crystals in an eighth exemplary embodiment of the present invention. In FIGS. 8(a)–8(h), the reference numeral 2 is amorphous silicon dioxide, the reference numeral 4 is first amorphous gallium nitride formed by means of a halide VPE method, the reference numeral 5 is second single crystal gallium nitride formed by means of a halide VPE method, the reference numeral 6 is a photoresist, the reference numeral 7 is a silicon substrate and the reference numeral 8 is a silicon substrate.

Amorphous silicon dioxide 2 is formed on a silicon substrate 7 to a thickness of about 4000 angstroms by heating the silicon substrate 7 to 1000° C. in an atmosphere of oxygen. The amorphous silicon dioxide 2 with a silicon substrate 8 brought into intimate contact therewith is heated to 1000° C., thereby combining the amorphous silicon dioxide 2 with the bottom surface of the silicon substrate 8. Then, the silicon substrate 8 is eliminated progressively starting from the surface thereof that is not in contact with the amorphous silicon dioxide 2 until the silicon substrate 8 becomes a thin film of about 2000 angstroms thick. After having a photoresist 6 with a plurality of openings formed on the surface of the silicon substrate 8, the silicon substrate 8 beneath the openings of the photoresist 6 is eliminated by exposing the silicon substrate 8 to $Cl_2$ gas plasma, for example, and further the amorphous silicon dioxide 2 beneath the openings of the photoresist 6 is eliminated by means of reactive ion etching in a gas of $CHF_3$ for example, and then the photoresist 6 is eliminated. On the foregoing silicon substrate with the substrate temperature set to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method and then, in succession, the gallium nitride crystals on the silicon substrate 8 are immersed in nitrate fluoride ($HF:NHO_3$=1:5), for example, to eliminate the silicon substrate 7, amorphous silicon dioxide 2 and silicon substrate 8.

Accordingly, in the present exemplary embodiment, after having finished with the steps of the seventh exemplary embodiment of the present invention, the silicon substrates 8 and silicon dioxide 2 are eliminated, thereby making it possible to improve the crystallization of the gallium nitride 4 and 5 in the same way as in the seventh exemplary embodiment of the present invention. When a pn junction structure of gallium nitride base semiconductor laser and light emitting diode is formed on the gallium nitride 5, each respective electrode can be formed on both surfaces of the gallium nitride since the silicon substrates 7 and 8 and silicon dioxide 2 are eliminated, thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the gallium nitride 5, heat dissipation is improved when compared with the case, wherein a prior art sapphire substrate was used, thereby making it possible to make higher power transistors operative.

Figure 9A:
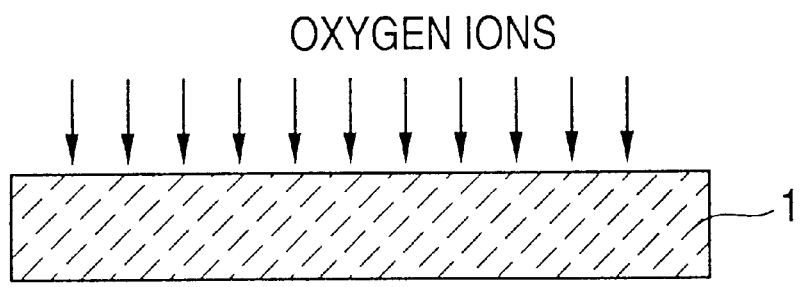
FIGS. 9(a)–9(e) show a method for producing gallium nitride crystal in a ninth exemplary embodiment of the present invention.
Figure 9B:
Figure 9C:
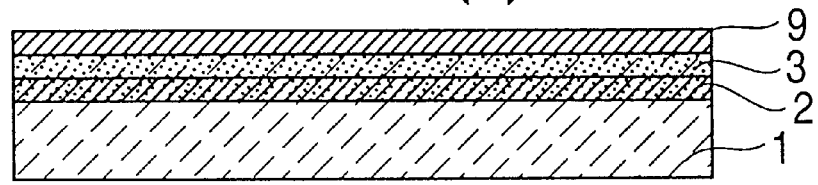
Figure 9D:
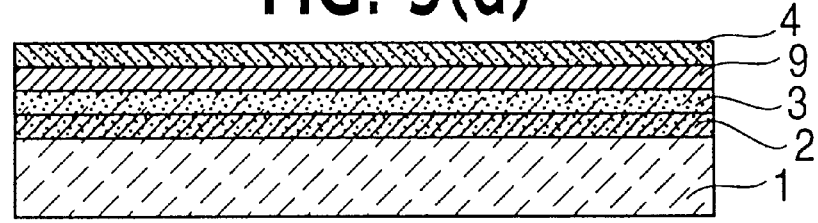
Figure 9E:
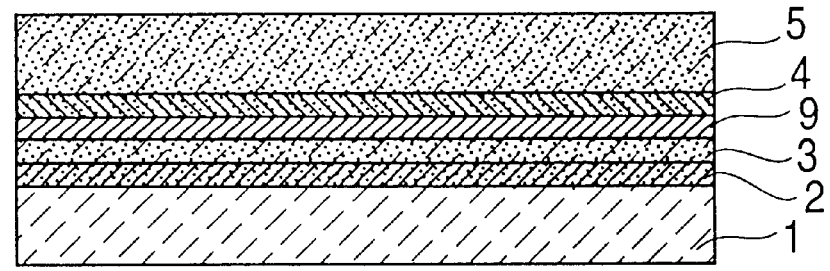

FIGS. 9(a)–9(e) show a method for producing gallium nitride crystals in a ninth exemplary embodiment of the present invention. In FIGS. 9(a)–9(e), the reference numeral 1 is a silicon substrate, the reference numeral 2 is amorphous silicon dioxide, the reference numeral 3 is a single crystal silicon thin film, the reference numeral 3 is a single crystal silicon thin film, the reference numeral 4 is first amorphous gallium nitride formed by means of a halide VPE method, the reference numeral 5 is second single crystal gallium nitride formed by means of a halide VPE method and the reference numeral 9 is a silicon carbide thin film.

Oxygen ions are implanted on a silicon substrate 1 at an acceleration voltage of 190 keV with a dose of $1.8 \times 10^{18}$ $cm^{-2}$. By a heat treatment of the ion implanted silicon substrate performed at 1320° C., amorphous silicon dioxide 2 is formed on the silicon substrate 1 to a thickness of about 3800 angstroms and further a single crystal silicon thin film 3 is formed thereon to a thickness of about 2100 angstroms. Next, a silicon carbide thin film 9 is formed on the foregoing single crystal silicon thin film 3 to a thickness of about 1000 angstroms by heating the silicon substrate 1 to 1300° C. and making monosilane gas ($SiH_4$) and methane gas ($CH_4$) react with the foregoing single crystal silicon thin film 3. On the foregoing silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the amorphous gallium nitride 4 to a thickness of about 100 microns by means of the foregoing halide VPE method.

Accordingly, in the present exemplary embodiment, such crystal defects as crystal dislocation and the like caused by the difference in lattice constant between silicon and gallium can be produced not in the side of gallium nitride but in the side of the silicon carbide thin film 9 and single crystal silicon thin film 3 by having the gallium nitride 4 and 5 formed on the single crystal silicon thin film 3 that has been formed on the amorphous silicon dioxide 2 and also on the silicon carbide thin film 9. Due to the difference in lattice constant between silicon and gallium, the crystal strain energy created at the time of heteroepitaxial growth is stored in the side of silicon, silicon carbide and gallium nitride. In the case as in the present exemplary embodiment, wherein the film thickness of silicon carbide and silicon thin films is substantially smaller than that of gallium nitride as the gallium nitride 4 and 5 measuring about 100 microns in film thickness and the single crystal silicon thin film 3 and silicon carbide thin film 9 together measuring about 3100 angstroms in thickness, the crystal strain energy per one lattice of silicon carbide thin film and silicon thin film is extensively larger than that of gallium nitride. As a result, it has become possible to have crystal defects such as crystal dislocation and the like produced in the side of the silicon carbide thin film 9 and silicon thin film 3, thereby improving the crystallization of the gallium nitride 4 and 5. In addition, oxygen ions are implanted on the silicon substrate 1 at an acceleration voltage of 190 keV with a dose of $1.8 \times 10^{18}$ cm$^{-2}$ and then by a heat treatment of the foregoing ion implanted silicon substrate 1 performed at 1320° C. the amorphous silicon dioxide 2 is formed on the silicon substrate 1 to a thickness of about 3800 angstroms and further the single crystal silicon thin film 3 is formed thereon to a thickness of 2100 angstroms, thereby the silicon thin film formed on the surface of silicon substrate 1 carrying over the lattice information of the surface of silicon substrate 1 before the ion implantation. Therefore, it becomes possible to improve the crystallization of silicon thin film with a resulting improvement in crystallization of the silicon carbide 9 and gallium nitride 4 and 5 formed on the silicon thin film when compared with the case, wherein an amorphous silicon dioxide thin film and, in succession, a single crystal silicon thin film are formed continuously on a silicon substrate 1 by such means as a vapor deposition method and the like. Since the lattice constant of silicon carbide is 3.08 angstroms on the hexagonal a axis and the lattice constant of gallium nitride is 3.19 angstroms on the hexagonal a axis resulting in a lattice mismatch of as small as around 3.45%, it becomes possible to reduce the crystal defects in gallium nitride when compared with the case, wherein gallium nitride is formed on a silicon film directly, by forming the silicon carbide 9 so as to have it inserted between the silicon thin film 3 and the gallium nitride thick film crystals 4 an 5. Further, after the amorphous gallium nitride 4 has been formed, by having the single crystal gallium nitride 5 formed at a higher temperature than the temperature at which the amorphous gallium nitride 4 was formed and having the gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon thin film 3 and the gallium nitride 4 and 5 and improve the crystallization of the gallium nitride 5.

Figure 10A:
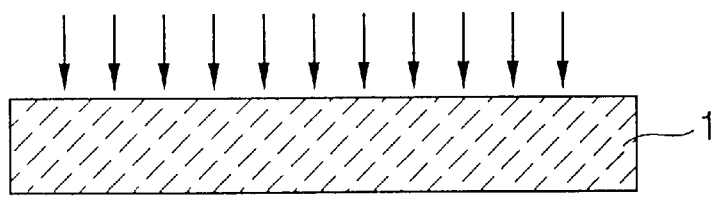
FIGS. 10(a)–10(f) show a method for producing gallium nitride crystals in a tenth exemplary embodiment of the present invention.
Figure 10B:
Figure 10C:
Figure 10D:
Figure 10E:
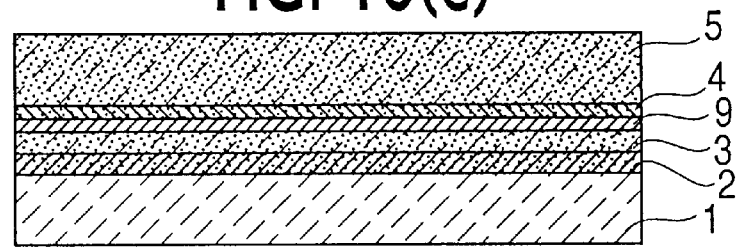
Figure 10F:
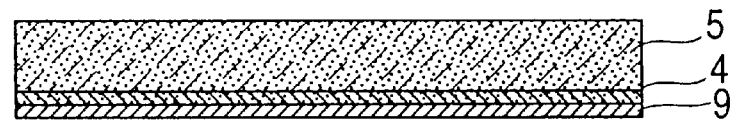

FIGS. 10(*a*)–10(*f*) show a method for producing gallium nitride crystals in a tenth exemplary embodiment of the present invention. In FIGS. 10(*a*)–10(*f*), the reference numeral 1 is a silicon substrate, the reference numeral 2 is amorphous silicon dioxide, the reference numeral 3 is a single crystal silicon thin film, the reference numeral 4 is first amorphous gallium nitride formed by means of a halide VPE method, the reference numeral 5 is second single crystal gallium nitride formed by means of a halide VPE method and the reference numeral 9 is a silicon carbide thin film.

Oxygen ions are implanted on a silicon substrate 1 at an acceleration voltage of 190 keV with a dose of $1.8 \times 10^{18}$ cm$^{-2}$. By a heat treatment of the ion implanted silicon substrate performed at 1320° C., amorphous silicon dioxide 2 is formed on the silicon substrate 1 to a thickness of about 3800 angstroms and further a single crystal silicon thin film 3 is formed thereon to a thickness of about 2100 angstroms. Next, a silicon carbide thin film 9 is formed on the foregoing single crystal silicon thin film 3 to a thickness of about 1000 angstroms by heating the silicon substrate 1 to 1300° C. and making monosilane gas (SH$_4$) and methane gas (CH$_4$) react with the foregoing single crystal silicon thin film 3. On the foregoing silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the amorphous gallium nitride 4 to a thickness of about 100 microns by means of the foregoing halide VPE method. Then, the gallium nitride crystals on the silicon substrate 1 are immersed in nitrate fluoride (HF:NHO$_3$=1:5), for example, to eliminate the silicon substrate 1, amorphous silicon dioxide 2 and single crystal silicon thin film 3.

Accordingly, in the present exemplary embodiment, after having finished with the steps of the ninth exemplary embodiment of the present invention, the silicon substrates 1, silicon dioxide 2 and silicon thin film 3 are eliminated, thereby making it possible to improve the crystallization of the gallium nitride 4 and 5. When a pn junction structure of gallium nitride base semiconductor laser and light emitting diode is formed on the gallium nitride 5, each respective electrode can be formed on the gallium nitride and silicon carbide thin film since the silicon substrate 1, silicon dioxide 2 and silicon thin film 3 are eliminated, thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used, thereby making it possible to make higher power transistors operative.

Figure 11A:
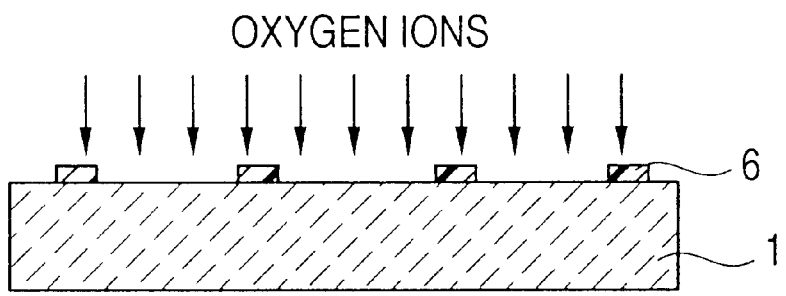
FIGS. 11(a)–11(e) show a method for producing gallium nitride crystals in an eleventh exemplary embodiment of the present invention.
Figure 11B:
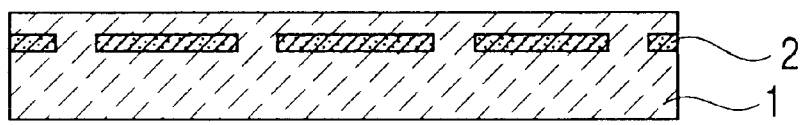
Figure 11C:
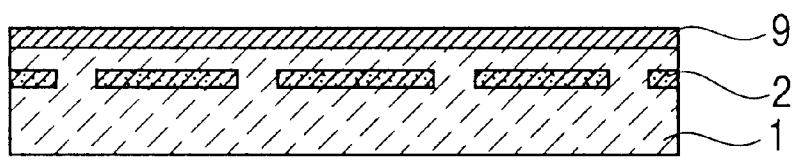
Figure 11D:
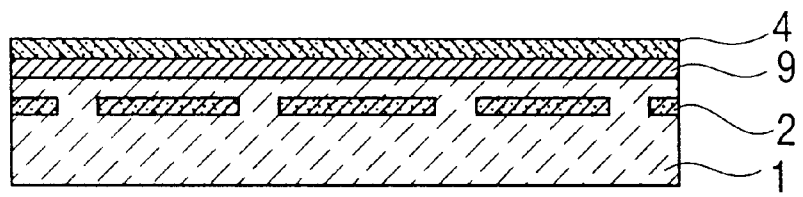
Figure 11E:
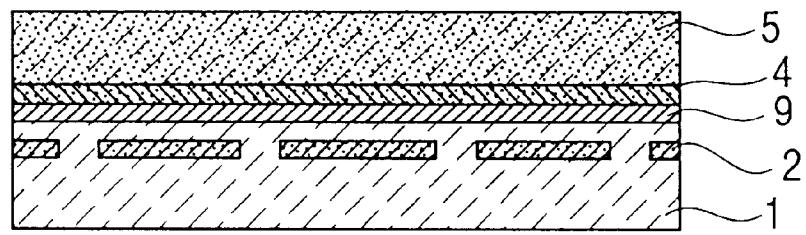

FIGS. 11(*a*)–11(*e*) shows a method for producing gallium nitride crystals in an eleventh exemplary embodiment of the present invention. In FIGS. 11(*a*)–11(*e*), the reference numeral 1 is a silicon substrate, the reference numeral 2 is amorphous silicon dioxide, the reference numeral 4 is first amorphous gallium nitride formed by means of a halide VPE method, the reference numeral 5 is second single crystal gallium nitride formed by means of a halide VPE method, the reference numeral 6 is a photoresist and the reference numeral 9 is a silicon carbide thin film.

After having a photoresist 6 with a plurality of openings formed on a silicon substrate 1, oxygen ions are implanted on the silicon substrate 1 at an acceleration voltage of 190 keV with a dose of $1.8 \times 10^{18}$ cm$^{-2}$. The thickness of the photoresist 6 is determined so as to prevent the oxygen ions from getting implanted in the silicon substrate 1 underneath the photoresist 6. After having the foregoing photoresist 6 eliminated, the ion implanted silicon substrate 1 is subjected to a heat treatment at 1320° C., amorphous silicon dioxide 2 is formed in the silicon substrate 1 ranging from about 2100 angstroms to about 5900 angstroms deep from the surface thereof as if the amorphous silicon dioxide 2 is buried inside of the silicon substrate 1. Next, a silicon carbide thin film 9 is formed on the silicon substrate 1 to a thickness of about 1000 angstroms by heating the silicon substrate 1 to 1300° C. and making monosilane gas (SiH$_4$) and methane gas (CH$_4$) react with the silicon substrate 1. On the silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the amorphous gallium nitride 4 to a thickness of about 100 microns by means of the foregoing halide VPE method.

Accordingly, in the present exemplary embodiment, since the amorphous silicon oxide 2 is formed inside of part of the silicon substrate I as if it is buried therein, a silicon carbide thin film is formed on the silicon substrate 1 to a thickness of about 1000 angstroms and also the silicon and silicon carbide thin films formed on the amorphous silicon dioxide 2 measure about 3100 angstroms in total being extremely thin in comparison with the film thickness of the gallium nitride 4 and 5 measuring about 100 microns, the crystal strain energy per one lattice of silicon and silicon carbide is extensively larger than that of gallium nitride in the same way as in the ninth exemplary embodiment of the present invention when a silicon carbide thin film 9 and, in succession, gallium nitride 4 and 5 are formed on the surface of silicon substrate 1, under which the amorphous silicon dioxide 2 is buried. As a result, it has become possible to have crystal defects such as crystal dislocation and the like produced on the surface of silicon substrate land the silicon carbide thin film 9, thereby improving the crystallization of the gallium nitride 4 and 5. Because of a structure wherein the amorphous silicon dioxide 2 is buried only in part of the silicon substrate 1, the crystallization of the surface of silicon substrate 1 takes over the excellent crystallization of the part where no amorphous silicon dioxide 2 is buried, thereby improving the crystallization of the silicon underneath the silicon carbide thin film 9 when compared with the case, wherein amorphous silicon dioxide 2 is formed under a silicon thin film and a silicon substrate I is formed thereunder for the entire surface of the silicon substrate-1 as-in the ninth exemplary embodiment of the Present invention. As a result, it becomes Possible to improve the crystallization of the silicon carbide 9 formed on the foregoing silicon and the gallium nitride 4 and 5 formed thereon. Since the lattice mismatch between silicon carbide and gallium nitride is as small as about 3.45%, it becomes possible to reduce the crystal defects in gallium nitride when compared with the case, wherein gallium nitride is formed on a silicon substrate 1 directly, by forming the silicon carbide 9 so as to have it inserted between the silicon substrate I and the gallium nitride thick film crystals 4 an 5. Further, after the amorphous gallium nitride 4 has been formed, by having the single crystal gallium nitride 5 formed at a higher temperature than the temperature at which the amorphous gallium nitride 4 was formed and having, the gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon substrate I and the gallium nitride 4 and 5 and improve the crystallization of the gallium nitride 5.

Figure 12A:
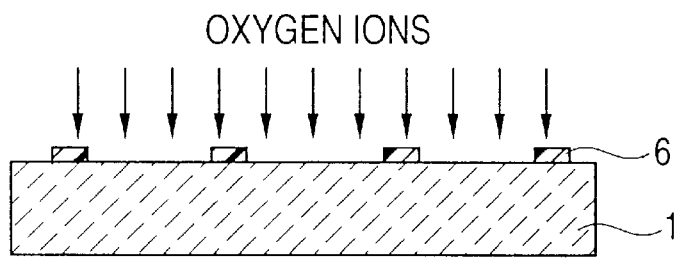
FIGS. 12(a)–12(f) show a method for producing gallium nitride crystals in a twelfth exemplary embodiment of the present invention.
Figure 12B:
Figure 12C:
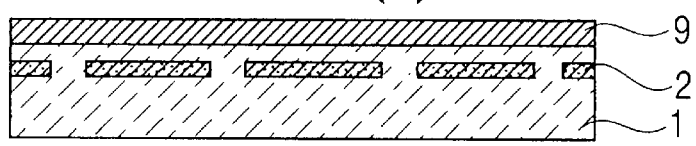
Figure 12D:
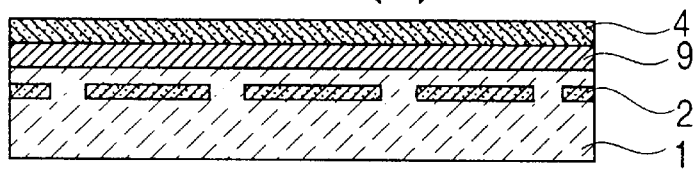
Figure 12E:
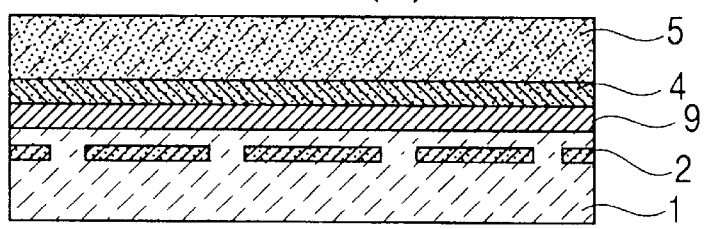
Figure 12F:
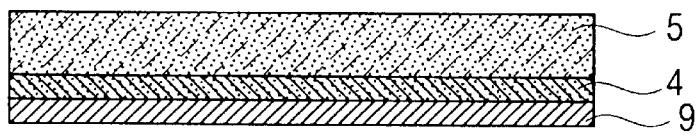

FIGS. 12(a)–12(f) show a method for producing gallium nitride crystals in a twelfth exemplary embodiment of the present invention. In FIGS. 12(a)–12(f), the reference numeral 1 is a silicon substrate, the reference numeral 2 is amorphous silicon dioxide, the reference numeral 4 is first amorphous gallium nitride formed by means-of a halide VPE method, the reference numeral 5 is second single crystal gallium nitride formed by means of a halide VPE method, the reference numeral 6 is a photoresist and the reference numeral 9 is a silicon carbide thin film.

After having a photoresist 6 with a plurality of openings formed on a silicon substrate 1, oxygen ions are implanted on the silicon substrate I at an acceleration voltage of 190 keV with a dose of 1.8×cm. The thickness of the Photoresist 6 is determined so as to Prevent the oxygen ions from getting implanted in the silicon substrate I underneath the Photoresist 6. After having the foregoing Photoresist 6 eliminated, the foregoing ion implanted silicon substrate 1 is subjected to a heat treatment at 1320° C. and amorphous silicon dioxide 2 is formed in the silicon substrate 1 ranging from about 2100 angstroms to about 5900 angstroms deep from the surface thereof as if the amorphous silicon dioxide 2 is buried inside of the silicon substrate 1. Next, a silicon carbide thin film 9 is formed on the silicon substrate 1 to a thickness of about 1000 angstroms by beating the silicon substrate 1 to 1300° C. and making monosilane gas (S'H4) and methane gas (CH4) react with the silicon substrate 1. On the foregoing silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the amorphous gallium nitride 4 to a thickness of about 100 microns by means of the foregoing halide VPE method. Then, the gallium nitride crystals on the silicon substrate I are immersed in nitrate fluoride (HF:NHO$_3$=1:5), for example, to eliminate the silicon substrate 1 and amorphous silicon dioxide 2.

Accordingly, in the present exemplary embodiment, after having finished with the steps of the eleventh exemplary embodiment of the present invention, the silicon substrate 1 and silicon dioxide 2 are eliminated, thereby making it possible to improve the crystallization of the gallium nitride 4 and 5 in the same way as in the third exemplary embodiment of the present invention. When a pn junction structure of gallium nitride base semiconductor laser and light emitting diode is formed on the gallium nitride 5, each. Respective electrode can b formed on the gallium nitride and silicon carbide thin film since the silicon substrate I and silicon dioxide 2 are eliminated, thereby enabling the simplification in production Process of devices when compared with the case, wherein sapphire is used as the substrate, and further because of a reduction made Possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used, thereby making it possible to make higher power transistors operative.

Figure 13A:
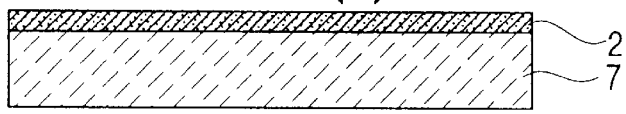
FIGS. 13(a)–13(h) show a method for producing gallium nitride crystals in a thirteenth exemplary embodiment of the present invention.
Figure 13B:
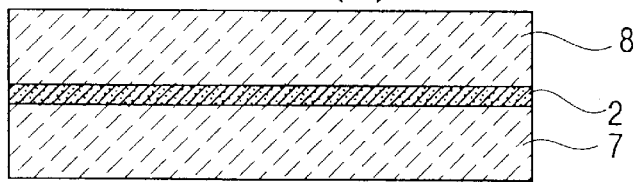
Figure 13C:
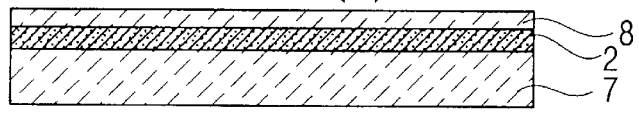
Figure 13D:
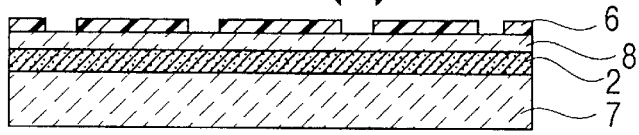
Figure 13E:
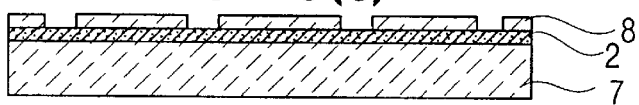
Figure 13F:
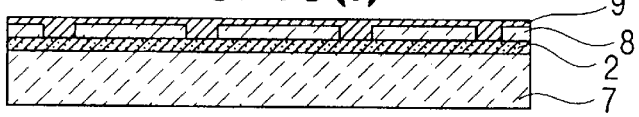
Figure 13G:
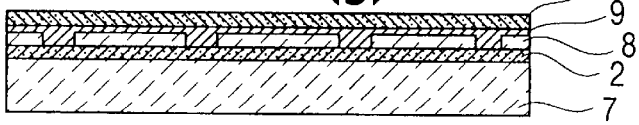
Figure 13H:
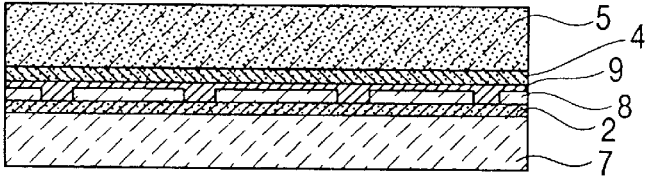

FIGS. 13(a)–13(h) show a method for producing gallium nitride crystals in a thirteenth exemplary embodiment of the present invention. In FIGS. 13(a)–13(h), the reference numeral 2 is amorphous silicon dioxide, the reference numeral 4 is first amorphous gallium nitride formed by means of a halide VPE method, the reference numeral 5 is second single crystal gallium nitride formed by means of a halide VPE method, the reference numeral 6 is a photoresist, the reference numeral 7 is a silicon substrate, the reference numeral 8 is a silicon substrate and the reference numeral 9 is a silicon carbide thin film.

Amorphous silicon dioxide 2 is formed on a silicon substrate 7 to a thickness of about 4000 angstroms by heating the silicon substrate-7 to 1000° C. in an atmosphere of oxygen. The amorphous silicon dioxide 2 with a silicon substrate 8 brought into intimate contact therewith is heated to 1000° C., thereby combining the amorphous silicon dioxide 2 with the bottom surface of the silicon substrate 8. Then, the silicon substrate 8 is eliminated progressively starting from the surface thereof that is not in contact with the amorphous silicon dioxide 2 until the silicon substrate 8 becomes a thin film of about 2000 angstroms thick. After having a photoresist 6 with a Plurality of openings formed on the surface of the silicon substrate 8, the silicon substrate 8 beneath the openings of the photoresist 6 is eliminated by exposing the foregoing silicon substrate 8 to $Cl_2$ gas plasma, for example, and then the photoresist 6 is eliminated. Next, a silicon carbide thin film 9 is formed on the silicon substrate 8 and amorphous silicon thin film 2 of the foregoing openings to a thickness of about 1000 angstroms by heating the silicon substrate 8 to 1300° C. and making monosilane gas (SiH4) and methane gas (CH4) react with the silicon substrate 8 and amorphous silicon dioxide 2. On the silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the amorphous gallium nitride 4 to a thickness of about 100 microns by means of the foregoing halide VPE method.

Accordingly, in the present exemplary embodiment, since the amorphous silicon oxide 2 is formed all over the surface of silicon substrate 7, the silicon substrate 8 is formed on the amorphous silicon dioxide 2 in a shape having a Plurality of openings, the silicon carbide thin film 9 is formed on the silicon substrate 8 and amorphous silicon dioxide 2 of the openings of the silicon substrate 8 and the silicon substrate 8 and silicon carbide thin film 9 are together as extremely thin as about 3000 angstroms, the crystal strain energy per one lattice of silicon and silicon carbide is extensively larger than that of gallium nitride in the same way as in the ninth exemplary embodiment of the present invention when gallium nitride 4 and 5 is formed on the surface of the foregoing silicon carbide thin film 9. As a result, it has become possible to have crystal defects such as crystal dislocation and the like produced on the silicon substrate 8 and silicon carbide thin film 9. Thereby improving the crystallization of the gallium nitride 4 and 5. Further, by having the silicon carbide thin film 9 and gallium nitride 4 and 5 formed on the steps created by the partially formed silicon substrate 8, a stress caused by the difference in lattice constant between silicon and gallium nitride is relieved at the place where the foregoing steps are located, thereby enabling the improvement in crystallization of the gallium nitride formed thereon. Since the lattice mismatch between silicon carbide and gallium nitride is as small as about 3.45%, it becomes possible to reduce the crystal defects in gallium nitride when compared with the case, wherein gallium nitride is formed on a silicon substrate directly, by forming the silicon carbide 9 so as to have it inserted between the silicon substrate I and the gallium nitride thick film crystals 4 and 5. Further, after the amorphous gallium nitride 4 has been formed, by having the single crystal gallium nitride 5 formed at a higher temperature than the temperature at which the amorphous gallium nitride 4 was formed and having the gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon substrate 1 and the gallium nitride 4 and 5 and improve the crystallization of the gallium nitride 5.

Figure 14A:
FIGS. 14(a)–14(i) show a method for producing gallium nitride crystals in a fourteenth exemplary embodiment of the present invention.
Figure 14B:
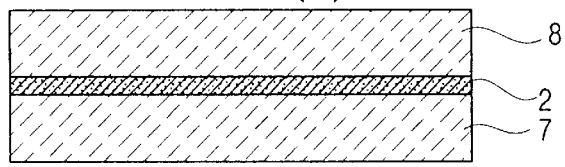
Figure 14C:
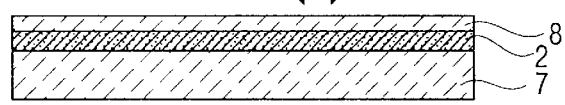
Figure 14D:
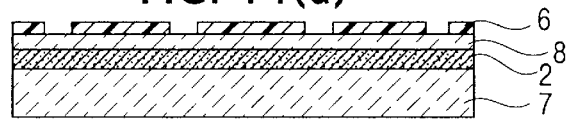
Figure 14E:
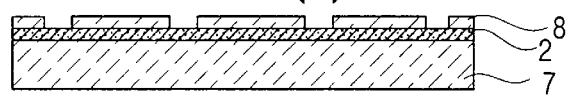
Figure 14F:
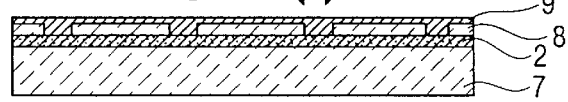
Figure 14G:
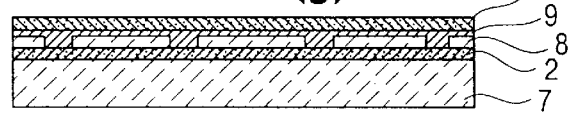
Figure 14H:
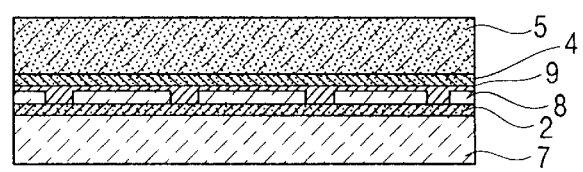
Figure 14I:
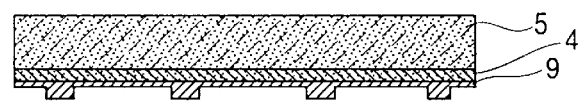

FIGS. 14(a)–14(i) show a method for producing gallium nitride crystals in a fourteenth exemplary embodiment of the present invention. In FIGS. 14(a)–14(i), the reference numeral 2 is amorphous silicon dioxide, the reference numeral 4 is first amorphous gallium nitride formed by means of a halide VPE method, the reference numeral 5 is second single crystal gallium nitride formed by means of a halide VPE method, the reference numeral 6 is a photoresist, the reference numeral 7 is a silicon substrate, the reference numeral 8 is a silicon substrate and the reference numeral 9 is a silicon carbide thin film.

Amorphous silicon dioxide 2 is formed on a silicon substrate 7 to a thickness of about 4000 angstroms by heating the silicon substrate 7 to 1000° C. in an atmosphere of oxygen. The amorphous silicon dioxide 2 with a silicon substrate 8 brought into intimate contact therewith is heated to 1000° C., thereby combining the amorphous silicon dioxide 2 with the bottom surface of the silicon substrate 8. Then, the silicon substrate 8 is eliminated progressively starting from the surface thereof that is not in contact with the amorphous silicon dioxide 2 until the silicon substrate 8 becomes a thin film of about 2000 angstroms thick. After having a photoresist 6 with a plurality of openings formed on the surface of the silicon substrate 8, the silicon substrate 8 beneath the openings of the photoresist 6 is eliminated by exposing the silicon substrate 8 to C12 gas plasma, for example, and then the photoresist 6 is eliminated. Next, a silicon carbide thin film 9 is formed on the silicon substrate 8 and amorphous silicon thin film 2 of the foregoing openings to a thickness of about 1000 angstroms by heating the silicon substrate 8 to 1300° C. and making monosilane gas ($SiH_4$) and methane gas ($CH_4$) react with the silicon substrate 8 and amorphous silicon dioxide 2. On the silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the silicon substrate 8 are immersed in nitrate fluoride ($HF:NHO_3$=1:5), for example, to eliminate the silicon substrate 7, amorphous silicon dioxide 2 and silicon substrate 8.

Accordingly, in the Present exemplary embodiment, after having finished with the steps of the thirteenth exemplary embodiment of the present invention, the silicon substrates 7 and 8 and silicon dioxide 2 are eliminated, thereby making it possible to improve the crystallization of the gallium nitride 4 and 5 in the same way as in the fifth exemplary embodiment of the present invention. When a pn junction structure of gallium nitride base semiconductor laser and light emitting diode is formed on the gallium nitride 5, each respective electrode can be formed on the gallium nitride and silicon carbide thin film since the silicon substrates 7 and 8 and silicon dioxide 2 are eliminated, thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm-K and larger than that of sapphire being 0.11 W/cm K and, when a gallium nitride base transistor structure is formed on the foregoing gallium nitride 5, heat dissipation is improved when compared with the case, wherein a prior art sapphire substrate 11 was used, thereby making it possible to make higher power transistors operative.

Figure 15A:
FIGS. 15(a)–15(h) show a method for producing gallium nitride crystals in a fifteenth exemplary embodiment of the present invention.
Figure 15B:
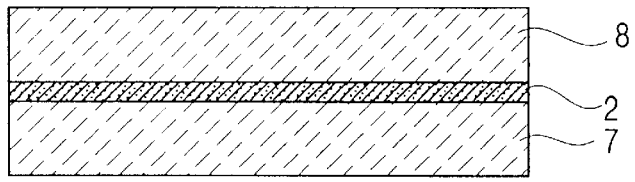
Figure 15C:
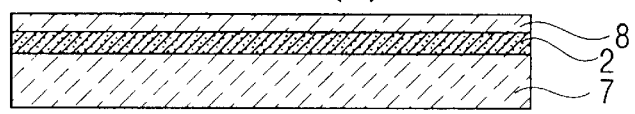
Figure 15D:
Figure 15E:
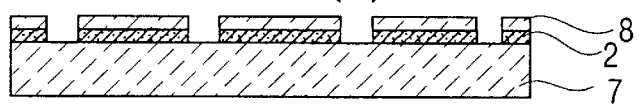
Figure 15F:
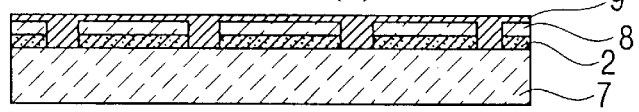
Figure 15G:
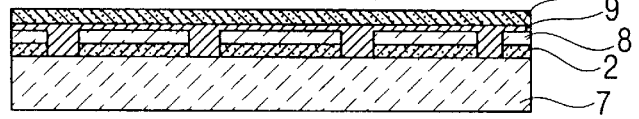
Figure 15H:
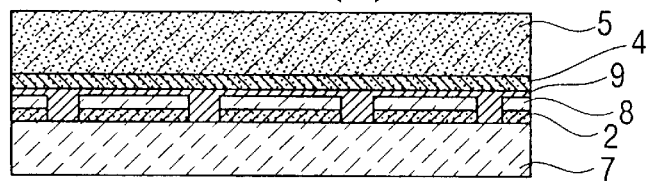

FIGS. 15(a)–15(h) show a method for producing gallium nitride crystals in a fifteenth exemplary embodiment of the present invention. In FIGS. 15(a)–15(h), the reference numeral 2 is amorphous silicon dioxide, the reference numeral 4 is first amorphous gallium nitride formed by means of a halide VPE method. The reference numeral 5 is second single crystal gallium nitride formed by means of a halide VPE method, the reference numeral 6 is a photoresist, the reference numeral 7 is a silicon substrate, the reference numeral 8 is a silicon substrate and the reference numeral 9 is a silicon carbide thin film.

Amorphous silicon dioxide 2 is formed on a silicon substrate 7 to a thickness of about 4000 angstroms by heating the silicon substrate 7 to 1000° C. in an atmosphere of oxygen. The amorphous silicon dioxide 2 with a silicon substrate 8 brought into intimate contact therewith is heated to 1000° C., thereby combining the amorphous silicon dioxide 2 with the bottom surface of the silicon substrate 8. Then, the silicon substrate 8 is eliminated Progressively starting from the surface thereof that is not in contact with the amorphous silicon dioxide 2 until the silicon substrate 8 becomes a thin film of about 2000 angstroms thick. After having a photoresist 6 with a plurality of openings formed on the surface of the silicon substrate 8, the silicon substrate 8 beneath the openings of the photoresist 6 is eliminated by exposing the silicon substrate 8 to $Cl_2$ gas plasma, for example, and further the amorphous silicon dioxide 2 beneath the openings of the photoresist 6 is eliminated by means of reactive ion etching in a gas of $CHF_3$, for example, and then the photoresist 6 is eliminated. Next, a silicon carbide thin film 9 is formed on the foregoing silicon substrate 8 and the surface of silicon substrate 7 of the foregoing openings to a thickness of about 1000 angstroms by heating the silicon substrate 8 to 1300° C. and making monosilane gas ($SiH_4$) and methane gas ($CH_4$) react with the silicon substrate 8 and the surface of silicon substrate 7. On the foregoing silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method.

Accordingly, in the present exemplary embodiment, after the foregoing amorphous silicon oxide 2 and silicon substrate 8 have been formed on the surface of silicon substrate 7 in a shape having a Plurality of openings, the silicon carbide thin film 9 is formed thereon, and since the silicon substrate 8 and silicon carbide thin film 9 are together as extremely thin as about 3000 angstroms, the crystal strain energy Per one lattice of silicon and silicon carbide is extensively larger than that of gallium nitride in the same way as in the ninth exemplary embodiment of the present invention when the gallium nitride 4 and 5 is formed on the silicon carbide thin film 9. As a result, it has become possible to have crystal defects such as crystal dislocation and the like produced on the silicon substrate 8 and silicon carbide thin film 9, thereby improving the crystallization of the gallium nitride 4 and 5. Further, by having the silicon carbide thin film 9 and gallium nitride 4 an 5 formed on the steps created by the partially formed silicon substrate 8 and amorphous silicon dioxide 2, a stress caused by the difference in lattice constant between silicon and gallium nitride is relieved at the place where the foregoing steps are located, thereby enabling the improvement in crystallization of the gallium nitride formed thereon. Because the foregoing silicon carbide thin film 9 is formed on the silicon substrate 8 or on the surface of silicon substrate 7 underneath the openings the foregoing silicon substrate 8 and carries without fail the lattice information of the underneath silicon substrate, it becomes easy for single crystals to be formed when compared with the case, wherein a silicon carbide thin film 9 is partially formed on the surface of silicon dioxide thin film 2 as in the thirteenth exemplary embodiment of the present invention. As a result, it becomes possible for the crystallization of a silicon carbide thin film 9 and gallium nitride 4 and 5 formed thereon to be improved when compared with the thirteenth exemplary embodiment of the present invention. Since the lattice mismatch between silicon carbide and gallium nitride is as small as about 3.45%, it becomes possible to reduce the crystal defects in gallium nitride when compared with the case, wherein gallium nitride is formed on a silicon substrate directly by forming the silicon carbide 9 so as to have it inserted between the silicon substrate I and the gallium nitride thick film crystals 4 an 5. Further, after the amorphous gallium nitride 4 has been formed, by having the single crystal gallium nitride 5 formed at a higher temperature than the temperature at which the amorphous gallium nitride 4 was formed and having the foregoing gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon substrate I and the gallium nitride 4 and 5 and improve the crystallization of the gallium nitride 5.

Figure 16A:
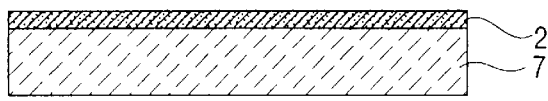
FIGS. 16(a)–16(i) show a method for producing gallium nitride crystals in a sixteenth exemplary embodiment of the present invention.
Figure 16B:
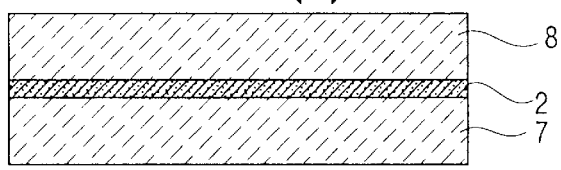
Figure 16C:
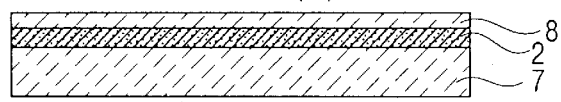
Figure 16D:
Figure 16E:
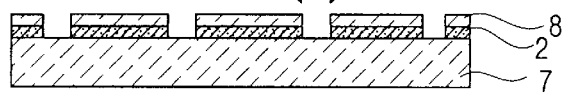
Figure 16F:
Figure 16G:
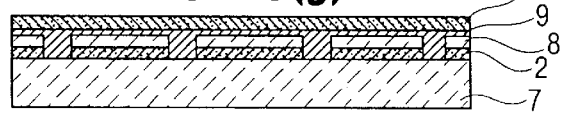
Figure 16H:
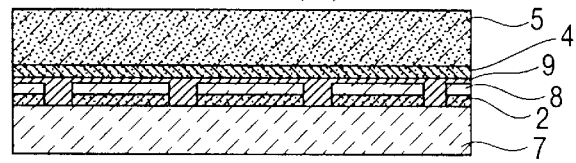
Figure 16I:
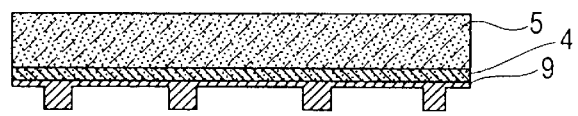

FIGS. 16(a)–16(i) show a method for producing gallium nitride crystals in a sixteenth exemplary embodiment of the present invention. In FIGS. 16(a)–16(i), the reference numeral 2 is amorphous silicon dioxide, the reference numeral 4 is first amorphous gallium nitride formed by means of a halide VPE method, the reference numeral 5 is second single crystal gallium nitride formed by means of a halide VPE method, the reference numeral 6 is a photoresist, the reference numeral 7 is a silicon substrate, the reference numeral 8 is a silicon substrate and the reference numeral 9 is a silicon carbide thin film.

Amorphous silicon dioxide 2 is formed on a silicon substrate 7 to a thickness of about 4000 angstroms by heating the silicon substrate 7 to 1000° C. in an atmosphere of oxygen. The amorphous silicon dioxide 2 with a silicon substrate 8 brought into intimate contact therewith is heated to 1000° C., thereby combining the amorphous silicon dioxide 2 with the bottom surface of the silicon substrate 8. Then, the silicon substrate 8 is eliminated progressively starting from the surface thereof that is not in contact with the amorphous silicon dioxide 2 until the silicon substrate 8 becomes a thin film of about 2000 angstroms thick. After having a photoresist 6 with a plurality of openings formed on the surface of the silicon substrate 8. Then, the silicon substrate 8 beneath the openings of the photoresist 6 is eliminated by exposing the silicon substrate 8 to $Cl_2$ gas plasma, for-example, and further the amorphous silicon dioxide 2 beneath the openings of the photoresist 6 is eliminated by means of reactive ion etching in a gas of CHF$_3$, for example, and then the photoresist 6 is eliminated. Next, a silicon carbide thin film 9 is formed on the foregoing silicon substrate 8 and the surface of silicon substrate 7 of the foregoing openings to a thickness of about 1000 angstroms by making monosilane gas (SiH$_4$) and methane gas (CH$_4$) react with the silicon substrate 8 and silicon substrate 7. On the foregoing silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the foregoing silicon substrate are immersed in nitrate fluoride (HF:NH0$_3$=1:5), for example, to eliminate the silicon substrate 7, amorphous silicon dioxide 2 and silicon substrate 8.

Accordingly, in the present exemplary embodiment, after having finished with the steps of the fifteenth exemplary embodiment of the present invention, the silicon substrates 7 and 8 and silicon dioxide 2 are eliminated, thereby making it possible to improve the crystallization of the gallium nitride 4 and 5. When a pn junction structure of gallium nitride base semiconductor laser and light emitting diode is formed on the gallium nitride 5, each respective electrode can be formed on the gallium nitride and silicon carbide thin film since the silicon substrates 7 and 8 and silicon dioxide 2 are eliminated, thereby the simplification in production process of devices when, compared with the case, wherein sapphire is used as the substrate, and further because of a reduction made Possible in series resistance it becomes Possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used as the substrate, thereby making it possible to make higher power transistors operative.

Figure 17A:
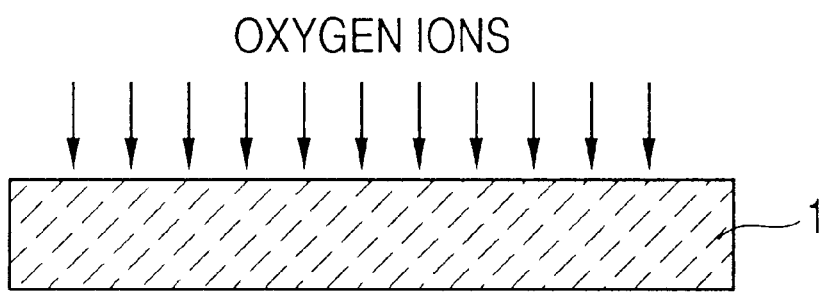
FIGS. 17(a)–17(e) show a method for producing gallium nitride crystals in a seventeenth exemplary embodiment of the present invention.
Figure 17B:
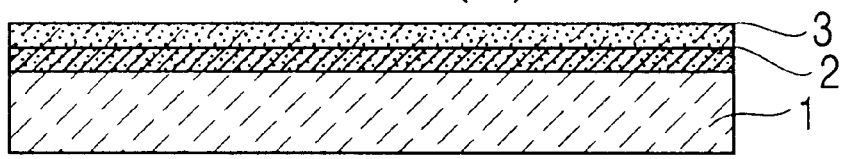
Figure 17C:
Figure 17D:
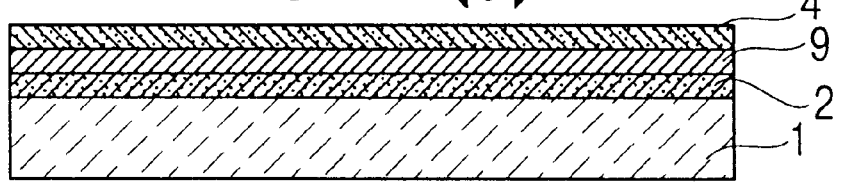
Figure 17E:
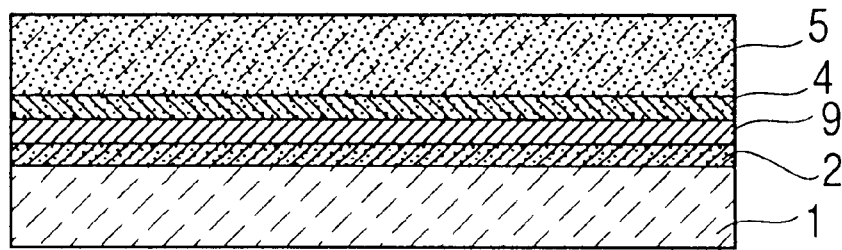

FIGS. 17(*a*)–17(*e*) show a method for producing gallium nitride crystals in a seventeenth exemplary embodiment of the present invention. In FIGS. 17(*a*)–17(*e*), the reference numeral 1 is a silicon substrate, the reference numeral 2 is amorphous silicon dioxide, the reference numeral 3 is a single crystal silicon thin film, the reference numeral 4 is amorphous gallium nitride formed by means of a halide VPE method, the reference numeral 5 is single crystal gallium nitride formed by means of a halide VPE method and the reference numeral 9 is a silicon carbide thin film.

Oxygen ions are implanted on a silicon substrate 1 at an acceleration voltage of 190 keV with a dose of $1.8 \times 10^{18}$ cm By a heat treatment of the foregoing ion implanted silicon substrate performed at 1320 'C, amorphous silicon dioxide 2 is formed on the silicon substrate to a thickness of about 3800 angstroms and further a single crystal silicon thin film 3 is formed thereon to a thickness of about 2100 angstroms. Next, in succession, the silicon substrate 1 is heated to 1300° C. and the foregoing single crystal silicon thin film 3 is converted to a silicon carbide thin film 9 of about 2100 angstroms thick by making a methane gas (CH$_4$) react with the foregoing single crystal silicon than film 3. On the foregoing silicon carbide thin film 9-with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method.

Accordingly, in the present exemplary embodiment, such crystal defects as crystal dislocation and the like caused by the difference in lattice constant between silicon carbide and gallium nitride can be produced not in the side of gallium nitride but in the side of the silicon carbide thin film 9 by having the gallium nitride 4 and 5 formed on the silicon carbide thin film 9 that has been formed on the amorphous silicon dioxide 2. Due to the difference in lattice constant between silicon carbide and gallium nitride, the crystal strain-energy created at the time of heteroepitaxial growth is stored in the side of silicon carbide and gallium nitride. In the case as in the present exemplary embodiment, wherein the film thickness of silicon carbide 9 being about 2100 angstroms is substantially smaller than that of the gallium nitride 4 and 5 being about 100 microns as the gallium nitride 4 and 5 measuring about 100 microns the crystal strain energy per one lattice of silicon carbide thin film and silicon thin film is extensively larger than that of gallium nitride. As a result, it has become possible to have crystal defects such as crystal dislocation and the like produced in the side of the silicon carbide thin film 9, thereby improving the crystallization of the gallium nitride 4 and 5. In addition, oxygen ions are implanted on the silicon substrate 1 at an acceleration voltage of 190 keV with a dose of $1.8 \times 10^{18}$ cm$^{-2}$ and then by a heat treatment of the foregoing ion implanted silicon substrate performed at 1320° C., the amorphous silicon dioxide 2 is formed on the silicon substrate to a thickness of about 3800 angstroms and further the single crystal silicon thin film-3 is formed thereon to a thickness of about 2100 angstroms, thereby the silicon thin film formed on the surface of silicon substrate carrying over the lattice information of the silicon substrate surface before the ion implantation. Therefore, it becomes Possible to improve the crystallization of the foregoing silicon thin film with a resulting, improvement in crystallization of the silicon carbide thin film 9 formed by having the foregoing silicon thin film converted and the gallium nitride 4 and 5 formed thereon when compared with the case, wherein an amorphous silicon dioxide thin film and, in succession, a single crystal silicon thin film are formed continuously on a silicon substrate by such means as a vapor deposition method and the like. Since the lattice constant of silicon carbide is 3.08 angstroms on the hexagonal a axis and the lattice constant of gallium nitride is 3.19 angstroms on the hexagonal a axis resulting in a lattice mismatch of as small as around 3.45%, it becomes possible to reduce the crystal defects in gallium nitride when compared with the case, wherein gallium nitride is formed on a silicon film as in the first exemplary embodiment of the present invention, by forming the foregoing silicon nitride thick film crystals 4 and 5 on the foregoing silicon carbide thin film 9. Further, after the amorphous gallium nitride 4 has been formed, by having the single crystal gallium nitride 5 formed at a higher temperature than the temperature at which the amorphous gallium nitride 4 was formed and having the gallium nitride 4 that is inferior to the gallium nitride 5 in crystallization formed so that the-gallium nitride 4 may be placed by insertion underneath the gallium nitride 5, it becomes possible to mitigate the lattice mismatch between the underneath silicon carbide thin film 9 and the gallium nitride 4 and 5 and improve the crystallization of the gallium nitride 5.

Figure 18A:
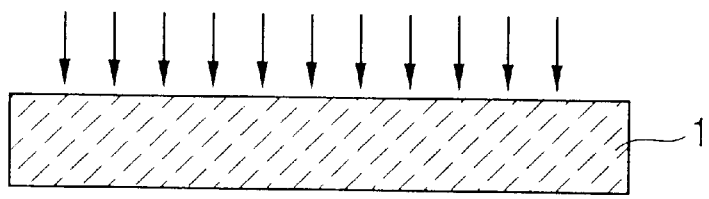
FIGS. 18(a)–18(f) show a method for producing gallium nitride crystals in an eighteenth exemplary embodiment of the present invention.
Figure 18B:
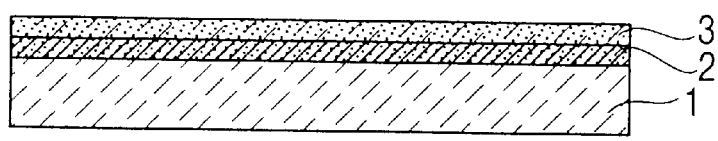
Figure 18C:
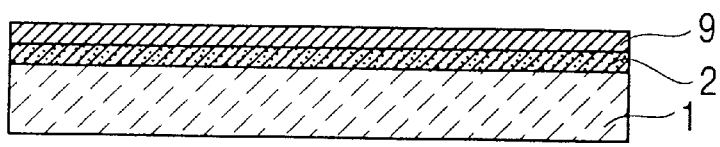
Figure 18D:
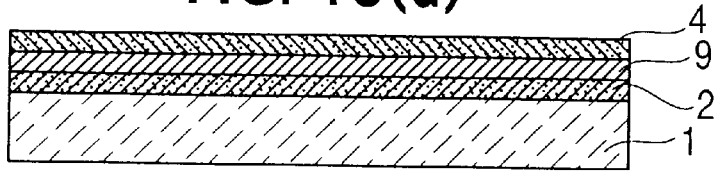
Figure 18E:
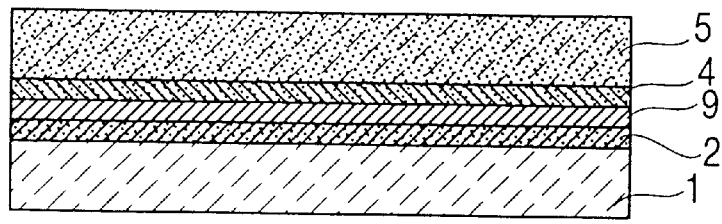
Figure 18F:
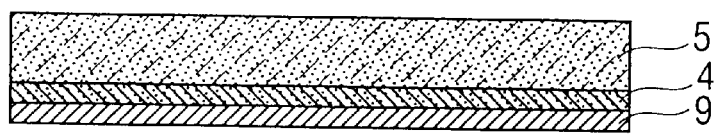

FIGS. 18(*a*)–18(*f*) show a method for producing gallium nitride crystals in an eighteenth exemplary embodiment of the present invention. In FIGS. 18(*a*)–18(*f*), the reference numeral 1 is a silicon substrate, the reference numeral 2 is amorphous silicon dioxide, the reference numeral 3 is a single crystal silicon thin film, the reference numeral 4 is amorphous gallium nitride formed by means of a halide VPE method, the reference numeral 5 is single crystal gallium nitride formed by means of a halide VPE method and the reference numeral 9 is a silicon carbide thin film.

Oxygen ions are implanted on a silicon substrate 1 at an 18-2 acceleration voltage of 190 keV with a dose of 1.8×10 cm By a heat treatment of the foregoing ion implanted silicon substrate performed at 1320° C., amorphous silicon dioxide 2 is formed on the silicon substrate to a thickness of about 3800 angstroms and further a single crystal silicon thin film 3 is formed thereon to a thickness of about 2100 angstroms. Next, in succession, the silicon substrate I is heated to 1300° C. and the single crystal silicon thin film 3 is converted to a silicon carbide thin film 9 of about 2100 angstroms thick by making a methane gas ($CH_4$) react with the foregoing single crystal silicon thin film 3. On the foregoing silicon carbide thin film 9 with the substrate temperature adjusted to 600° C. for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the foregoing silicon substrate are immersed in nitrate fluoride ($HF:NHO_3=1:5$), for example, to eliminate the silicon substrate 1, amorphous silicon dioxide 2 and single silicon thin film 3.

Accordingly, in the present exemplary embodiment, after having finished with the steps of the seventeenth exemplary embodiment of the present invention, the silicon substrate 1, silicon dioxide 2 and silicon thin film 3 are eliminated, thereby making it possible to improve the crystallization of the gallium nitride 4 and 5 in the same way as the seventeenth exemplary embodiment of the present invention. When a pn junction structure of gallium nitride base semiconductor laser and light emitting diode is formed on the gallium nitride 5, each respective electrode can be formed on the gallium nitride and silicon carbide thin film since the foregoing silicon substrate 1, silicon dioxide 2 and silicon thin film 3 are eliminated, thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used, thereby making it possible to make higher power transistors operative.

Figure 19A:
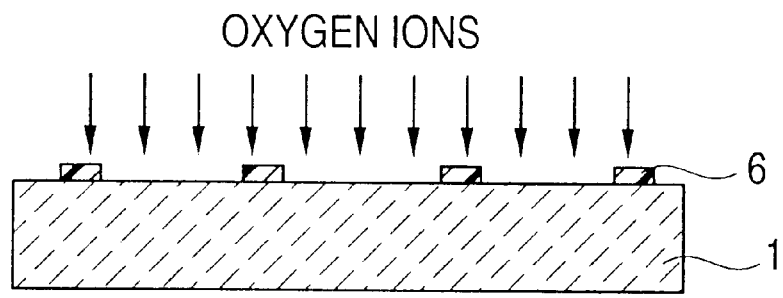
FIGS. 19(a)–19(e) show a method for producing gallium nitride crystals in a nineteenth exemplary embodiment of the present invention.
Figure 19B:
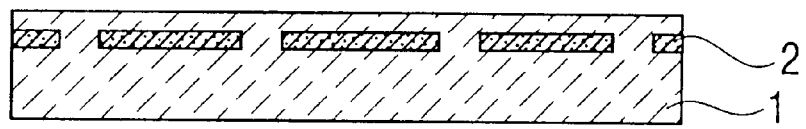
Figure 19C:
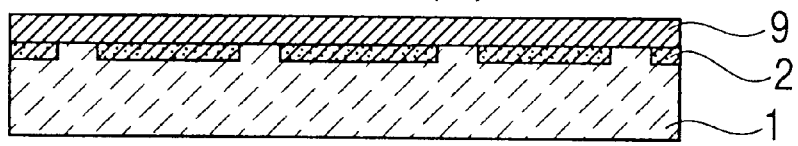
Figure 19D:
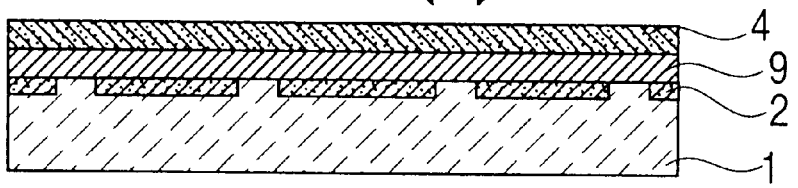
Figure 19E:
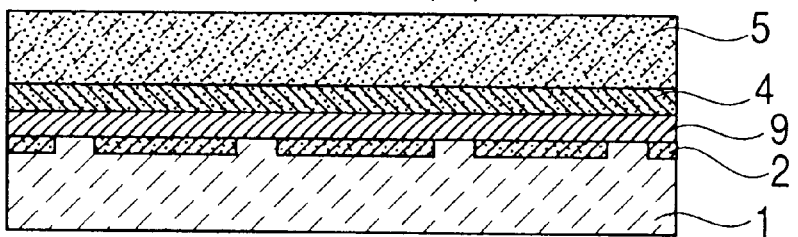

FIGS. 19(*a*)–19(*e*) show a method for producing gallium nitride crystals in a nineteenth exemplary embodiment of the present invention. In FIGS. 19(*a*)–19(*e*), the reference numeral 1 is a silicon substrate, the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a photoresist and the reference numeral 9 is a silicon carbide thin film.

After having a photoresist 6 with a plurality of openings formed on a silicon substrate 1, oxygen ions are implanted on the silicon substrate 1 at an acceleration voltage of 190 keV with a dose of $1.8\times10^8$ $cm^{-2}$. The thickness of the Photoresist 6 is determined so as to prevent the oxygen ions from getting implanted in the silicon substrate underneath the photoresist.

After having the foregoing photoresist 6 eliminated, the foregoing ion implanted silicon substrate 1 is subjected to a heat treatment at 1320° C. and amorphous silicon dioxide 2 is formed in the silicon substrate 1 ranging from about 2100 angstroms to about 5900 angstroms deep from the surface thereof as if the amorphous silicon dioxide is buried inside of the silicon substrate 1. Next, in succession, the silicon substrate 1 is heated to 1300° C. and the surface of the silicon substrate 1 is converted to a silicon carbide thin film 9 of about 2100 angstroms thick by making a methane gas ($CH_4$) react with the surface of the foregoing silicon substrate 1. On the foregoing silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method.

Accordingly, in the present exemplary embodiment, since the amorphous silicon oxide is formed inside of part of the silicon substrate 1 as if the amorphous silicon dioxide is buried therein, the foregoing silicon substrate is converted to a silicon carbide thin film 9 up to about 2100 angstroms from the surface thereof and the silicon carbide thin films formed on the foregoing amorphous silicon dioxide 2 is extremely thin in comparison with the film thickness of the gallium nitride 4 and 5 measuring about 100 microns, the crystal strain energy per one lattice of silicon carbide is extensively larger than that of gallium nitride in the same way as in the seventeenth exemplary embodiment of the present invention when gallium nitride 4 and 5 are formed on the silicon carbide thin film 9, under which the foregoing amorphous silicon dioxide 2 is buried. As a result, it has become possible to have crystal defects such as crystal dislocation and the-like Produced in the silicon carbide thin film 9, thereby improving the crystallization of the gallium nitride 4 and 5. Because of a structure wherein the amorphous silicon dioxide 2 is buried only in part of the silicon substrate 1, the crystallization of the surface of silicon substrate takes over the excellent crystallization of the part where no amorphous silicon dioxide is buried, thereby improving the crystallization of the surface of silicon substrate when compared with the case, wherein amorphous silicon dioxide is formed under a silicon thin film and a silicon substrate is formed thereunder for the entire surface of the silicon substrate as in the seventeenth exemplary embodiment of the present invention. As a result, it becomes possible to improve the crystallization of the silicon carbide thin film 9 formed by converting the foregoing silicon surface and the gallium nitride 4 and 5 formed thereon. Since the lattice mismatch between silicon carbide and gallium nitride is as small as about 3.45%, it becomes possible to reduce the crystal defects in gallium nitride when, compared with the case, wherein gallium nitride is formed on a silicon substrate as in the third exemplary embodiment of the present invention, by forming the gallium nitride thick film crystals 4 an 5 on the foregoing silicon carbide thin film 9. Further, after the amorphous gallium nitride 4 has been formed, by having the single crystal gallium nitride 5 formed at a higher temperature than the temperature at which the foregoing amorphous gallium nitride 4 was formed and having the gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon carbide thin film 9 and the gallium nitride 4 and 5 and improve the crystallization of the gallium nitride 5.

Figure 20A:
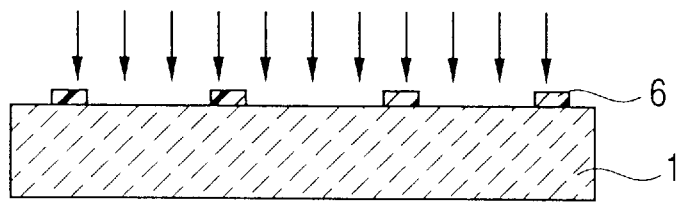
FIGS. 20(a)–20(f) show a method for producing gallium nitride crystals in a twentieth exemplary embodiment of the present invention.
Figure 20B:
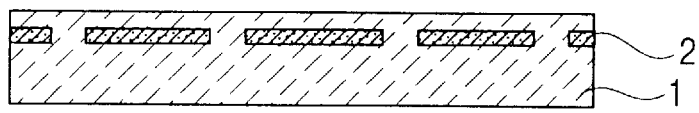
Figure 20C:
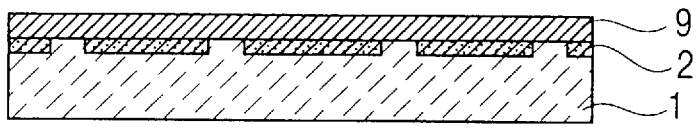
Figure 20D:
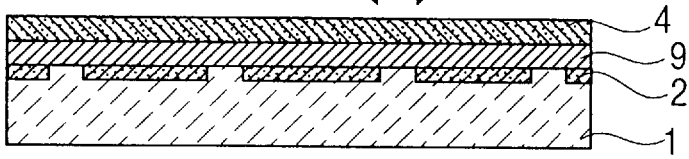
Figure 20E:
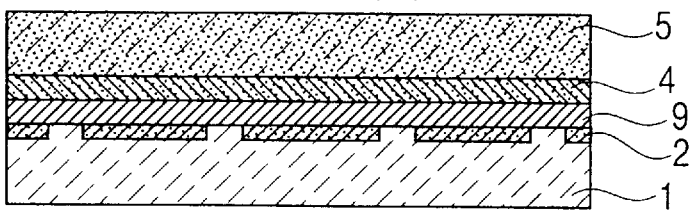
Figure 20F:
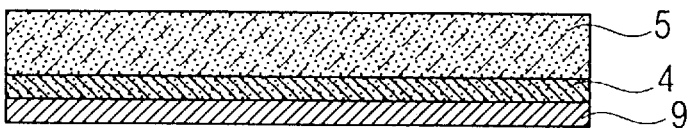

FIGS. 20(*a*)–20(*f*) show a method or producing gallium nitride crystals in a twentieth exemplary embodiment of the present invention. In FIGS. 20(*a*)–20(*f*), the reference numeral 1 is a silicon substrate, the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a photoresist and the reference numeral 9 is a silicon carbide thin film.

After having a photoresist 6 with a plurality of openings formed on a silicon substrate 1, oxygen ions are implanted on the foregoing silicon substrate I at an acceleration voltage of 190 keV with a dose of 1.8×10 cm. The thickness of the photoresist is determined so as to prevent the oxygen ions from getting implanted in the silicon substrate underneath the photoresist. After having the foregoing photoresist 6 eliminated, the foregoing ion implanted silicon substrate is subjected to a heat treatment at 1320° C. and amorphous silicon dioxide is formed in the silicon substrate 1 ranging from about 2100 angstroms to about 5900 angstroms deep from the surface thereof as if he amorphous silicon dioxide is buried inside of the silicon substrate 1. Next, in succession, the silicon substrate 1 is heated to 1300° C. and the surface of the silicon substrate 1 is converted to a silicon carbide thin film 9 of about 2100 angstroms thick by making a methane gas ($CH_4$) react with the surface of the foregoing silicon substrate 1. On the foregoing silicon carbide thin film 9 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the foregoing silicon substrate are immersed in nitrate fluoride ($HF:NHO_3=1:5$), for example, to eliminate the silicon substrate 1 and amorphous silicon dioxide 2.

Accordingly, in the present exemplary embodiment, after having finished with the steps of the nineteenth exemplary embodiment of the present invention, the silicon substrate 1 and silicon dioxide 2 are eliminated, thereby making it possible to improve the crystallization of the gallium nitride 4 and 5 in the same way as the nineteenth exemplary embodiment of the present invention. When a pn junction structure of gallium nitride base semiconductor laser and light emitting diode is formed on the gallium nitride 5, each respective electrode can be formed on the gallium nitride and silicon carbide thin film since the foregoing silicon substrate 1 and silicon dioxide 2, are eliminated, thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used, thereby making it possible to make higher power transistors operative.

Figure 21A:
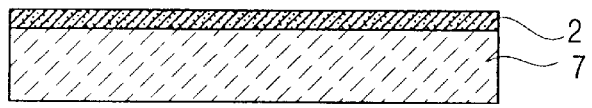
FIGS. 21(a)–21(h) show a method for producing gallium nitride crystals in a twenty-first exemplary embodiment of the present invention.
Figure 21B:
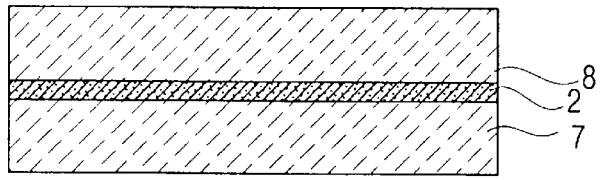
Figure 21C:
Figure 21D:
Figure 21E:
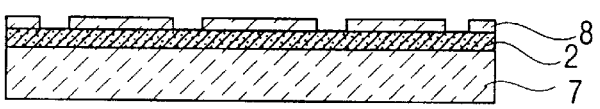
Figure 21F:
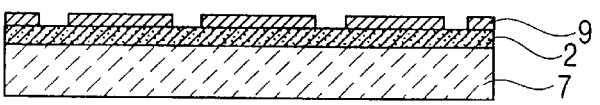
Figure 21G:
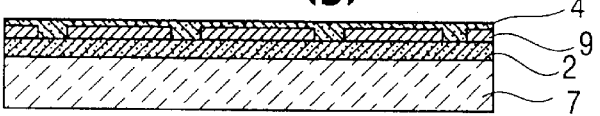
Figure 21H:
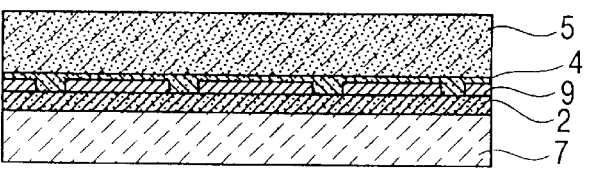

FIGS. 21(*a*)–21(*h*) show a method for producing gallium nitride crystals in a twenty-first exemplary embodiment of the present invention. In FIGS. 21(*a*)–21(*h*), the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a photoresist, the reference numeral 7 is a silicon substrate, the reference numeral 8 is a silicon substrate and the reference numeral 9 is a silicon carbide thin film.

Amorphous silicon dioxide 2 is formed on a silicon substrate 7 to a thickness of about 4000 angstroms by heating the silicon substrate 7 to 1000° C. in an atmosphere of oxygen. The foregoing amorphous silicon dioxide 2 with a silicon substrate 8 brought into intimate contact therewith is heated to 1000° C., thereby combining the foregoing amorphous silicon dioxide 2 with the bottom surface of silicon substrate 8. Then, the foregoing silicon substrate is eliminated progressively starting from the surface thereof that is not in contact with the amorphous silicon dioxide 2 until the silicon substrate becomes a thin film of about 2000 angstroms thick. After having a photoresist 6 with a plurality of opening performed on the surface of the foregoing silicon substrate 8, the silicon substrate 8 beneath the openings of the foregoing photoresist 6 is eliminated by. Exposing the foregoing silicon substrate to $Cl_2$ gas plasma, for example, and then the photoresist 6 is eliminated. Next, in succession, the silicon substrate 8 is heated to 1300° C. and the surface of silicon substrate 8 is converted to a silicon carbide thin film 9 of about 2000 angstroms thick by making a methane gas ($CH_4$) react with the foregoing silicon substrate 8. On the foregoing silicon carbide thin film 9 and the amorphous silicon dioxide 2 of the foregoing openings with the substrate temperature adjusted to 600° C., for example, amorphous gallium nitride 4 is formed to a thickness of about 500 angstroms by means of-a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method.

Accordingly, in the Present exemplary embodiment, since the silicon oxide 2 is formed all over the surface of silicon substrate 7, the silicon carbide thin film 9 is formed on the foregoing amorphous silicon dioxide 2 in a shape having a plurality of openings and the foregoing silicon carbide thin film 9 is as extremely thin as about 2000 angstroms, the crystal strain energy per one lattice of silicon carbide is extensively larger than that of gallium nitride in the same way as in the seventeenth exemplary embodiment of the present invention when gallium nitride 4 and 5 is formed on the surface of the foregoing silicon carbide thin film 9. As a result, it has become possible to have crystal defects such as crystal dislocation and the like produced on the silicon carbide thin film 9, thereby improving the crystallization of the gallium nitride 4 and 5. Further, by having the gallium nitride 4 an 5 formed on the steps created by the partially formed silicon carbide thin film 9, a stress caused by the difference in lattice constant between silicon carbide and gallium nitride is relieved at the place where the foregoing steps are located, thereby enabling the improvement in crystallization of the gallium nitride formed thereon. Since the lattice mismatch between silicon carbide and gallium nitride is as small as about 3.45%, it becomes possible to reduce the crystal defects in gallium nitride when compared with the case, wherein gallium nitride is formed on a silicon substrate as in the fifth exemplary embodiment of the present invention, by forming the gallium nitride thick film crystals 4 and 5 on the foregoing silicon carbide thin film 9. Further, after the amorphous gallium nitride 4 has been formed, by having the single crystal gallium nitride 5 formed at a higher temperature than the temperature at which the foregoing amorphous gallium nitride 4 was formed and having the gallium nitride 4 that is inferior to the gallium nitride 5 in crystallization formed so that the gallium nitride 4 may be placed by insertion underneath the gallium nitride 5. It becomes possible to mitigate the lattice mismatch between the underneath silicon carbide thin film 9 and the gallium nitride 4 and 5 and improve the crystallization of the gallium nitride 5.

Figure 22A:
FIGS. 22(a)–22(i) show a method for producing gallium nitride crystals in a twenty-second exemplary embodiment of the present invention.
Figure 22B:
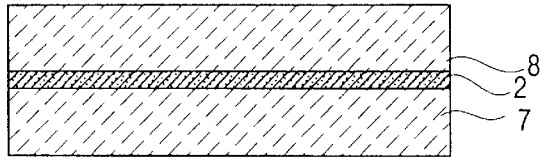
Figure 22C:
Figure 22D:
Figure 22E:
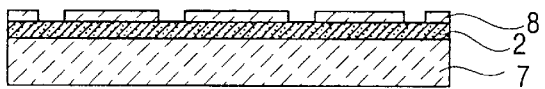
Figure 22F:
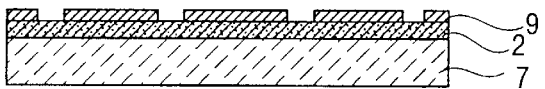
Figure 22G:
Figure 22H:
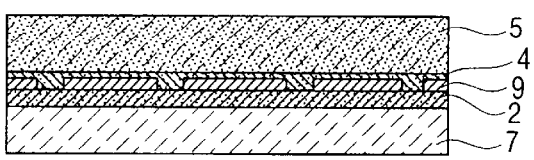
Figure 22I:

FIGS. 22(a)–22(i) show a method for producing gallium nitride crystals in a twenty-second exemplary embodiment of the present invention. In FIGS. 22(a)–22(i), the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a photoresist, the reference numeral 7 is a silicon substrate, the reference numeral 8 is a silicon substrate and the reference numeral 9 is a silicon carbide thin film.

Amorphous silicon dioxide 2 is formed on a silicon substrate 7 to a thickness of about 4000 angstroms by heating the silicon substrate 7 to 1000° C. in an atmosphere of oxygen. The foregoing amorphous silicon dioxide 2 with a silicon substrate 8 brought into intimate contact therewith is heated to 1000° C., thereby combining the foregoing amorphous silicon dioxide 2 with the bottom surface of silicon substrate 8. Then, the foregoing silicon substrate is eliminated progressively starting from the surface thereof that is not in contact with the amorphous silicon dioxide 2 until the silicon substrate becomes a thin film of about 2000 angstroms thick. After having a photoresist 6 with a plurality of openings formed on the surface of the foregoing silicon substrate 8, the silicon substrate 8 beneath the openings of the foregoing photoresist 6 is eliminated by exposing the foregoing silicon substrate to $Cl_2$ gas plasma, for example, and then the photoresist is eliminated. Next, in succession, the silicon substrate 8 is heated to 1300° C. and the silicon substrate 8 is converted to a silicon carbide thin film 9 of about 2100 angstroms thick by making a methane gas ($CH_4$) react with the foregoing silicon substrate 8. On the foregoing silicon carbide thin film 9 and amorphous silicon dioxide 2 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the foregoing silicon substrate are immersed in nitrate fluoride ($HF:NHO_3=1:5$), for example, to eliminate the silicon substrate 7, amorphous silicon dioxide 2 and silicon substrate 8.

Accordingly, in the present exemplary embodiment, after having finished with the steps of the twenty-first exemplary embodiment of the present invention, the foregoing silicon substrates 7 and 8 and silicon dioxide 2 are eliminated, thereby making it possible to improve the crystallization of the gallium nitride 4 and 5 in the same way as the twenty-first exemplary embodiment of the present invention. When a pn junction structure of gallium nitride base semiconductor laser and light emitting diode is formed on the gallium nitride 5, each respective electrode can be formed on the gallium nitride and silicon carbide thin film since the foregoing silicon substrates 7 and 8 and silicon dioxide 2 are eliminated, thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used, thereby making it possible to make higher power transistors operative.

Figure 23A:
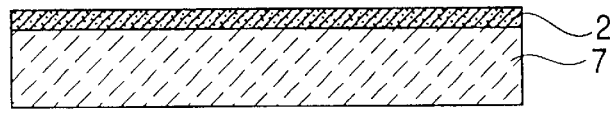
FIGS. 23(a)–23(h) show a method for producing gallium nitride crystals in a twenty-third exemplary embodiment of the present invention.
Figure 23B:
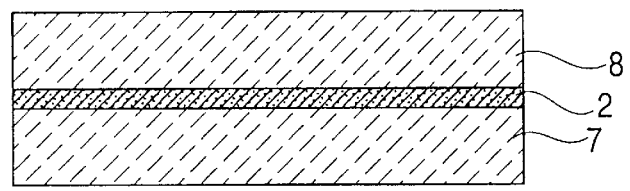
Figure 23C:
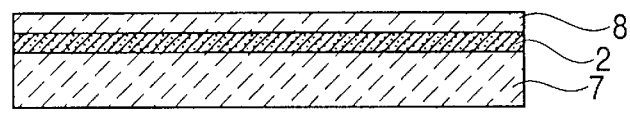
Figure 23D:
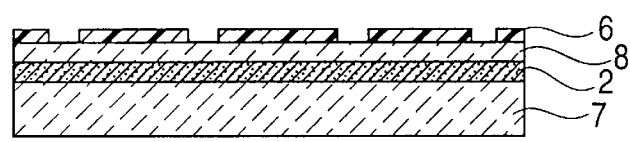
Figure 23E:
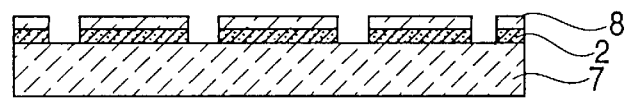
Figure 23F:
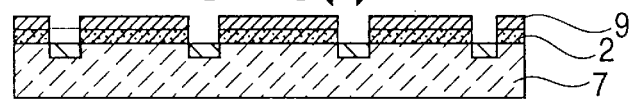
Figure 23G:
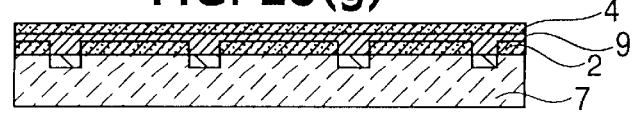
Figure 23H:
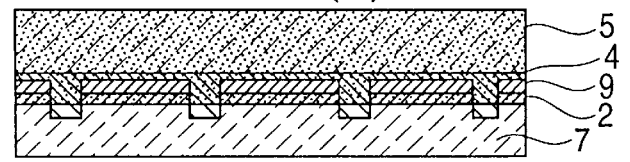

FIGS. 23(a)–23(h) show a method for producing gallium nitrite crystals in a twenty-third exemplary embodiment of the present invention. In FIGS. 23(a)–23(h), the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a photoresist, the reference numeral 7 is a silicon substrate, the reference numeral 8 is a silicon substrate and the reference numeral 9 is a silicon carbide thin film.

Amorphous silicon dioxide 2 is formed on a silicon substrate 7 to a thickness of about 4000 angstroms by heating the silicon substrate 7 to 1000° C. in an atmosphere of oxygen. The foregoing amorphous silicon dioxide 2 with a silicon substrate 8 brought into intimate contact therewith is heated to 1000° C., thereby combining the foregoing amorphous silicon dioxide 2 with the bottom surface of silicon substrate 8. Then, the foregoing silicon substrate is eliminated progressively starting from the surface thereof that is not in contact with the amorphous silicon dioxide 2 until the silicon substrate becomes a thin film of about 2000 angstroms thick. After having a photoresist 6 with a plurality of openings formed on the surface of the foregoing silicon substrate 8, the silicon substrate 8 beneath the openings of the foregoing photoresist 6 is eliminated by exposing the foregoing silicon substrate to C12 gas plasma, for example, and further the amorphous silicon dioxide 2 beneath the openings of the foregoing photoresist 6 is eliminated by means of reactive ion etching in a gas of CHF31 for example, and then the photoresist 6 is eliminated. Next, in succession, the silicon substrate 8 is heated to 1300° C. and the surfaces of the silicon substrate 8 and silicon substrate 7 of the foregoing openings are converted to a silicon carbide thin file 9 of about 2000 angstroms thick by making a methane gas ($CH_4$) react with the surfaces of the foregoing silicon substrate 8 and the silicon substrate 7 of the foregoing openings. On the foregoing, silicon carbide thin film, with the substrate temperature adjusted to 600° C., for example, amorphous gallium nitride 4 is formed to a thickness of about 500 angstroms by means of a halide VPE method whereby reaction is caused to occur between gallium chloride Produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method.

Accordingly, in the present exemplary embodiment, since the foregoing amorphous silicon oxide 2 and silicon substrate 8 are formed on the silicon substrate 7 in a shape having a plurality of openings and then a silicon carbide thin film 9 is formed thereon and also the silicon substrate of the foregoing openings is converted to a silicon carbide thin film with the foregoing silicon carbide thin film 9 showing a film thickness of as extremely thin as about 2000 angstroms, the crystal strain energy per one lattice of silicon carbide is-extensively larger than that of gallium nitride in the same way as in the seventeenth exemplary embodiment of the present invention when gallium nitride 4 and 5 is formed on the surface of the foregoing silicon carbide thin film 9. As a result, it has become possible to have crystal defects such as crystal dislocation and the like produced on the silicon carbide thin film 9, thereby improving the crystallization of the gallium nitride 4 and 5. Further, by having the gallium nitride 4 an 5 formed on the steps created by the partially formed silicon carbide thin film 9 and amorphous silicon dioxide 2, a stress caused by the difference in lattice constant between silicon carbide and gallium nitride is relieved at the place where the foregoing steps are located, thereby enabling the improvement in crystallization of the gallium nitride formed thereon. Because the foregoing gallium nitride 4 and 5 is formed on the silicon carbide thin film 9 and carries without fail the lattice information of the underneath silicon carbide, it becomes easy for single crystals to be formed when compared with the case, wherein the gallium nitride 4 and 5 is Partially formed on the surface of silicon dioxide thin film 2 as in the twenty-first exemplary embodiment of the Present invention. As a result, it becomes possible for the crystallization of gallium nitride 4 and 5 to be improved when compared with the twenty-first exemplary embodiment of the present invention. Since the lattice mismatch between silicon carbide and gallium nitride is as small as about 3.45%, it becomes possible to reduce the crystal defects in gallium nitride when compared with the case, wherein gallium nitride is formed on a silicon substrate as in the fifth exemplary embodiment of the present invention, by forming the gallium nitride 4 and 5 on the foregoing silicon carbide thin film 9. Further, after the amorphous gallium nitride 4 has been formed, by having the single crystal gallium nitride 5 formed at a higher temperature than the temperature at which the amorphous gallium nitride 4 was formed and having the foregoing gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon carbide 9 and the gallium nitride 4 and 5 and improve the crystallization of the gallium nitride 5.

Figure 24A:
FIGS. 24(a)–24(i) show a method for producing gallium nitride crystals in a twenty-fourth exemplary embodiment of the present invention.
Figure 24B:
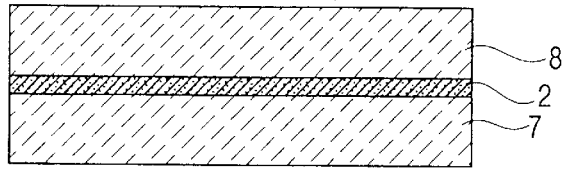
Figure 24C:
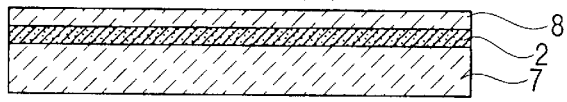
Figure 24D:
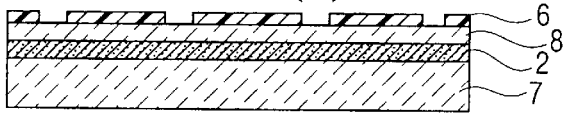
Figure 24E:
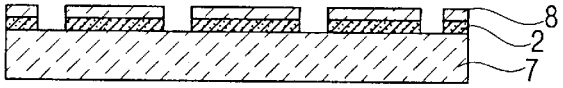
Figure 24F:
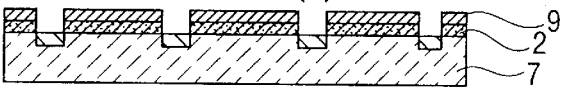
Figure 24G:
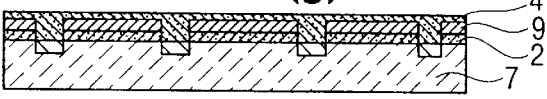
Figure 24H:
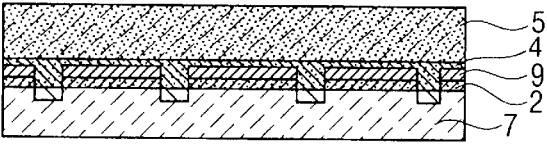
Figure 24I:
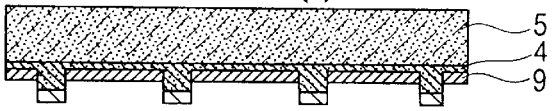

FIGS. 24(*a*)–24(*i*) show a method for producing gallium nitride crystals in a twenty-fourth exemplary embodiment of the present invention. In FIGS. 24(*a*)–24(*i*), the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a Photoresist, the reference numeral 7 is a silicon substrate, the reference numeral 8 is a silicon substrate and the reference numeral 9 is a silicon carbide thin film.

Amorphous silicon dioxide 2 is formed on a silicon substrate 7 to a thickness of about 4000 angstroms by heating the silicon substrate 7 to 1000° C. in an atmosphere of oxygen. The foregoing amorphous silicon dioxide 2 with a silicon substrate 8 brought into intimate contact therewith is heated to 1000° C., thereby combining the foregoing amorphous silicon dioxide 2 with the bottom surface of the silicon substrate 8. Then, the foregoing silicon substrate 8 is eliminated progressively starting from the surface thereof that is not in contact with the amorphous silicon dioxide 2 until the silicon substrate becomes a thin film of about 2000 angstroms thick. After having a photoresist 6 with a plurality of openings formed on the surface of the foregoing silicon substrate 8, the silicon substrate 8 beneath the openings of the foregoing photoresist 6 is eliminated by exposing the foregoing silicon substrate to $Cl_2$ gas plasma, for example, and further the amorphous silicon dioxide 2 beneath the openings of the foregoing photoresist 6 is eliminated by means of reactive ion etching in a gas of $CHF_3$ for example, and then the photoresist 6 is eliminated. Next, in succession, the silicon substrate 1 is heated to 1300 and the surfaces of the silicon substrate 8 and the silicon substrate 7 of the foregoing openings are converted to a silicon carbide thin film 9 of about 2000 angstroms thick by making a methane gas (CH4) react with the surfaces of the silicon substrate 8 and the silicon substrate 7 of the foregoing openings. On the foregoing silicon carbide thin film 9 with the substrate temperature adjusted to 600° C., for example, amorphous gallium nitride 4-is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the foregoing silicon substrate are immersed in nitrate fluoride ($HF:NHO_3=1:5$), for example, to eliminate the silicon substrate 7, amorphous silicon dioxide 2 and silicon substrate 8.

Accordingly, in the Present exemplary embodiment, after having finished with the steps of the twenty-third exemplary embodiment of the Present invention, the foregoing silicon substrates 7 and 8 and silicon dioxide 2 are eliminated, thereby making it possible to improve the crystallization of the gallium nitride 4 and 5 in the same way as the twenty-third exemplary embodiment of the present invention. When a pn junction structure of gallium nitride base semiconductor laser and light emitting diode is formed on the gallium nitride 5, each respective electrode can be formed on the gallium nitride and silicon carbide thin film since the foregoing silicon substrates 7 and 8 and silicon dioxide 2 are eliminated; thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used, thereby making it possible to make higher power transistors operative.

Figure 25A:
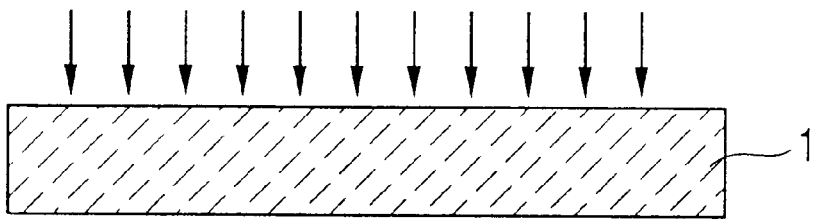
FIGS. 25(a)–25(e) show a method for producing gallium nitride crystals in a twenty-fifth exemplary embodiment of the present invention.
Figure 25B:
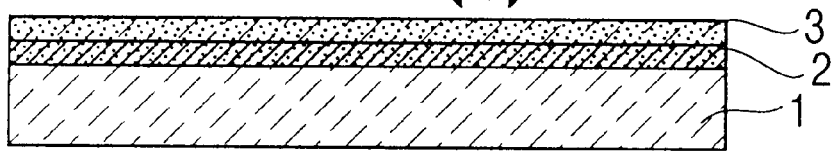
Figure 25C:
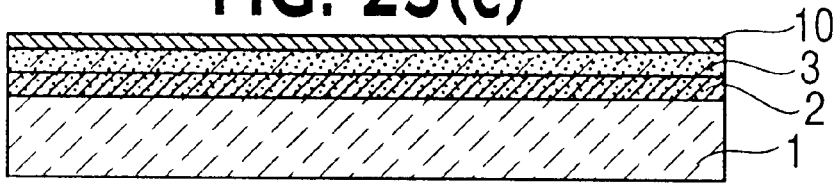
Figure 25D:
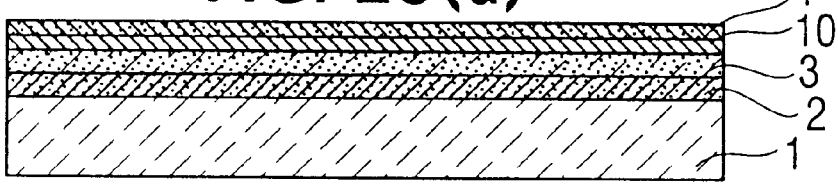
Figure 25E:
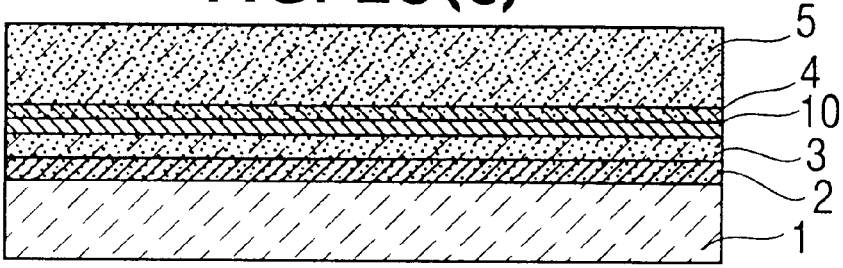

FIGS. 25(*a*)–25(*e*) show a method for producing gallium nitride crystals in a twenty-fifth exemplary embodiment of the present invention. In FIGS. 25(*a*)–25(*e*), the reference numeral 1 is a silicon substrate, the reference numeral 2 is amorphous silicon dioxide, the reference numeral 3 is a single crystal silicon thin film, the reference numeral 4 is first amorphous gallium nitride formed by means of a halide VPE method, the reference numeral 5 is second single crystal gallium nitride formed by means of a halide VPE method and the reference numeral 10 is a zinc oxide thin film.

Oxygen ions are implanted on a silicon substrate I at an 18 -2 acceleration voltage of 190 keV with a dose of $1.8 \times 10^{18}$ cm$^{-2}$. By a heat treatment of the foregoing ion implanted silicon substrate performed at 1320° C., amorphous silicon dioxide 2 is formed on the silicon substrate to a thickness of about 3800 angstroms and further a single crystal silicon thin film 3 is formed thereon to a thickness of about 2100 angstroms. Next, in succession, the silicon substrate 1 is heated to 550° C. and a zinc oxide thin film 10 is formed to a thickness of about 1000 angstroms by sputtering a zinc oxide target in an atmosphere of 0.01 Torr oxygen gas. On the foregoing zinc oxide thin film 10 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C. single crystal gallium nitride 5 is formed on the foregoing amorphous gallium nitride 4 to a thickness of about 100 microns by means of the foregoing halide VPE method.

Accordingly, in the present exemplary embodiment, such crystal defects as crystal dislocation and the like caused by the difference in lattice constant between silicon carbide and gallium nitride can be produced not in the side of gallium nitride but in the side of the zinc oxide thin film 10 and single crystal silicon thin film 3 by having the gallium nitride 4 and formed on the single crystal thin film 3 and zinc oxide thin film 10 that has been formed on the amorphous silicon dioxide 2. Due to the difference in lattice constant between silicon carbide and gallium nitride, the crystal strain energy created at the time of heteroepitaxial growth is stored in the side of silicon, zinc oxide and gallium nitride. In the case as in the present exemplary embodiment, wherein the total film thickness of single crystal silicon thin film 3 and zinc oxide thin film 10 measuring about 3100 angstroms is substantially smaller than the film thickness of the gallium nitride 4 and 5 measuring about 100 microns, the crystal strain energy per one lattice of zinc oxide thin film and silicon thin film is extensively larger than that of gallium nitride. As a result, it has become possible to have crystal defects such as crystal dislocation and the like produced in the side of the zinc oxide thin film 10 and silicon thin film 3, thereby improving the crystallization of the gallium nitride 4 and 5. In addition, oxygen ions are implanted on the silicon substrate 1 at an acceleration voltage of 190 keV with a dose of $1.8 \times 10^{18}$ cm$^{-2}$ and then by a heat treatment of the foregoing ion implanted silicon substrate performed at 1320 "C the amorphous silicon dioxide 2 is formed on the silicon substrate to a thickness of about 3800 angstroms and further the single crystal silicon thin film 3 is formed thereon to a thickness of 2100 angstroms, thereby the silicon thin film formed on the surface of silicon substrate carrying over the lattice information of the silicon substrate surface before the ion implantation. Therefore, it becomes possible to improve the crystallization of the foregoing silicon thin film with a resulting improvement in crystallization of the zinc oxide thin film 10 and gallium nitride 4 and 5 formed on the foregoing silicon thin film when compared with the case, wherein an amorphous silicon dioxide thin film and, in succession, a single crystal silicon thin film are formed continuously on a silicon substrate by such means as a vapor deposition method and the like. Since the lattice constant of zinc oxide is 3.25 angstroms on the hexagonal a axis and the lattice constant of gallium nitride is 3.19 angstroms on the hexagonal a axis resulting in a lattice mismatch of as small as around 1.91%, it becomes possible to reduce the crystal defects in gallium nitride when compared with the case, wherein gallium nitride is formed on a silicon film directly, by having the foregoing zinc oxide thin film 10 formed by insertion between the silicon thin film 3 and the gallium nitride thick film crystals 4 and 5. Further, after the amorphous gallium nitride 4 has been formed, by having the single crystal gallium nitride 5 formed at a higher temperature than the temperature at which the amorphous gallium nitride 4 was formed and having the gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon thin film 3 and zinc oxide thin film 10 and the gallium nitride 4 and 5 and improve the crystallization of the gallium nitride 5.

Figure 26A:
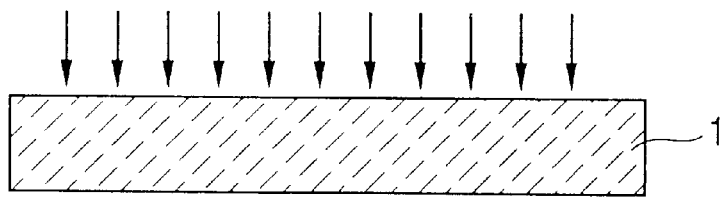
FIGS. 26(a)–26(f) show a method for producing gallium nitride crystals in a twenty-sixth exemplary embodiment of the present invention.
Figure 26B:
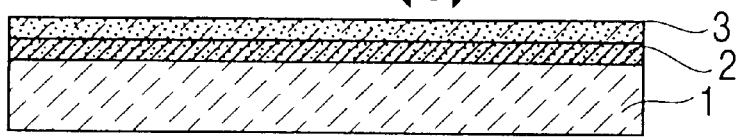
Figure 26C:
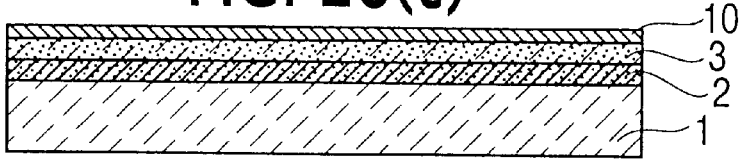
Figure 26D:
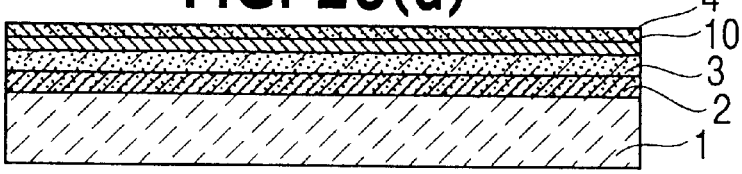
Figure 26E:
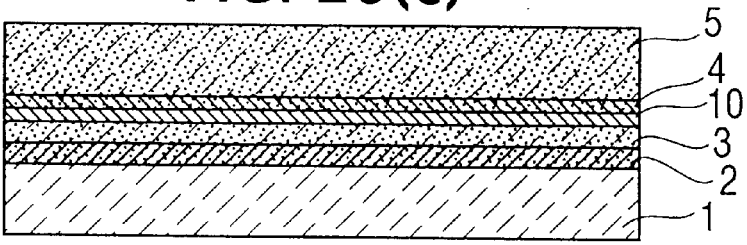
Figure 26F:

FIGS. 26(*a*)–26(*f*) show a method for producing gallium nitride crystals in a twenty-sixth exemplary embodiment of the present invention. In FIGS. 26(*a*)–26(*f*), the reference numeral 1 is a silicon (111) substrate, the reference numeral 2 is amorphous silicon dioxide, the reference numeral 3 is a single crystal silicon thin film, the reference numeral 4 is amorphous gallium nitride formed by means of a halide VPE method, the reference numeral 5 is single crystal gallium nitride formed by means of a halide VPE method and the reference numeral 10 is a zinc oxide thin film.

Oxygen ions are implanted on a silicon substrate 1 at an acceleration voltage of 190 keV with a dose of $1.8 \times 10$ cm$^{-2}$. By a heat treatment of the foregoing ion implanted silicon substrate performed at 1320° C., amorphous silicon dioxide 2 is formed on the silicon substrate to a thickness of about 3800 angstroms and further a single crystal silicon thin film 3 is formed thereon to a thickness of about 2100 angstroms. Next, in succession, the silicon substrate 1 is heated to 550° C. and a zinc oxide thin film 10 is formed to a thickness of about 1000 angstroms by sputtering a zinc oxide target in an atmosphere of 0.01 Torr oxygen gas. On the foregoing zinc oxide thin film 10 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the foregoing silicon substrate are immersed in nitrate fluoride (HF:NHO$_3$=1:5), for example, to eliminate the silicon substrate 1, amorphous silicon dioxide 2 and single crystal silicon thin film 3, and further immersed in aqua regia (HCl:HNO$_3$=3:1), for example, to eliminate the zinc oxide thin film 10.

Accordingly, in the present exemplary embodiment, after having finished with the steps of the twenty-fifth exemplary embodiment of the present invention, the foregoing silicon substrate 1, silicon dioxide 2, silicon thin film 3 and zinc oxide thin film 10 are eliminated, thereby making it possible to improve the crystallization of the gallium nitride 4 and 5 in the same way as the twenty-fifth exemplary embodiment of the present invention. When a pn junction structure of gallium nitride base semiconductor laser and light emitting diode is formed on the gallium nitride 5, each respective electrode can be formed on both surfaces of the gallium nitride since the foregoing silicon substrate 1, silicon dioxide 2, silicon thin film 3 and zinc oxide thin film 10 are eliminated, thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior-art sapphire substrate was-used, thereby making it possible to make higher power transistors operative.

Figure 27A:
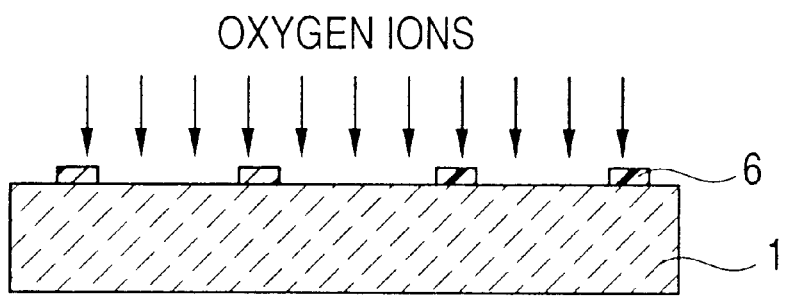
FIGS. 27(a)–27(e) show a method for producing gallium nitride crystals in a twenty-seventh exemplary embodiment of the present invention.
Figure 27B:
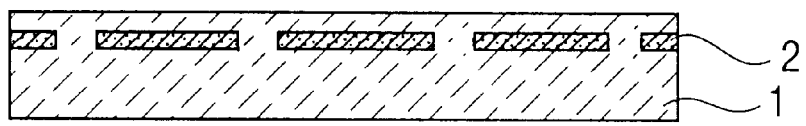
Figure 27C:
Figure 27D:
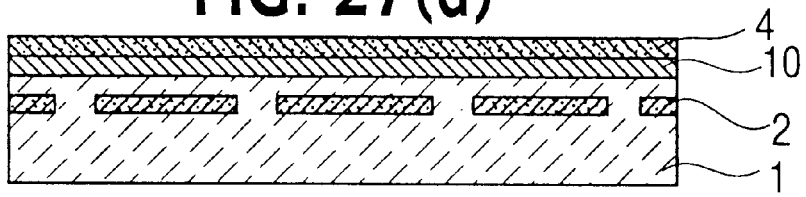
Figure 27E:
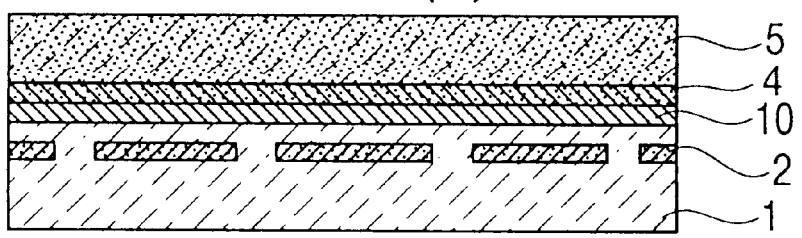

FIGS. 27(a)–27(e) show a method for producing gallium nitride crystals in a twenty-seventh exemplary embodiment of the present invention. In FIGS. 27(a)–27(e), the reference numeral 1 is a silicon substrate, the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a photoresist and the reference numeral 10 is a zinc oxide thin film.

After having a photoresist 6,with a plurality of openings formed on a-silicon substrate 1, oxygen ions are implanted on the foregoing silicon substrate 1 at an acceleration voltage of 190 keV with a dose of $1.8 \times 10^{18}$ cm$^{-2}$. The thickness of the photoresist 6 is determined so as to prevent the oxygen ions from getting implanted in the silicon substrate underneath the photoresist. After having the foregoing photoresist 6 eliminated, the foregoing ion implanted silicon substrate is subjected to a heat treatment at 1320° C. and amorphous silicon dioxide is formed in the silicon substrate ranging from about 2100 angstroms to about 5900 angstroms deep from the surface thereof as if the amorphous silicon dioxide is buried inside of the silicon substrate. Next, in succession, the silicon substrate 1 is heated to 550° C. and a zinc oxide thin film 10 is formed to a thickness of about 1000 angstroms by sputtering a zinc oxide target in an atmosphere of 0.01 Torr oxygen gas. On the foregoing zinc oxide thin film 10 with the substrate temperature adjusted to 600° C. for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted 1000° C., single crystal gallium nitride 5 is formed on the foregoing amorphous gallium nitride 4 to a thickness of about 100 microns by means of the foregoing halide VPE method.

Accordingly, in the present exemplary embodiment, since the amorphous silicon oxide is formed inside of part of the silicon substrate 1 as if it is buried therein, a zinc oxide thin film is formed on the foregoing silicon substrate to a thickness of about 1000 angstroms and also the silicon and zinc oxide thin films formed on the foregoing amorphous silicon dioxide 2 measure about 3100 angstroms in total, being extremely thin in comparison with the film thickness of the gallium nitride 4 and 5 measuring about 100 microns, the crystal strain energy per one lattice of silicon and zinc oxide is extensively larger than that of gallium nitride in the same way as in the twenty-fifth exemplary embodiment of the present invention when a zinc oxide thin film 10 and, in succession, gallium nitride 4 and 5 are formed on the surface of silicon, under which the foregoing amorphous silicon dioxide 2 is buried. As a result, it has become possible to have crystal defects such as crystal dislocation and the like produced on the surface of silicon substrate 1 and the zinc oxide thin film 10, thereby improving the crystallization of the gallium nitride 4 and 5. Because of a structure wherein the amorphous silicon dioxide 2 is buried only in part of the silicon substrate 1, the crystallization of the surface of silicon substrate takes over the excellent crystallization of the part where no amorphous silicon dioxide is buried, thereby improving the crystallization of the silicon underneath the zinc oxide thin film when compared with the case, wherein amorphous silicon dioxide is formed under a silicon thin film and a silicon substrate is formed thereunder for the entire surface of the silicon substrate as in the twenty-fifth exemplary embodiment of the present invention. As a result, it becomes possible to improve the crystallization of the zinc oxide thin film 10 formed on the foregoing silicon and the gallium nitride 4 and 5 formed thereon. Since the lattice mismatch between zinc oxide and gallium nitride is as small as about 1.91%, it becomes possible to reduce the crystal defects in gallium nitride when compared with the case, wherein gallium nitride is formed on a silicon substrate as in the third exemplary embodiment of the present invention, by forming the foregoing zinc oxide 10 so as to have it inserted between the silicon substrate 1 and the gallium nitride thick film crystals 4 an 5. Further, after the amorphous gallium nitride 4 has been formed, by having the single crystal gallium nitride 5 formed at a higher temperature than the temperature at which the amorphous gallium nitride 4 was formed and having the gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon substrate I and zinc oxide thin film 10 and the gallium nitride 4 and 5 and improve the crystallization of the gallium nitride 5.

Figure 28A:
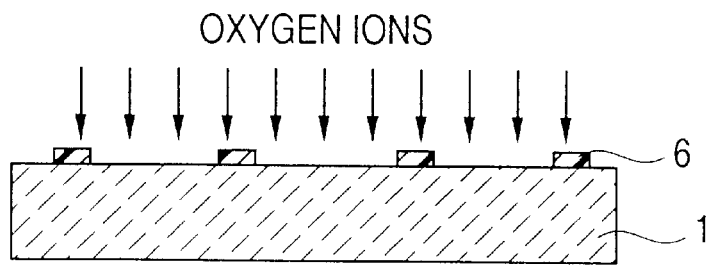
FIGS. 28(a)–28(f) show a method for producing gallium nitride crystals in a twenty-eighth exemplary embodiment of the present invention.
Figure 28B:
Figure 28C:
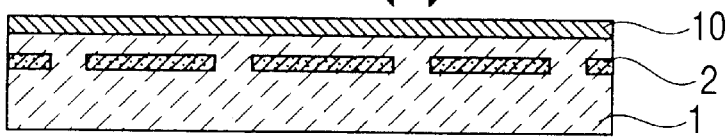
Figure 28D:
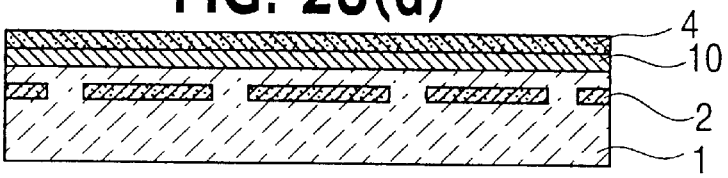
Figure 28E:
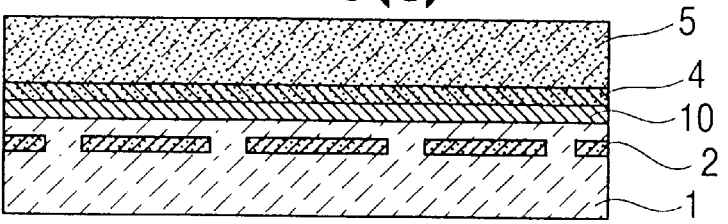
Figure 28F:
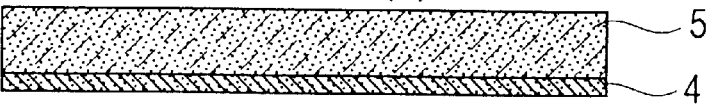

FIGS. 28(a)–28(f) show a method for producing gallium nitride crystals in a twenty-eighth exemplary embodiment of the present invention. In FIGS. 28(a)–28(f), the reference numeral 1 is a silicon substrate, the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a photoresist and the reference numeral 10 is a zinc oxide thin film.

After having a photoresist 6 with a plurality of openings formed on a silicon substrate 1, oxygen ions are implanted on the silicon substrate 1 at an acceleration voltage of 190 keV with a dose of $1.8 \times 10^{18}$ $cm^{-2}$. The thickness of the photoresist 6 is determined so as to prevent the oxygen ions from getting implanted in the silicon substrate underneath the photoresist. After having the foregoing photoresist 6 eliminated, the foregoing ion implanted silicon substrate is subjected to a heat treatment at 1320° C. and amorphous silicon dioxide is formed in the silicon substrate 1 ranging from about 2100 angstroms to about 5900 angstroms deep from the surface thereof as if it is buried inside of the silicon substrate 1. Next, in succession, the silicon substrate 1 is heated to 550° C. and a zinc oxide thin film 10 is formed to a thickness of about 1000 angstroms by sputtering a zinc oxide target in an atmosphere of 0.01 Torr oxygen gas. On the foregoing zinc oxide thin film 10 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the foregoing silicon substrate are immersed in nitrate fluoride ($HF:NH0_3=1:5$), for example, to eliminate the silicon substrate I and amorphous silicon dioxide 2, and further immersed in aqua regia ($HCl:HNO_3=3:1$), for example, to eliminate the zinc oxide thin film 10.

Accordingly, in the present exemplary embodiment, after having finished with the steps of the twenty-seventh exemplary embodiment of the present invention, the foregoing silicon substrate 1, silicon dioxide 2, and zinc oxide thin film 10 are eliminated, thereby making it possible to improve the crystallization of the gallium nitride 4 and 5 in the same way as the twenty-seventh exemplary embodiment of the present invention. When a pn junction structure of gallium nitride base semiconductor laser and light emitting diode is formed on the gallium nitride 5, each respective electrode can be formed on both surfaces of the gallium nitride since the foregoing silicon substrate 1, silicon dioxide 2, and zinc oxide thin film 10 are eliminated, thereby enabling the simplification in production process of devices when compared with the case, wherein sapphire is used as the substrate, and further because of a reduction made possible in series resistance it becomes Possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used as the substrate, thereby making it possible to make higher power transistors operative.

Figure 29A:
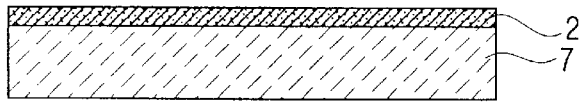
FIGS. 29(a)–29(h) show a method for producing gallium nitride crystals in a twenty-ninth exemplary embodiment of the present invention.
Figure 29B:
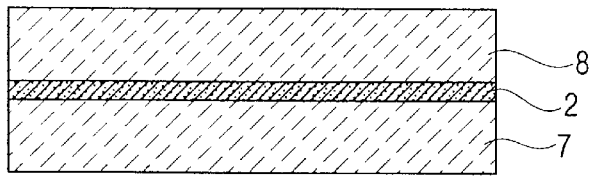
Figure 29C:
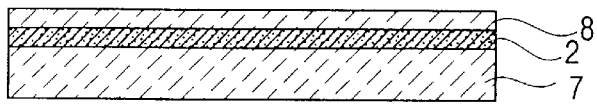
Figure 29D:
Figure 29E:
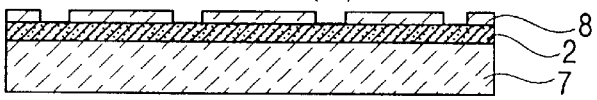
Figure 29F:
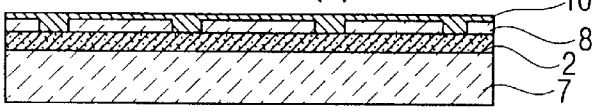
Figure 29G:
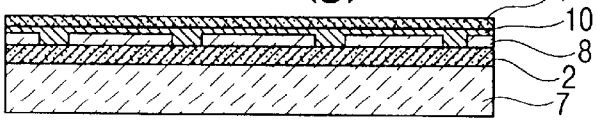
Figure 29H:
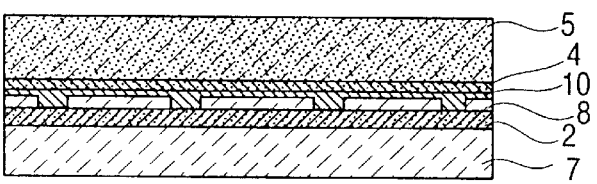

FIGS. 29(*a*)–29(*h*) show a method for producing gallium nitride crystals in a twenty-ninth exemplary embodiment of the present invention. In FIGS. 29(*a*)–29(*h*), the reference numeral 2 is amorphous silicon dioxide, the reference numeral 4 is first amorphous gallium nitride formed by means of a halide VPE method, the reference numeral 5 is second single crystal gallium nitride formed by means of a halide VPE method, the reference numeral 6 is a photoresist, the reference numeral 7 is a silicon substrate, the reference numeral 8 is a silicon substrate and the reference numeral 10 is a zinc oxide thin film.

Amorphous silicon dioxide 2 is formed on a silicon substrate 7 to a thickness of about 4000 angstroms by heating the silicon substrate-7 to 1000° C. in an atmosphere of oxygen. The foregoing amorphous silicon dioxide 2 with a silicon substrate 8 brought into intimate contact therewith is heated to 1000° C., thereby combining the foregoing amorphous silicon dioxide 2 with the bottom surface of the silicon substrate 8. Then, the foregoing silicon substrate 8 is eliminated progressively starting from the surface thereof that is not in contact with the amorphous silicon dioxide 2 until the silicon substrate becomes a thin film of about 2000 angstrom thick. After having a photoresist 6 with a Plurality of openings formed on the surface of the-foregoing silicon substrate 8, the silicon substrate 8 be the openings of the foregoing Photoresist 6 is eliminated by exposing the foregoing silicon substrate to C12 gas plasma, for example, and then the Photoresist 6 is eliminated. Next, in succession, the silicon substrate 8 is heated to 550° C. and a zinc oxide thin film 10 is formed to a thickness of about 1000 angstroms by sputtering a zinc oxide target in an atmosphere of 0.01 Torr oxygen gas. On the foregoing zinc oxide thin film 10 with the substrate temperature adjusted to 600° C., for example, amorphous gallium nitride 4 is formed to a thickness of about 500 angstroms by means of a halide VPE method whereby reaction is caused to occur between gallium chloride Produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method.

Accordingly, in the present exemplary embodiment, since the amorphous silicon oxide 2 is formed all over the surface of silicon substrate 7, the silicon substrate 8 is formed on the foregoing amorphous silicon dioxide 2 in a shape having a plurality of openings and the zinc oxide thin film 10 is formed on the foregoing silicon substrate 8 and on the amorphous silicon dioxide 2 on the openings of the foregoing silicon substrate 8, making the total thickness of the foregoing silicon substrate 8 and zinc oxide thin film 10 as extremely thin as about 3000 angstroms, the crystal 8-train energy Per one lattice of silicon and zinc oxide is extensively larger than that of gallium nitride in the same way as in the twenty-fifth exemplary embodiment of the present invention when gallium nitride 4 and 5 is formed on the foregoing zinc oxide thin film 10. As a result, it has become possible to have crystal defects such as crystal dislocation and the like produced on the silicon substrate 8 and zinc oxide thin film 10, thereby improving the crystallization of the gallium nitride 4 and 5. Further, by having the zinc oxide thin film 10 and gallium nitride 4 an 5 formed on the steps created by the partially for silicon substrate 8, a stress caused by the difference in lattice constant between silicon and gallium nitride is relieved at the place where the foregoing steps are located, thereby enabling the improvement in crystallization of the gallium nitride formed thereon. Since the lattice mismatch between zinc oxide and gallium nitride is as small as about 1.91%, it becomes possible to reduce the crystal defects in gallium nitride when compared with the case, wherein gallium nitride is formed on a silicon substrate directly, by forming the foregoing zinc oxide thin film 10 by insertion between the silicon substrate 1 and the gallium nitride thick film crystals 4 and 5. Further, after the amorphous gallium nitride 4 has been formed, by having the single crystal gallium nitride 5 formed at a higher temperature than the temperature at-which the foregoing amorphous gallium nitride 4 was formed and having the gallium nitride 4 that is inferior to the gallium nitride 5 in crystallization formed so that the gallium nitride 4 may be placed by insertion underneath the gallium nitride 5, it becomes possible to mitigation the lattice mismatch between the underneath silicon substrate and zinc oxide thin film 10 and the gallium nitride 4 and 5 and improve the crystallization of the gallium nitride 5.

Figure 30A:
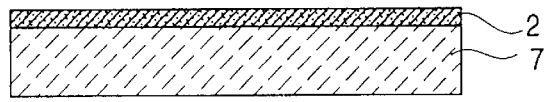
FIGS. 30(a)–30(i) show a method for producing gallium nitride crystals in a thirtieth exemplary embodiment of the present invention.
Figure 30B:
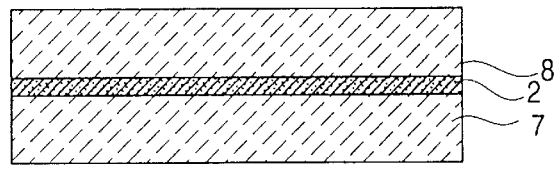
Figure 30C:
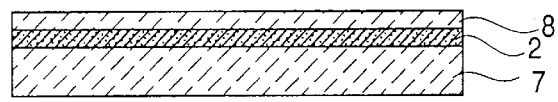
Figure 30D:
Figure 30E:
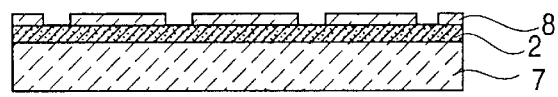
Figure 30F:
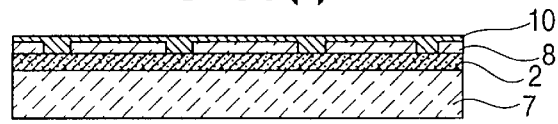
Figure 30G:
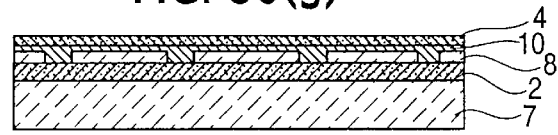
Figure 30H:
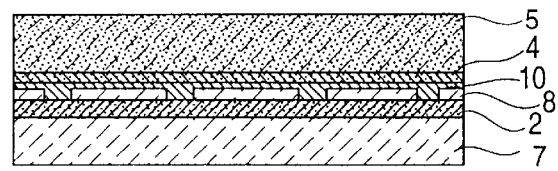
Figure 30I:
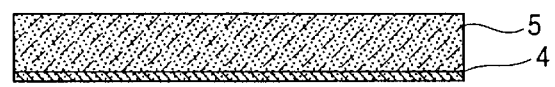

FIGS. 30(*a*)–30(*i*) show a method for producing gallium nitride crystals in a thirtieth exemplary embodiment of the present invention. In FIGS. 30(*a*)–30(*i*), the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a photoresist, the reference numeral 7 is a silicon substrate, the reference numeral 8 is a silicon substrate and the reference numeral 10 is a zinc oxide thin film.

Amorphous silicon dioxide 2 is formed on a silicon substrate 7 to a thickness of about 4000 angstroms by heating the silicon substrate 7 to 1000° C. in an atmosphere of oxygen. The foregoing amorphous silicon dioxide 2 with a silicon substrate 8 brought into intimate contact therewith is heated to 1000° C., thereby combining the foregoing amorphous silicon dioxide 2 with the bottom surface of the silicon substrate 8. Then, the foregoing silicon substrate is eliminated progressively starting from the surface thereof that is not in contact with the amorphous silicon dioxide 2 until the silicon substrate becomes a thin film of about 2000 angstroms thick. After having a photoresist 6 with a plurality of openings formed on the surface of the foregoing silicon substrate 8, the silicon substrate 8 beneath the openings of the foregoing photoresist 6 is eliminated by exposing the foregoing silicon substrate to $Cl_2$ gas plasma, for example, and then the photoresist 6 is eliminated. Next, in succession, the silicon substrate 8 is heated to 550° C. and a zinc oxide thin film 10 is formed to a thickness of about 1000 angstroms by sputtering a zinc oxide target in an atmosphere of 0.01 Torr oxygen gas. On the foregoing zinc oxide thin film 10 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the foregoing silicon substrate are immersed in nitrate fluoride ($HF:NHO_3=1:5$)' for example, to eliminate the silicon substrate 7, amorphous silicon dioxide 2 and silicon substrate 8, and further immersed in aqua regia ($HCl:HNO_3=3:1$), for example, to eliminate the zinc oxide thin film 10.

Accordingly, in the present exemplary embodiment, after having finished with the steps of the twenty-ninth exemplary embodiment of the present invention, the foregoing silicon substrates 7 and 8, silicon dioxide 2 and zinc oxide thin film 10 are eliminated, thereby making it possible to improve the crystallization of the gallium nitride 4 and 5 in the same way as the twenty-ninth exemplary embodiment of the present invention. When a pn junction structure of gallium nitride base semiconductor laser and light emitting diode is formed on the gallium nitride 5, each respective electrode can be formed on both surfaces of the gallium nitride since the foregoing silicon substrates 7 and 8, silicon dioxide 2 and zinc oxide thin film 10 are eliminated, thereby enabling the simplification in production is used as the substrate, and further because of a reduction made possible in series resistance it becomes possible to reduce the operating voltage of semiconductor laser, for example.

The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used, thereby making it possible to make higher power transistors operative.

Figure 31A:
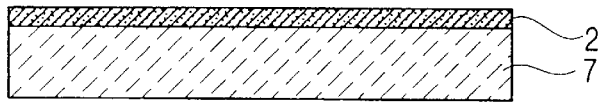
FIGS. 31(a)–31(h) show a method for producing gallium nitride crystals in a thirty-first exemplary embodiment of the present invention.
Figure 31B:
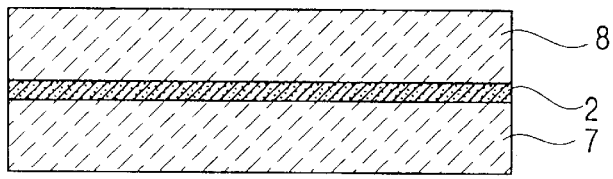
Figure 31C:
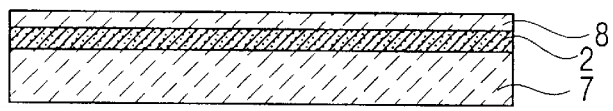
Figure 31D:
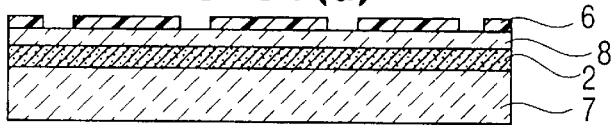
Figure 31E:
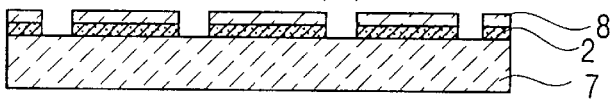
Figure 31F:
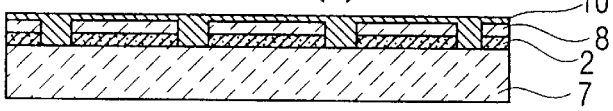
Figure 31G:
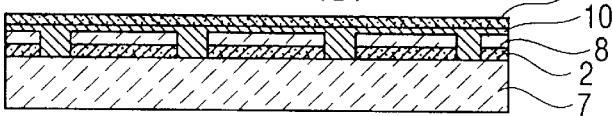
Figure 31H:
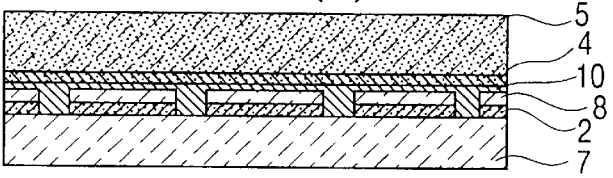

FIGS. 31(*a*)–31(*h*) show a method for producing gallium nitride crystals in a thirty-first exemplary embodiment of the present invention. In FIGS. 31(*a*)–31(*h*), the reference numeral 2 is amorphous silicon dioxide, the reference numeral 4 is amorphous gallium nitride formed by means of a halide VPE method, the reference numeral 5 is single crystal gallium nitride formed by means of a halide VPE method, the reference numeral 6 is a photoresist, the reference numeral 7 is a silicon substrate, the reference numeral 8 is a silicon substrate and the reference numeral 10 is a zinc oxide thin film.

Amorphous silicon dioxide 2 is formed on a silicon substrate 7-to a-thickness of about 4000 angstroms by heating the silicon substrate 7 to 1000° C. in an atmosphere of oxygen. The foregoing amorphous silicon dioxide 2 with a silicon substrate 8 brought into intimate contact therewith is heated to 1000° C., thereby combining the foregoing amorphous silicon dioxide 2 with the bottom surface of the silicon substrate 8. Then, the foregoing silicon substrate 8 is eliminated progressively starting from the surface thereof that is not in contact with the amorphous silicon dioxide 2 until the silicon substrate becomes a thin film of about 2000 angstroms thick. After having a photoresist 6 with a plurality of openings formed on the surface of the foregoing silicon substrate 8, the silicon substrate 8 beneath the openings of the foregoing photoresist 6 is eliminated by exposing the foregoing silicon substrate to $Cl_2$ gas plasma, for example, and further the amorphous silicon dioxide 2 beneath the openings of the photoresist 6 is eliminated by means of reactive ion etching in a gas of $CHF_3$, for example, and then the photoresist 6 is eliminated. Next, in succession, the silicon substrate 8 is heated to 550° C. and a zinc oxide thin film 10 is formed to a thickness of about 1000 angstroms by sputtering a zinc oxide target in an atmosphere of 0.01 Torr oxygen gas. On the foregoing zinc oxide thin film 10 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method.

Accordingly, in the present exemplary embodiment, since the foregoing amorphous silicon oxide 2 and silicon substrate 8 are formed on the silicon substrate 7 in a shape having a plurality of openings an hen the zinc oxide thin film 10 is formed there on, making the total thickness of the foregoing silicon substrate 8-and -zinc oxide thin film 10 as extremely thin as about 3000 angstroms, the crystal strain energy per one lattice of silicon and zinc oxide is extensively larger than that of gallium nitride in the same way as in the twenty-fifth exemplary embodiment of the present invention when gallium nitride 4 and 5 is formed on the foregoing zinc oxide thin film 10. As a result, it has become possible to have crystal defects such as crystal dislocation and the like produced on the silicon substrate 8 and zinc oxide thin film 10, thereby improving the crystallization of the gallium nitride 4 and 5. Further, by having the zinc oxide thin film 10 and gallium nitride 4 an 5 formed on the steps created by the partially formed silicon substrate 8 and amorphous silicon dioxide 2, a stress caused by the difference in lattice constant between silicon and gallium nitride is relieved at the place where the foregoing steps are located, thereby enabling the improvement in crystallization of the gallium nitride thick film formed thereon. Because the foregoing zinc oxide thin film 10 is formed on the silicon substrate 8 or on the silicon substrate 7 underneath the openings of the foregoing silicon substrate 8 and carries without fail the lattice information of the underneath silicon, it becomes easy for single crystals to be formed when compared with the case, wherein the zinc oxide thin film 10 is partially formed on the surface of silicon dioxide thin film 2 as in the twenty-ninth exemplary embodiment of the present invention. As a result, it becomes possible for the crystallization of zinc oxide thin film 10 and gallium nitride 4 and 5 formed thereon to be improved when compared with the twenty-ninth exemplary embodiment of the present invention.

Since the lattice mismatch between zinc oxide and gallium nitride is as small as about 1.91%, it becomes possible to reduce the crystal defects in gallium nitride when compared with the case, wherein gallium nitride is formed on a silicon substrate directly, by having 4,he foregoing zinc oxide thin film 10 formed by insertion between the silicon substrate I and the gallium nitride thick film crystals 4 and 5. Further, after the amorphous gallium nitride 4 has been formed, by having the single crystal gallium nitride 5 formed at a higher temperature than the temperature at which the foregoing amorphous gallium nitride 4 was formed and having the gallium nitride 4 that is inferior to the gallium nitride 5 in crystallization formed so that the gallium nitride 4 may be placed by insertion underneath the gallium nitride 5, it becomes possible to mitigate the lattice mismatch between the underneath silicon substrate 1 and zinc oxide thin film 10 and the gallium nitride 4 and 5 and improve the crystallization of the gallium nitride 5.

Figure 32A:
FIGS. 32(a)–32(i) show a method for producing gallium nitride crystals in a thirty-second exemplary embodiment of the present invention.
Figure 32B:
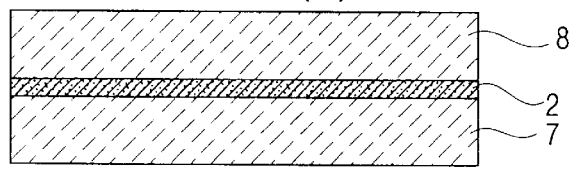
Figure 32C:
Figure 32D:
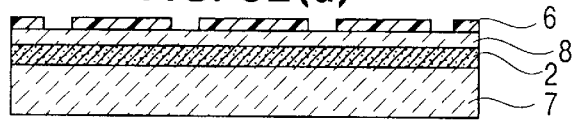
Figure 32E:
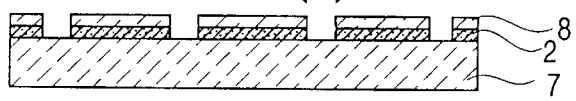
Figure 32F:
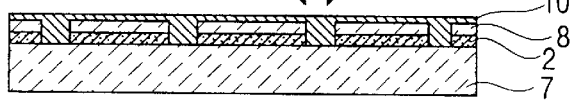
Figure 32G:
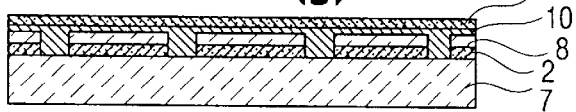
Figure 32H:
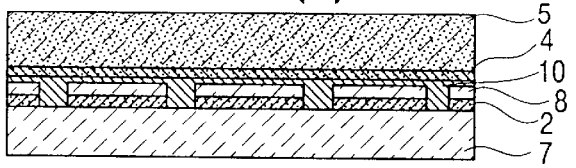
Figure 32I:
Figure 33A:
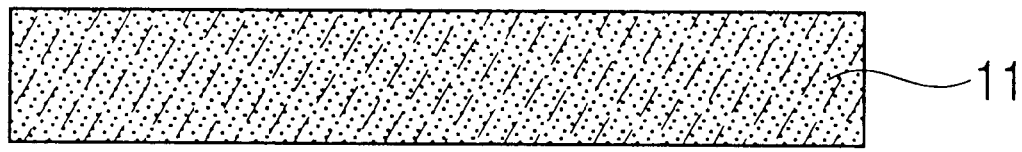
FIGS. 33(a) and 33(b) show a prior art method for producing gallium nitride crystals.
Figure 33B:
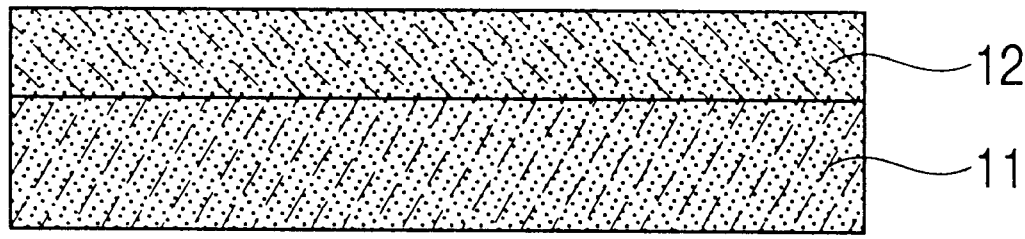

FIGS. 32(*a*)–32(*i*) show a method for producing gallium nitride crystals in a thirty-second exemplary embodiment of the present invention. In FIGS. 32(*a*)–32(*i*), the reference numeral 2 is amorphous silicon dioxide, the reference numeral 4 is amorphous gallium nitride formed by means of halide VPE method, the reference numeral 5 is single crystal gallium nitride formed by means of a halide VPE method, the reference numeral 6 is a photoresist, the reference numeral 7 is a silicon substrate, the reference numeral 8 is a silicon substrate and the reference numeral 10 is a zinc oxide thin film.

Amorphous silicon dioxide 2 is formed on a silicon substrate 7 to a thickness of about 4000 angstroms by heating the silicon substrate 7 to 1000° C. in an atmosphere of oxygen. The foregoing amorphous silicon dioxide 2 with a silicon substrate 8 brought into intimate contact therewith is heated to 1000° C., thereby combining the foregoing amorphous silicon dioxide 2 with the bottom surface of the silicon substrate 8. Then, the foregoing silicon substrate 8 is eliminated progressively starting from the surface thereof that is not in contact with the amorphous silicon dioxide 2 until the silicon substrate becomes a thin film of about 2000 angstroms thick. After having a photoresist 6 with a plurality of openings formed on the surface of the foregoing silicon substrate 8, the silicon substrate 8 beneath the openings of the foregoing photoresist 6 is eliminated by exposing the foregoing silicon substrate to $Cl_2$ gas plasma, for example, and further the amorphous silicon dioxide 2 beneath the openings of the foregoing Photoresist 6 is eliminated by means of reactive ion etching in a gas of $CHF_3$ for example, and then the photoresist 6 is eliminated. Next, in succession, the silicon substrate 8 is heated to 550° C. and a zinc oxide thin film 10 is formed to a thickness of about 1000 angstroms by sputtering a zinc oxide target in an atmosphere of 0.01 Torr oxygen gas. On the foregoing zinc oxide thin film 10 with the substrate temperature adjusted to 600° C., for example, amorphous gallium nitride 4 is formed to a thickness of about 500 angstroms by means of a halide VPE method whereby reaction is caused to occur between gallium chloride produced by supplying a hydrogen chloride gas via the surface of metal gallium and ammonia. Further, with the substrate temperature adjusted to 1000° C., single crystal gallium nitride 5 is formed on the foregoing amorphous gallium nitride 4 to a thickness of about 100 microns by means of the foregoing halide VPE method. Then, the gallium nitride crystals on the foregoing silicon substrate are immersed in nitrate fluoride ($HF:NH0_3=1:5$), for example, to eliminate the silicon substrate 7, amorphous silicon dioxide 2 and silicon substrate 8, and further immersed in aqua regia ($HCl:HNO_3=3:1$), for example, to eliminate the zinc oxide thin film 10.

Accordingly, in the present exemplary embodiment, after having finished with the steps of the thirty-first exemplary embodiment of the present invention, the foregoing silicon substrates 7 and 8, silicon dioxide 2 and zinc oxide thin film 10 are eliminated, thereby making it possible to improve the crystallization of the gallium nitride 4 and 5 in the same way as the thirty-first exemplary embodiment of the present invention. When a pn junction structure of gallium nitride base semiconductor laser and light emitting diode is formed on the gallium nitride 5, each respective electrode can be formed on both surfaces of the gallium nitride since the foregoing silicon substrates 7 and 8, silicon dioxide 2 and zinc oxide thin film 10 are eliminated, thereby enabling the simplification in production process of devices when compared with the case, wherein sapphire is used as the substrate, and further because of a reduction made possible in series resistance it becomes possible to reduce the operating voltage of semiconductor laser, for example. The thermal conductivity of gallium nitride is 1.3 W/cm K and larger than that of sapphire being 0.11 W/cm K and, when a gallium nitride base transistor structure is formed on the foregoing gallium nitride 5, heat dissipation is improved when compared with the case, wherein a prior art sapphire substrate was used, thereby making it possible to make higher power transistors operative.

As described in the above, the present invention discloses a method for producing gallium nitride crystals, whereby such crystal defects as crystal dislocation and the like caused at the time of heteroepitaxial growth are produced not in the side of gallium nitride but in the side of single crystal silicon thin film formed on amorphous silicon dioxide by having gallium nitride thick film crystals formed after having amorphous silicon dioxide formed on a silicon substrate and then a single crystal silicon thin film formed thereon with a resulting excellent effect to allow a substantial reduction in crystal defects of gallium nitride and the production of gallium nitride thick film crystals of excellent crystallization.

In addition, the present invention discloses a highly effective method for producing gallium nitride crystals whereby gallium nitride crystals provided with conductivity and excellent heat dissipation are formed by having the foregoing silicon substrate, silicon dioxide and silicon thin film eliminated after the foregoing gallium nitride thick film crystals have been formed.

The present invention discloses a highly effective method for Producing gallium nitride crystals whereby gallium nitride crystals with a small amount of crystal dislocation density are able to be formed by having gallium nitride formed after silicon carbide or zinc oxide showing a small amount of lattice mismatch has been formed.

What is claimed is:

1. A method for producing gallium nitride crystals, comprising the steps of forming an amorphous silicon dioxide thin film on a silicon substrate, forming a single crystal silicon thin film on said silicon dioxide thin film and then forming gallium nitride directly on said silicon thin film.

2. A method for producing gallium nitride crystals according to claim 1, further comprising the steps of eliminating said silicon substrate and said silicon dioxide and silicon thin films after the step of forming gallium nitride on said silicon thin film.

3. A method for producing gallium nitride crystals, comprising the steps of forming island-shaped amorphous silicon dioxide inside of a silicon substrate and forming gallium nitride on said silicon substrate.

4. A method for producing gallium nitride crystals according to claim 3, further comprising the steps of eliminating said silicon substrate and silicon dioxide after the step of forming gallium nitride.

5. A method for producing gallium nitride crystals according to claim 1, further comprising the step of eliminating said silicon thin film selectively in a shape provided with one or more of opening after the step of forming said silicon thin film.

6. A method for producing gallium nitride crystals according to claim 1, further comprising the steps of eliminating said silicon thin film and silicon dioxide thin film selectively in a shape provided with one or more of opening after the step of forming said silicon thin film.

7. A method for producing gallium nitride crystals, comprising the steps of:
  forming an amorphous silicon dioxide thin film on a silicon substrate;
  forming a single crystal silicon thin film on said silicon dioxide thin film;
  forming a silicon carbide thin film on said single crystal silicon thin film; and
  forming gallium nitride on said silicon carbide.

8. A method for producing gallium nitride crystals according to claim 7, further comprising the steps of eliminating said silicon substrate and silicon dioxide, after the step of forming gallium nitride.

9. A method for producing gallium nitride crystals according to claim 3, further comprising the step of forming a silicon carbide thin film after the step of forming island-shaped amorphous silicon dioxide.

10. A method for producing gallium nitride crystals according to claim 7, further comprising the step of eliminating said silicon thin film selectively in a shape provided with one or more of opening after the step of forming said silicon thin film.

11. A method for producing gallium nitride crystals according to claim 7, further comprising the steps of eliminating said silicon thin film and silicon dioxide thin film selectively in a shape provided with one or more of opening after the step of forming said silicon thin film.

12. A method for producing gallium nitride crystals according to claim 7, wherein said silicon thin film is eliminated selectively in a shape provided with one or more opening after the step of forming said silicon thin film and said silicon carbide thin film is formed by converting said silicon thin film to a silicon carbide thin film by heating said silicon thin film in an atmosphere of hydrocarbon.

13. A method for producing gallium nitride crystals according to claim 7 wherein said silicon thin film and amorphous silicon dioxide thin film are eliminated selectively in a shape provided with one or more opening after the step of forming said silicon thin film exposing said silicon substrate and said silicon carbide thin film is formed by converting at least the surface of said silicon thin film and said exposed silicon substrate to a silicon carbide thin film by heating said silicon thin film and said silicon substrate in an atmosphere of hydrocarbon.

14. A method for producing gallium nitride crystals according to claim 12 or 13, further comprising the steps of eliminating said silicon substrate and silicon dioxide, after the step of forming gallium nitride.

15. A method for producing gallium nitride crystals according to claim 3, further comprising the step of converting at least the surface of said silicon substrate to a silicon carbide thin film by heating said silicon substrate in an atmosphere of hydrocarbon after the step of forming said island-shaped amorphous silicon dioxide.

16. A method for producing gallium nitride crystals, comprising the steps of forming amorphous silicon dioxide inside of a silicon substrate with the surface thereof made always in contact with the interior of said silicon substrate and converting the surface of said silicon substrate to a silicon carbide thin film by heating said silicon substrate in an atmosphere of hydrocarbon and further forming gallium nitride on said silicon carbide thin film and then eliminating said silicon substrate and silicon dioxide.

17. A method for producing gallium nitride crystals, comprising the steps of forming an amorphous silicon dioxide thin film on a silicon substrate, forming a single crystal silicon thin film on said silicon dioxide thin film, forming a zinc oxide thin film on said single crystal silicon thin film and forming gallium nitride on said zinc oxide thin film.

18. A method for producing gallium nitride crystals, comprising the steps of forming island-shaped amorphous silicon dioxide inside of a silicon substrate, forming a zinc oxide thin film and forming gallium nitride on said zinc oxide thin film.

19. A method for producing gallium nitride crystals according to claim 17, further comprising the steps of then eliminating said silicon substrate and said silicon dioxide and zinc oxide thin films after forming said gallium nitride.

20. A method for producing gallium nitride crystals according to claim 17, further comprising the step of eliminating said silicon thin film selectively in a shape provided with one or more of opening after the step of forming said silicon thin film.

21. The method for producing gallium nitride crystals according to claims 1, 3, 7, 12, 17, 13, wherein the step of forming said amorphous silicon dioxide thin film is performed by providing a mask of one or more of opening on the surface of said silicon substrate, implanting said silicon substrate with oxygen ions of a dose exceeding $10^{17}$ cm$^{-2}$ inclusive eliminating said mask and then heating the silicon substrate to 1000° C. or higher.

22. The method for producing gallium nitride crystals, comprising the steps of forming an amorphous silicon dioxide thin film on a first silicon substrate, contacting said silicon dioxide thin film with a second silicon substrate intimately and heating to 600° C. or higher, eliminating said silicon substrate from the surface thereof that is not in contact with the silicon dioxide in such a way as said first and second silicon substrates are made into a silicon thin film, and then forming a gallium nitride on said silicon thin film.

23. The method for producing gallium nitride crystals as cited in any claim of claim 1, 3, 7, 12, 17, 22 or 13, wherein said silicon substrate is heated in an atmosphere of a gas containing gallium before forming gallium nitride.

24. The method for producing gallium nitride crystals as cited in any claim of claim 1, 3, 7, 12, 17, 22, or 13, wherein the step of forming said gallium nitride is performed by forming first amorphous gallium nitride, polycrystal gallium nitride or single crystal gallium nitride and then forming second single crystal gallium nitride at a higher temperature than the temperature at which said first gallium nitride is formed.

25. The method for producing gallium nitride crystals as cited in any claim of claim 1, 3, 7, 12, 17, 22 or 13, wherein a silicon substrate is heated in an atmosphere of a gas containing gallium before gallium nitride is formed and the step of forming said gallium nitride is performed by forming first amorphous gallium nitride, polycrystal gallium nitride or single crystal gallium nitride and then forming second single crystal gallium nitride at a higher temperature than the temperature at which said first gallium nitride is formed.

26. The method for producing gallium nitride crystals according to claim 1, 3, 7, 12, 17, 22, or 13, further comprising the step of heating the silicon substrate in an atmosphere of a gas containing gallium prepared by heating gallium trichloride at 78° C. or higher before the steps of forming said gallium nitride.

27. The method for producing gallium nitride crystals according to claim 1, 3, 7, 12, 17, 22, or 13, further comprising the step of heating the silicon substrate in an atmosphere of a gas containing gallium prepared from a hydrogen chloride and metal gallium heated to 500° C. or higher before the step of forming said gallium nitride.

28. The method for producing gallium nitride crystals according to claim 1, 3, 7, 12, 17, 22, or 13, further comprising the step of heating the silicon substrate in an atmosphere of a gas containing gallium supplied from an organic metal containing gallium before the step of forming said gallium nitride.

29. The method for producing gallium nitride crystals as cited in claim 1, 3, 7, 12, 17, 22, or 13, wherein the crystal growth plane of said silicon substrate possesses a surface ranging within 10° from the direction of (111) plane.

* * * * *